US011465506B2

(12) United States Patent
Thompson et al.

(10) Patent No.: US 11,465,506 B2
(45) Date of Patent: Oct. 11, 2022

(54) SYSTEMS AND METHODS FOR CONTROLLING A HIGH-OUTPUT DCAC INVERTER ON A VEHICLE

(71) Applicant: Ford Global Technologies, LLC, Dearborn, MI (US)

(72) Inventors: Scott Steadmon Thompson, Belleville, MI (US); John Eric Rollinger, Troy, MI (US); Adam J. Richards, Royal Oak, MI (US); Vincent Martinez, Dearborn, MI (US); Nicholas Herhusky, Dearborn, MI (US); Alex O'Connor Gibson, Ann Arbor, MI (US); David Lew, Canton, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 196 days.

(21) Appl. No.: 16/898,046

(22) Filed: Jun. 10, 2020

(65) Prior Publication Data

US 2021/0387528 A1    Dec. 16, 2021

(51) Int. Cl.
*B60L 1/00*        (2006.01)
*B60R 16/033*      (2006.01)
(Continued)

(52) U.S. Cl.
CPC .............. *B60L 1/006* (2013.01); *B60K 15/03* (2013.01); *B60R 16/033* (2013.01);
(Continued)

(58) Field of Classification Search
CPC ....... B60L 1/006; B60K 15/03; B60R 16/033; G01R 19/2513
See application file for complete search history.

(56) References Cited

U.S. PATENT DOCUMENTS 7,301,247 B2    11/2007   Kishibata et al.
7,397,141 B2 *   7/2008   Gouker .................. B60L 1/006
                                                    290/40 C
(Continued)

FOREIGN PATENT DOCUMENTS

CN    110857966 A  *  3/2020  ......... G01R 31/2812
CN    113103870 A  *  7/2021  ............ B60R 16/03
(Continued)

OTHER PUBLICATIONS

Herhusky, N. et al., "Method for Operating a Vehicle Having an Electrical Outlet," U.S. Appl. No. 16/562,287, filed Sep. 5, 2019, 40 pages.

*Primary Examiner* — Adam D Houston
(74) *Attorney, Agent, or Firm* — Vincent Mastrogiacomo; McCoy Russell LLP

(57) ABSTRACT

Methods and systems are provided for controlling a high power output direct current to alternating current converter for a vehicle. In one example, a method may include at a vehicle-on event, automatically operating the converter in a first power output mode, and transitioning to a different mode of operation in response to a transition request being received at a controller of the vehicle. In this way, the different mode of operation may be subject to confirmation via an operator of the vehicle, which may improve operational performance of the direct current to alternating current converter.

19 Claims, 23 Drawing Sheets

(51) Int. Cl.
  *G01R 19/25* (2006.01)
  *B60K 15/03* (2006.01)
(52) U.S. Cl.
  CPC .............. *G01R 19/2513* (2013.01); *B60K 2015/03217* (2013.01); *B60L 2210/44* (2013.01); *B60L 2240/526* (2013.01); *B60L 2250/12* (2013.01); *B60L 2250/16* (2013.01); *B60L 2260/44* (2013.01); *B60L 2260/54* (2013.01)

(56) References Cited

U.S. PATENT DOCUMENTS

| | | | | |
|---|---|---|---|---|
| 7,503,871 B2* | 3/2009 | Kozarekar | ............. | B60L 15/20 477/3 |
| 7,690,456 B2* | 4/2010 | Deng | ............. | B60L 50/61 180/65.265 |
| 7,960,857 B2 | 6/2011 | King | | |
| 8,823,503 B2* | 9/2014 | Hofmann | ............. | B60Q 1/00 340/438 |
| 9,350,189 B2* | 5/2016 | Kim | ............. | H02J 7/007 |
| 9,944,186 B1 | 4/2018 | Rehberger | ............. | B60L 1/02 |
| 10,109,176 B2* | 10/2018 | Wright | ............. | G08B 21/14 |
| 10,483,678 B2* | 11/2019 | Buttolo | ............. | H01R 13/447 |
| 10,745,013 B1 | 8/2020 | Herhusky | ............. | F02D 33/006 |
| 10,760,482 B1 | 9/2020 | Herhusky et al. | | |
| 10,773,704 B1* | 9/2020 | Rollinger | ............. | B60W 10/06 |
| 10,941,704 B2* | 3/2021 | Salter | ............. | F01P 3/20 |
| 11,001,162 B2* | 5/2021 | Yamada | ............. | H01M 10/48 |
| 11,043,801 B2* | 6/2021 | Revach | ............. | B60L 1/006 |
| 11,052,784 B2* | 7/2021 | Mensch | ............. | H02H 3/087 |
| 11,059,474 B2* | 7/2021 | Revach | ............. | H01R 25/006 |
| 11,108,225 B2* | 8/2021 | Fisher | ............. | H02M 7/003 |
| 11,110,800 B2* | 9/2021 | Salter | ............. | B60L 1/006 |
| 11,142,072 B2* | 10/2021 | Bhat | ............. | H01R 13/74 |
| 11,161,421 B2* | 11/2021 | Wang | ............. | B60L 53/12 |
| 2005/0109550 A1* | 5/2005 | Buglione | ............. | B60K 6/48 180/65.25 |
| 2008/0201064 A1* | 8/2008 | DiGonis | ............. | B60W 20/15 477/203 |
| 2010/0133025 A1* | 6/2010 | Flett | ............. | B60L 58/20 180/65.21 |
| 2011/0084648 A1* | 4/2011 | Cao | ............. | B60L 53/14 320/167 |
| 2014/0265595 A1* | 9/2014 | Cheng | ............. | H02J 7/34 307/66 |
| 2015/0045976 A1* | 2/2015 | Li | ............. | H02J 13/0017 700/295 |
| 2015/0085543 A1* | 3/2015 | Klesyk | ............. | H02M 7/48 363/97 |
| 2015/0159613 A1* | 6/2015 | Jensen | ............. | F02N 9/04 701/68 |
| 2015/0251539 A1* | 9/2015 | Sura | ............. | H01L 31/048 290/1 R |
| 2018/0022301 A1* | 1/2018 | Li | ............. | H02J 7/0047 307/9.1 |
| 2018/0265088 A1* | 9/2018 | Cikalo | ............. | B60W 30/18054 |
| 2019/0047433 A1* | 2/2019 | Rozman | ............. | B60L 58/12 |
| 2019/0210545 A1* | 7/2019 | Sangameswaran | ... | B60R 16/033 |
| 2020/0086743 A1* | 3/2020 | Jala | ............. | B60L 50/60 |
| 2020/0108819 A1* | 4/2020 | Revach | ............. | B60W 20/13 |
| 2020/0112163 A1* | 4/2020 | Revach | ............. | H01H 71/70 |
| 2020/0274375 A1* | 8/2020 | Griffiths | ............. | H02J 7/0029 |
| 2020/0393859 A1 | 12/2020 | Thompson et al. | | |
| 2020/0400084 A1 | 12/2020 | Thompson et al. | | |
| 2021/0005029 A1 | 1/2021 | Thompson | | |
| 2021/0104851 A1* | 4/2021 | Bhat | ............. | B60L 55/00 |
| 2021/0316617 A1* | 10/2021 | Pugh | ............. | B62D 21/02 |
| 2021/0354641 A1* | 11/2021 | James | ............. | B60R 25/34 |
| 2021/0362604 A1* | 11/2021 | Salter | ............. | B60K 6/26 |
| 2021/0387528 A1* | 12/2021 | Thompson | ............. | B60K 15/03 |

FOREIGN PATENT DOCUMENTS

| | | | | |
|---|---|---|---|---|
| CN | 113783499 A | * | 12/2021 | ............. B60K 15/03 |
| DE | D E-102020126314 A1 | * | 4/2021 | ............. B60L 1/006 |
| GB | 2499446 A | * | 8/2013 | ............. B60L 1/006 |
| KR | 20210131148 A | * | 11/2021 | |
| WO | WO-2020193466 A1 | * | 10/2020 | ............. B60L 1/006 |

* cited by examiner

SYSTEMS AND METHODS FOR CONTROLLING A HIGH-OUTPUT DCAC INVERTER ON A VEHICLE

FIELD

The present description relates generally to methods and systems for controlling a high-output DCAC inverter included as part of a vehicle propulsion system.

BACKGROUND/SUMMARY

Passenger vehicles, light trucks, and heavy duty trucks may in some examples include an ability to support 110V-120V alternating current (AC) and 220V-240V AC electrical loads. As an example, such vehicles may support electrical loads (power take-off device) up to around 450 Watts, and in the future may support electrical loads from 2 KW-8 KW and potentially higher (e.g. 16 KW and greater). Systems for such vehicles may include designs for directly supporting such appliances either while the vehicle is stationary, for example for use at a job site or for supplying electricity to home electrical loads, or while the vehicle is moving, for example to power a refrigeration unit. Such systems may comprise direct current (DC) to AC systems, for example DCAC inverters and may be referred to as a power to the box (Pttb) system. Such Pttb systems may be driven either by an alternator, a belt-integrated starter generator (BISG) driven by the engine or by a high voltage battery (e.g. 300V-350V) which is in turn charged by a crank ISG (CISG).

Lower output DCAC inverters (e.g., 450 watts or less) may include minimal associated control strategy, as power provided by such lower output DCAC inverters may be insignificant to engine operation. For example, lower output DCAC inverters may be configured to turn on anytime the vehicle in which they are included is running. In such cases, there may not be an opportunity for a vehicle operator to turn off the power supply, or interact with the power supply other than simply utilizing the electricity provided therefrom. For such lower output power supplies, in the event of an indication of degraded power supply, the power supply may simply be shut down and commanded to restart at the next opportunity (e.g., subsequent vehicle start request).

In contrast, high-output DCAC converters (e.g., DCAC inverters) may require a more complex control strategy. For example, such a high-output device may not be able to always provide maximum output due to the amount of energy it consumes from the powertrain. Furthermore, vehicle operators may have an increased expectations for how such high-output devices handle issues such as degraded power supply, and may desire an ability to substantially interact with the system.

The inventors herein have recognized the above-mentioned issues, and have herein developed systems and methods to at least partially address them. In one example, a method comprises, at a vehicle-on event, automatically operating a DCAC converter system in a low power output mode, and transitioning to a different mode of operation responsive to a transition request being received at a controller of the vehicle. In this way, transitioning to the different mode may not be automatic, which may improve customer satisfaction and may improve operational performance of the DCAC converter system.

In one example, the transition request may be initiated via an operator of the vehicle, without first being prompted by the controller of the vehicle.

As another example operating the direct current to alternating current power conversion system in the low power output mode may include powering a first set of power receptacles in the low mode, the first set of power receptacles included in a passenger compartment of the vehicle, and not powering a second set of power receptacles, the second set of power receptacles included in a bed of the vehicle.

As another example, transitioning to the different mode of operation may include transitioning to a high power output mode, or to an off mode. The low power output mode may include a low power output mode threshold that is lower than a full capability of the DCAC power conversion system, whereas the full capability of the DCAC power conversion system may be available to external power consumers in the high power output mode.

In another example, the transition request may be initiated via the controller of the vehicle, and the transition request may be communicated to the operator of the vehicle. In such an example, the different mode of operation may be transitioned to in response to the operator confirming the transition request, by submitting the confirmation to the controller of the vehicle. In some examples the transition request may be initiated via the controller responsive to an indication that an auxiliary load powered via the DCAC power conversion system includes a power demand that cannot be met via the low power output mode. In another example, the transition request may be initiated via the controller responsive to an indication of a degraded power output condition associated with the direct current to alternating current power conversion system. In such a case where the transition request is initiated responsive to the indication of the degraded power output condition, the method may further comprise providing instructions to the operator to resolve the issue, under conditions where the degraded power output condition includes a recoverable degraded power output condition.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 6:
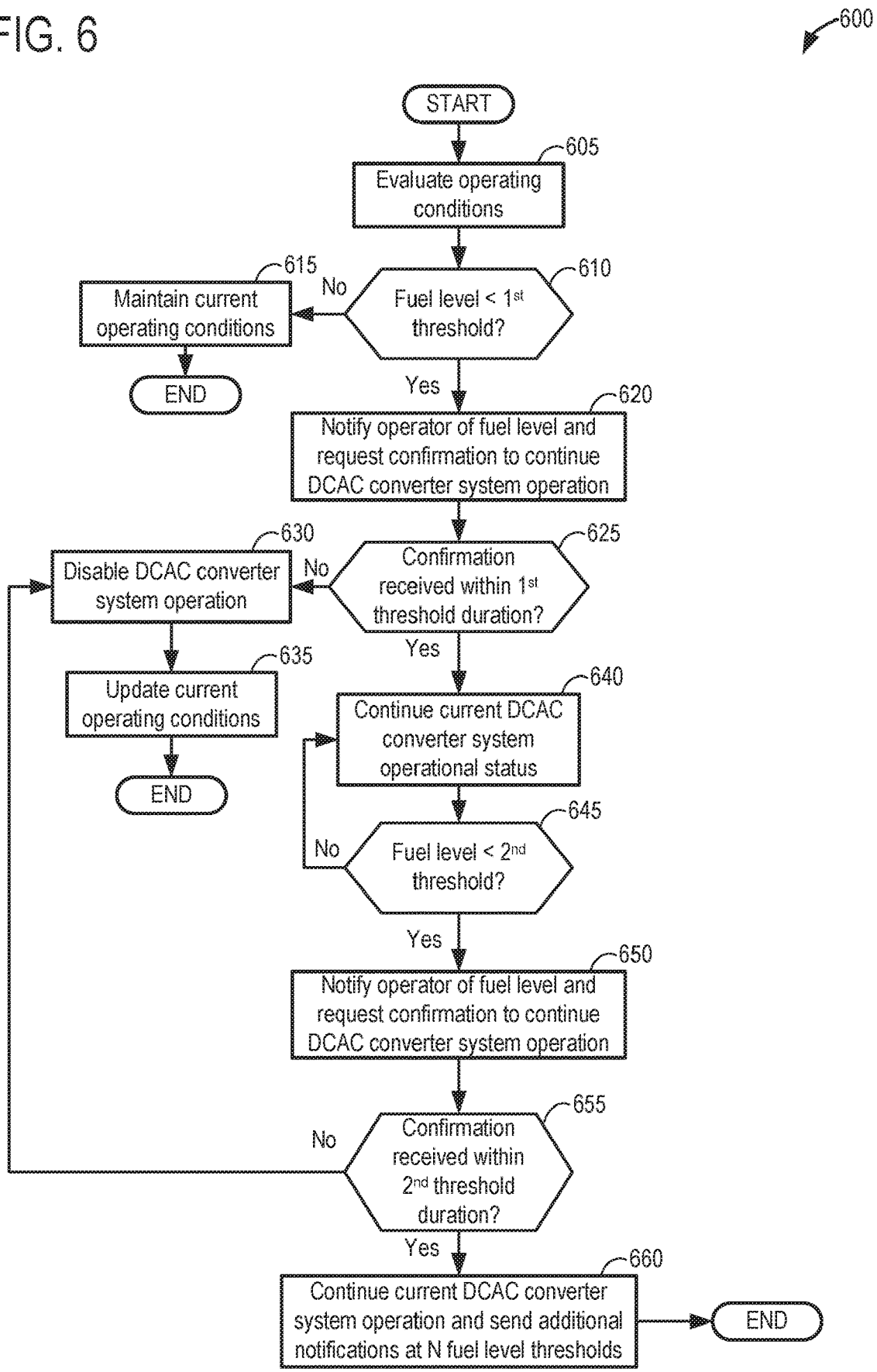
FIG. 6 shows a flow chart illustrating an example method that can be implemented to alert a vehicle operator of fuel level in a fuel tank, so that the customer may adjust operation of a DCAC converter system as desired.
Figure 7A:
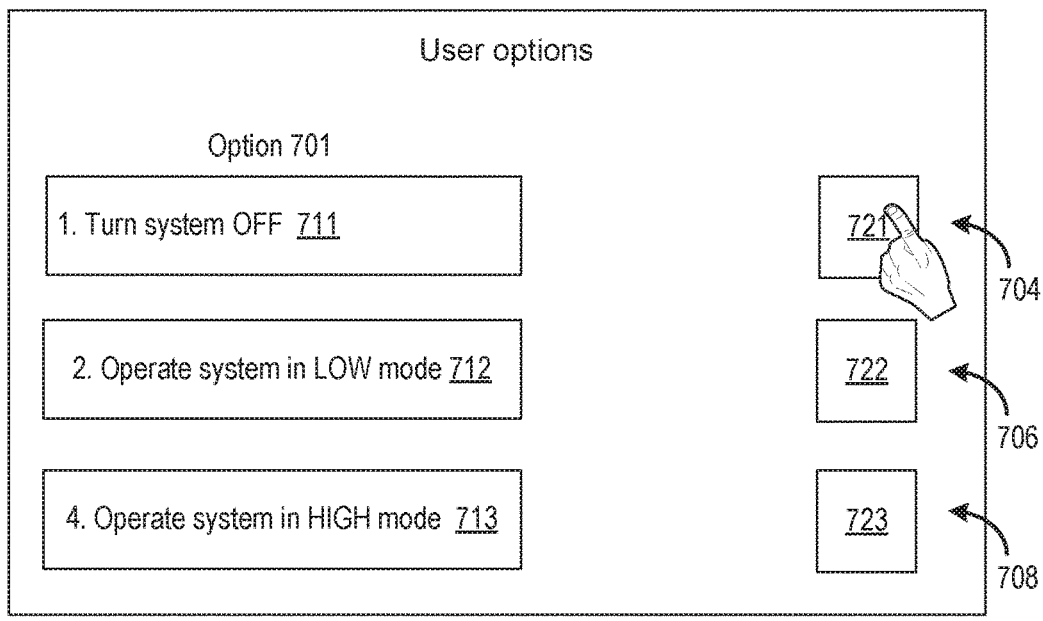
FIG. 7A shows an example human machine interface (HMI) for transitioning between different DCAC converter system modes of operation.
Figure 7B:
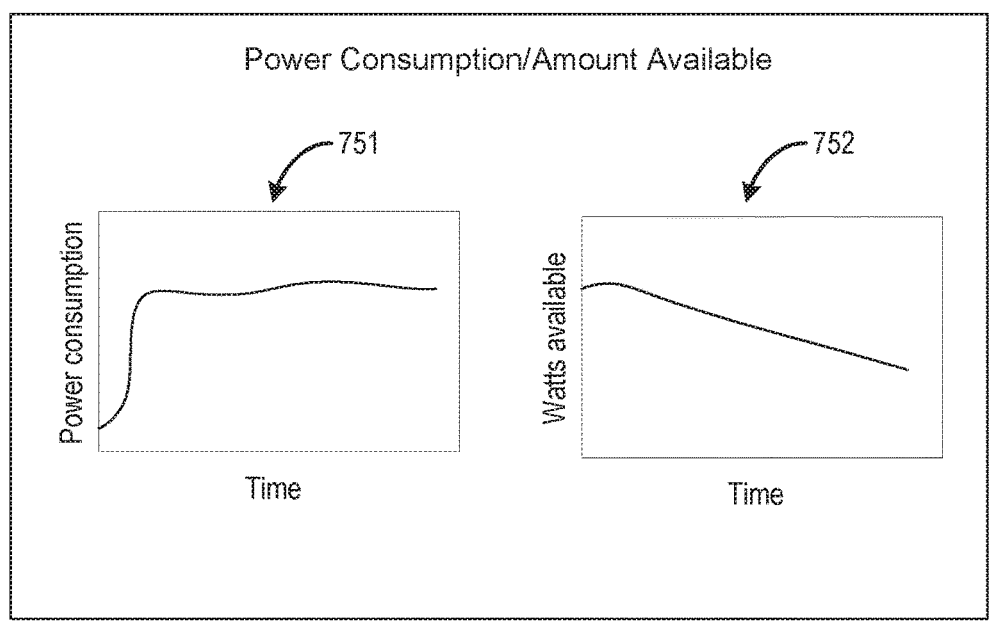
FIG. 7B shows an example HMI illustrating power consumption and power amount available, for a DCAC converter system of the present disclosure.

The following description relates to systems and methods for controlling a high-output DCAC converter on a vehicle. Accordingly, FIGS. 1-4C depict vehicle systems relevant to the present disclosure. There may be different modes of operation for the DCAC converter, controllable at least in part via the methodology of FIG. 5. For example, a low power output mode may limit power output to a calibrated threshold value. Alternatively, a high power output mode may enable a full capability of the DCAC converter system for powering auxiliary loads. When operating the DCAC converter, a vehicle operator may be alerted to low fuel conditions so the operator may make an informed decision as to whether to continue use of the DCAC converter, according to the method of FIG. 6. The vehicle operator may transition modes via interaction with a HMI, as illustrated at FIG. 7A. Furthermore, the operator may be able to view power consumption and power output available, as a function of time, via an HMI, as illustrated at FIG. 7B.

Figure 8:
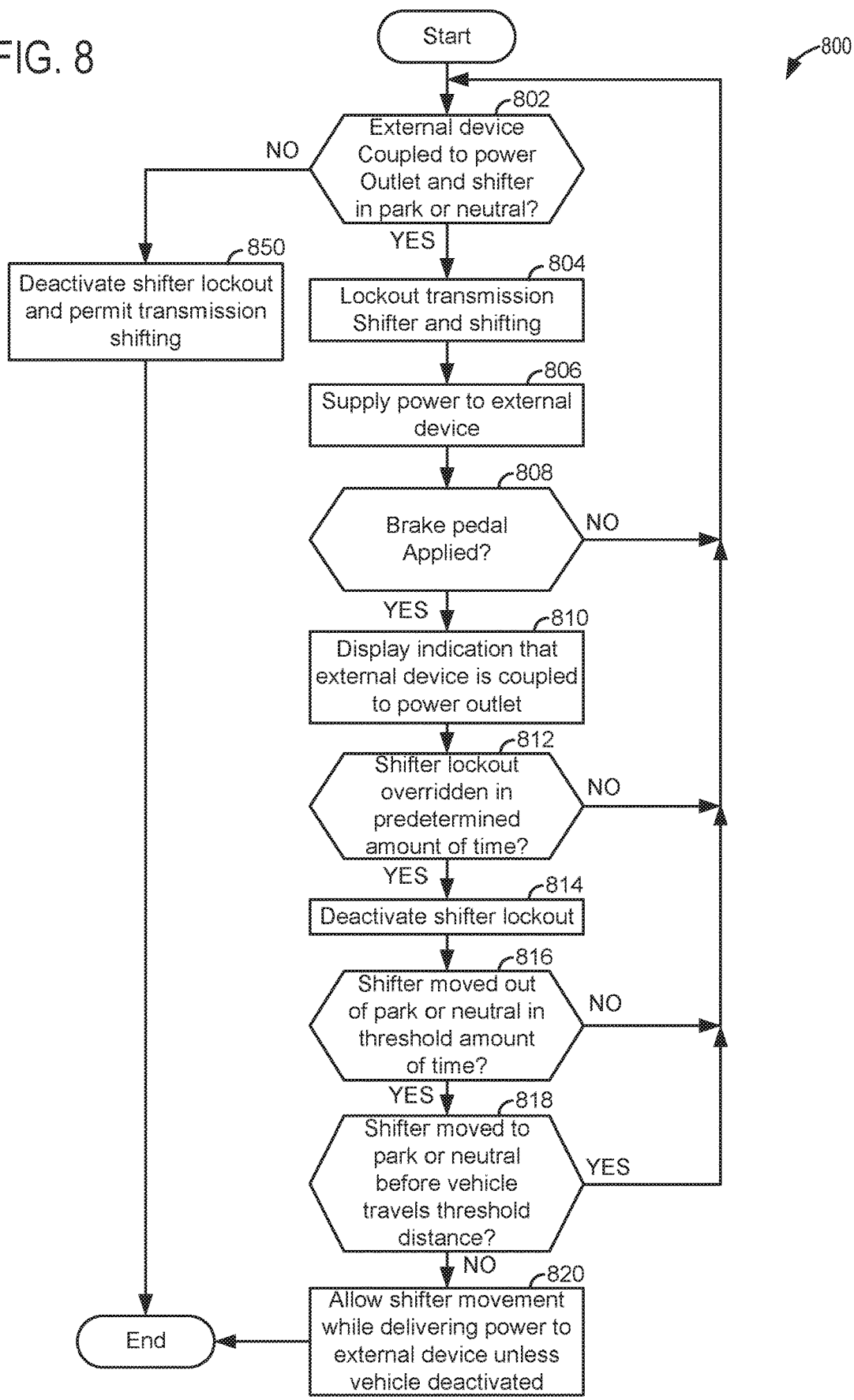
FIG. 8 shows an example method for operating a vehicle.
Figure 9:
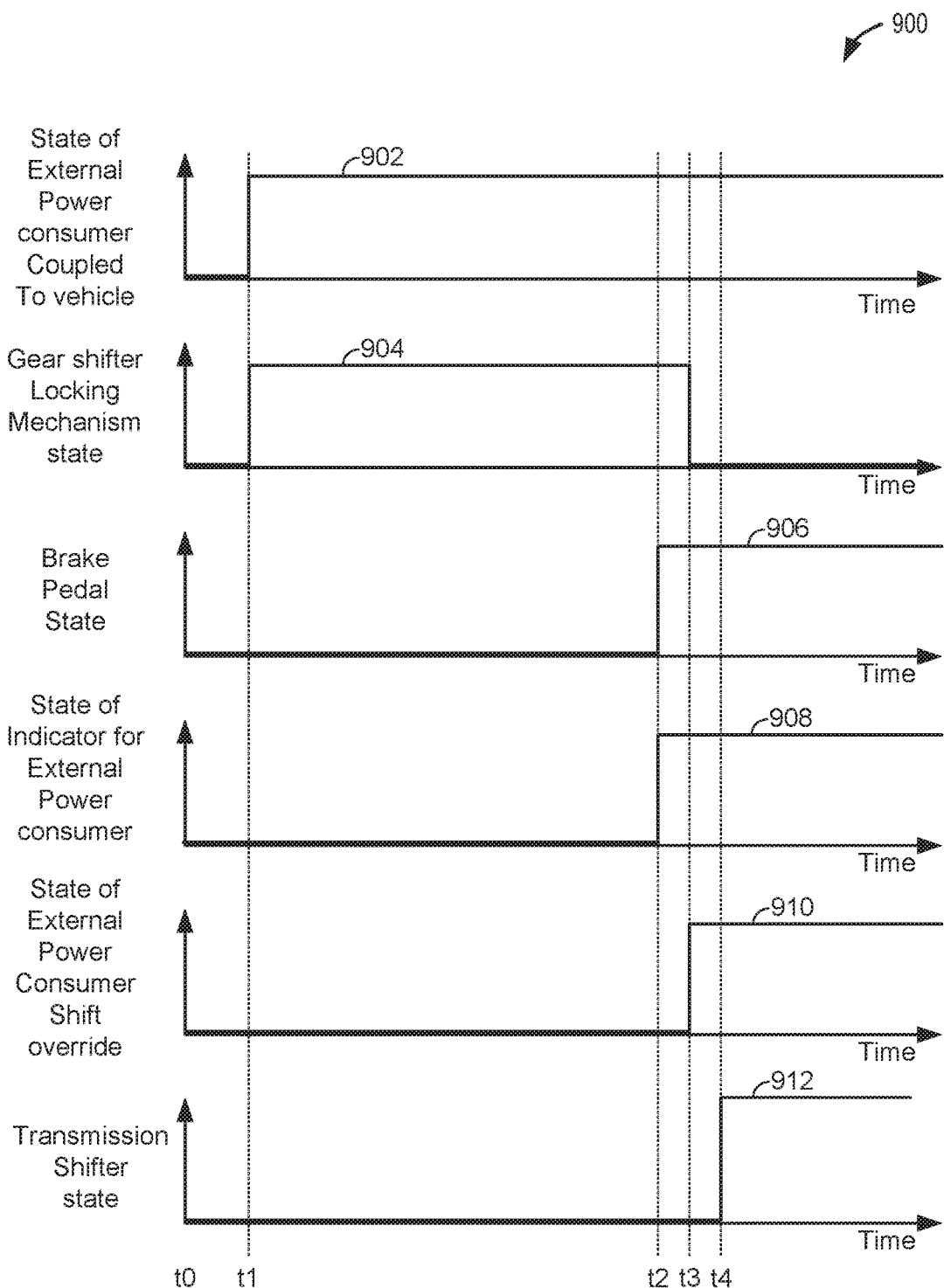
FIG. 9 shows plots of an example vehicle operating sequence according to the method of FIG. 8.

In a case where the DCAC converter is being used to power auxiliary loads, it may be desirable to prevent shifting of a transmission unless the prevention is overridden by an operator of the vehicle, according to the method of FIG. 8. A prophetic example timeline for conducting the methodology of FIG. 8, is depicted at FIG. 9.

Figure 10:
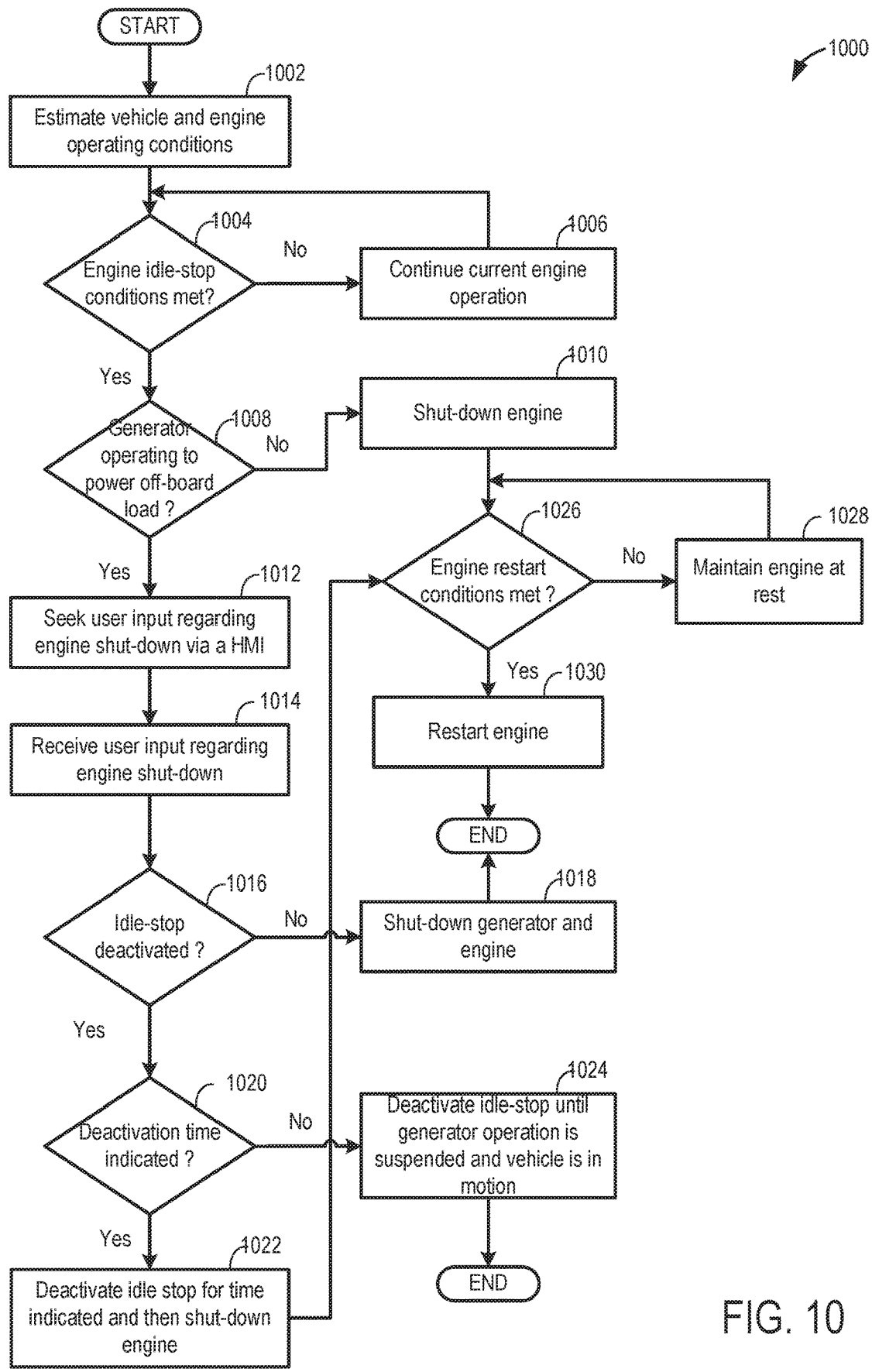
FIG. 10 shows a flow chart illustrating an example method that can be implemented to schedule engine idle-stop during operation of a generator.
Figure 11:
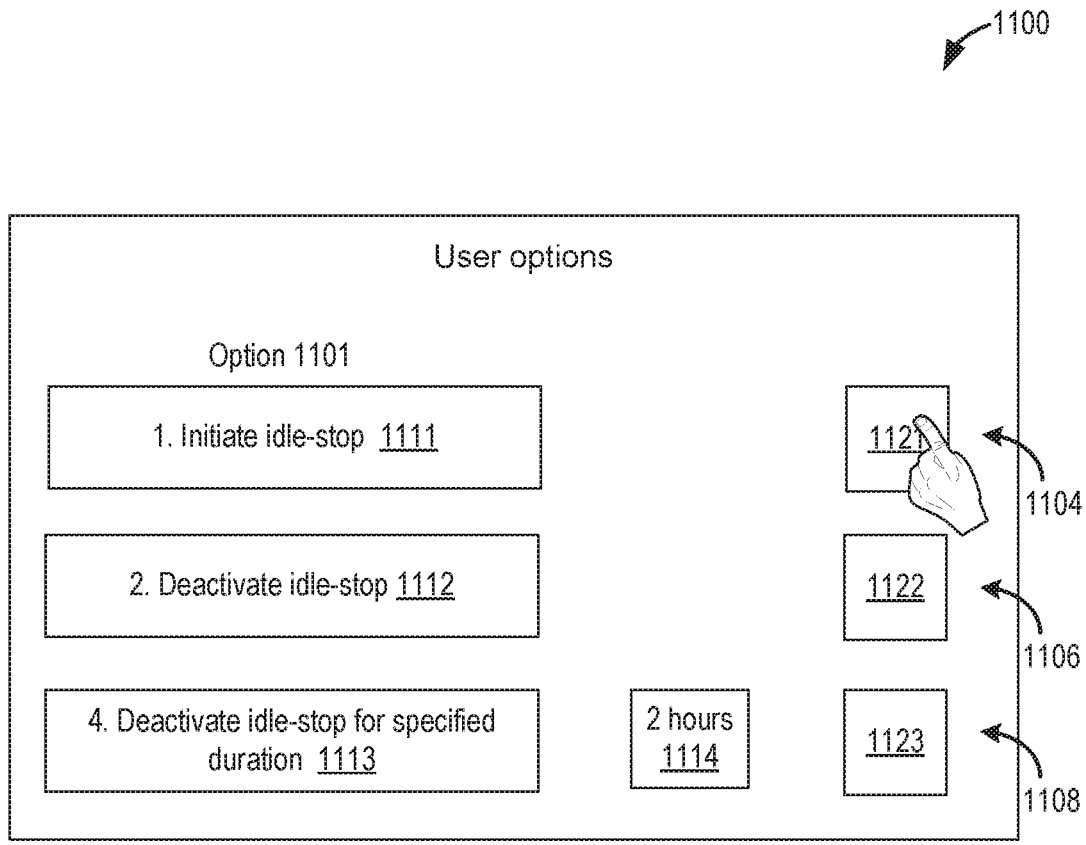
FIG. 11 shows an example HMI for selection of idle-stop override by an operator.
Figure 12:
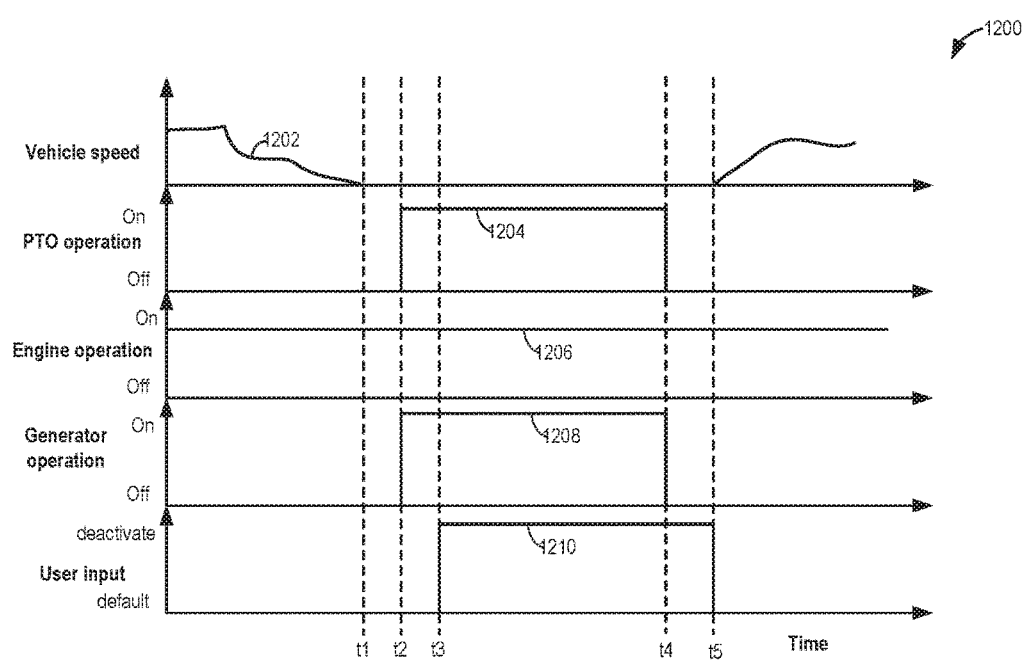
FIG. 12 shows an example operation of an engine and a generator based on user input.

In another example where the DCAC converter is being used to power auxiliary loads, it may be desirable to control idle-stop events based at least in part on operator input, according to the methodology of FIG. 10, particularly when operating in the high power output mode. FIG. 11 depicts how such an operator may use an HMI to submit instructions to a vehicle controller, regarding the idle-stop events. A prophetic example timeline for conducting the methodology of FIG. 10 is depicted at FIG. 12.

Figure 13:
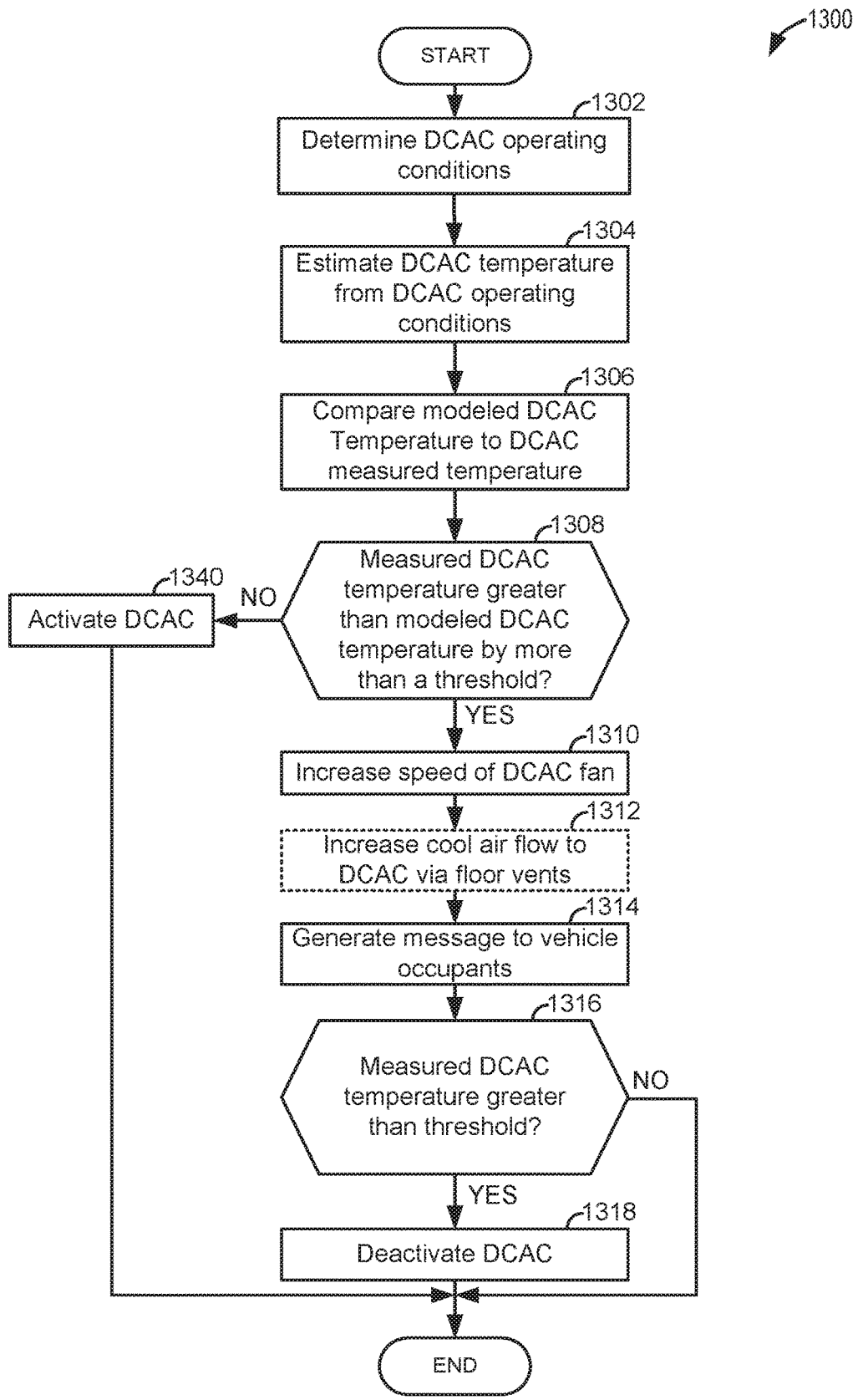
FIG. 13 shows an example method for operating a DCAC converter and vehicle systems that may be related to the DCAC converter.
Figure 14:
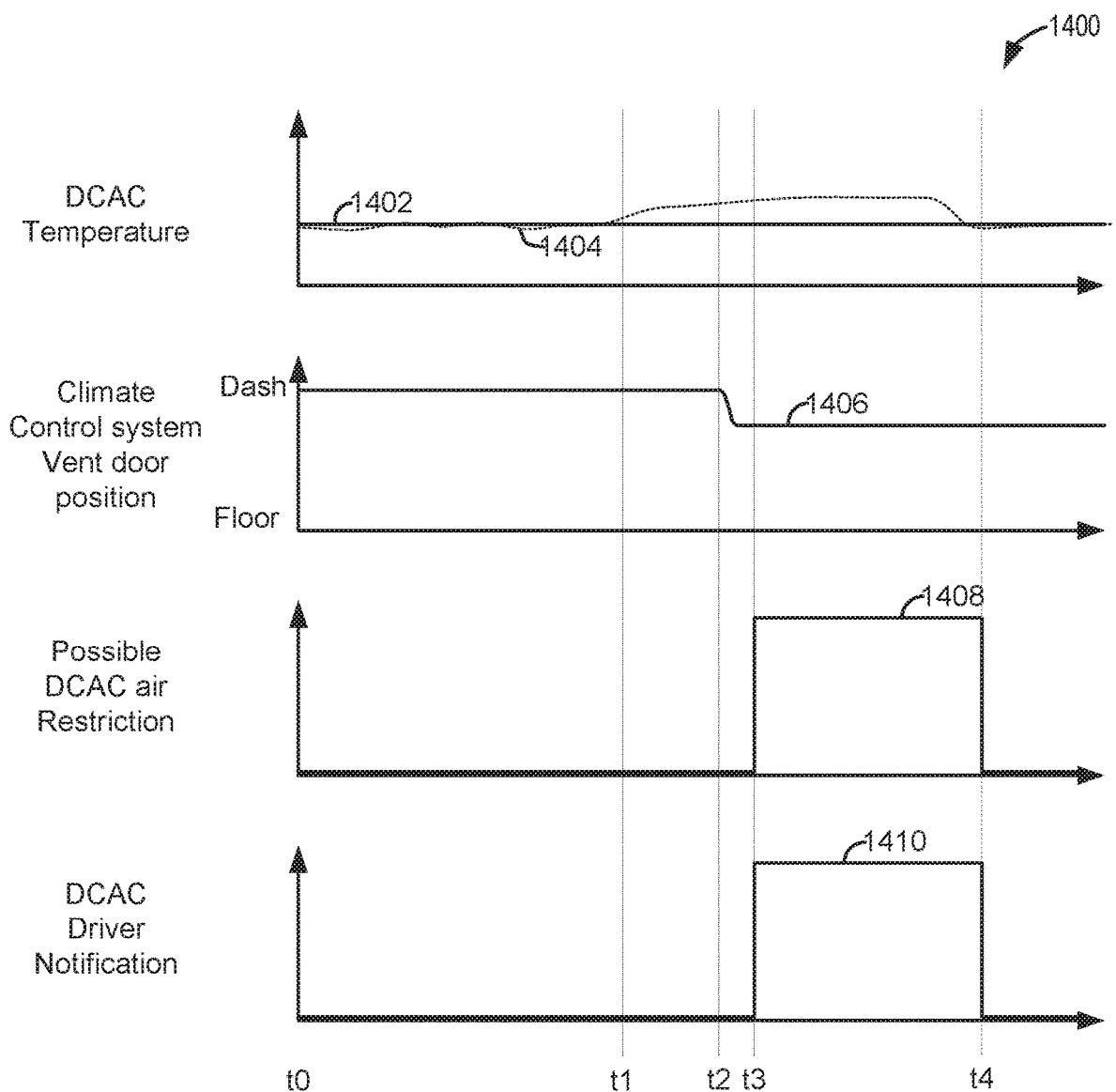
FIG. 14 shows an example DCAC converter operating sequence according to the method of FIG. 5.

The DCAC converters of the present disclosure may be positioned at locations in the vehicle where it may be possible to obstruct air flow to the DCAC converters, which may in turn result in overheating conditions. Accordingly, a method to detect and mitigate such conditions is depicted at FIG. 13. A prophetic example timeline for conducting the methodology of FIG. 13 is depicted at FIG. 14.

Figure 15:
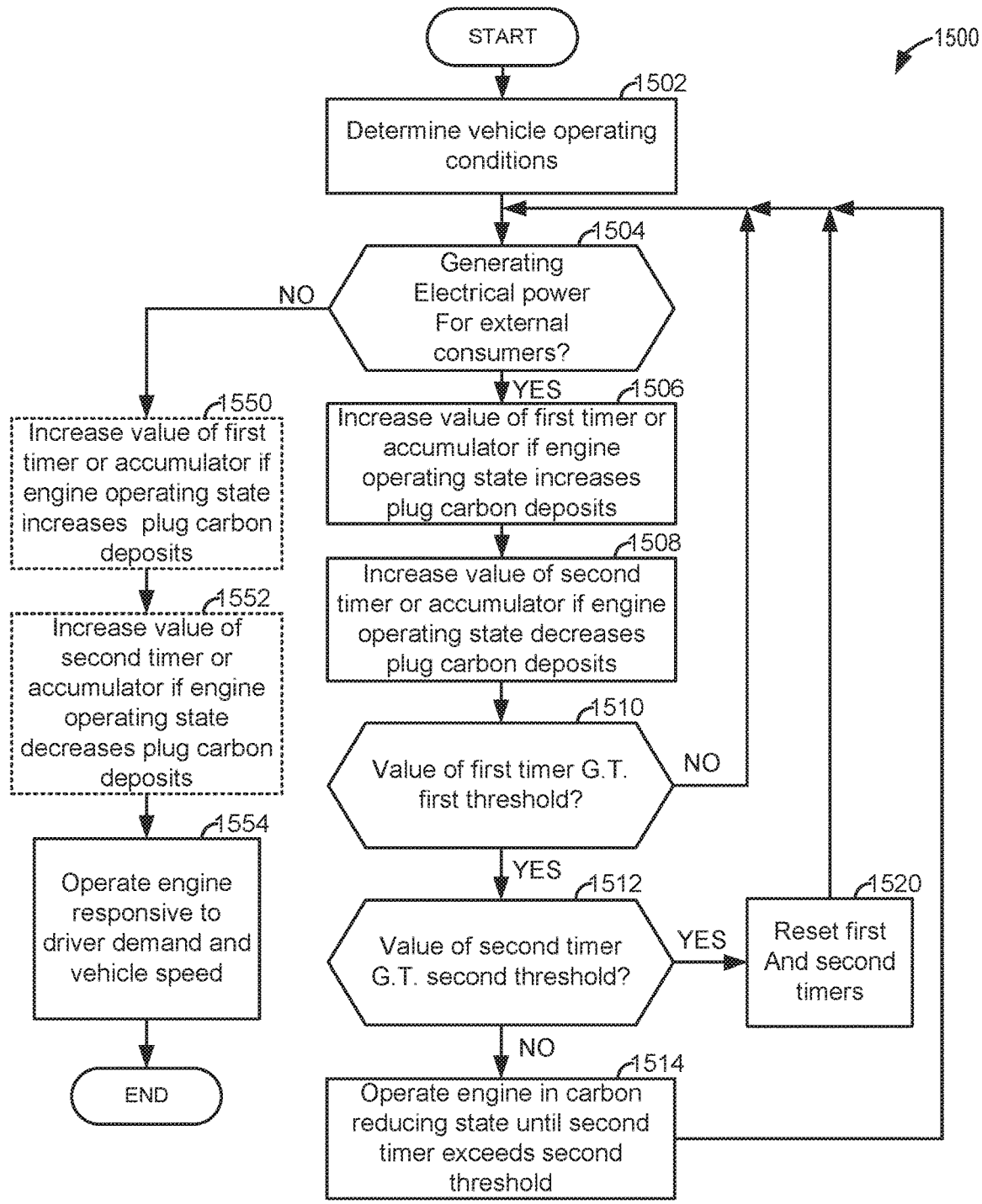
FIG. 15 shows an example method for operating an engine that supplies electrical power to external electrical power consumers.
Figure 16:
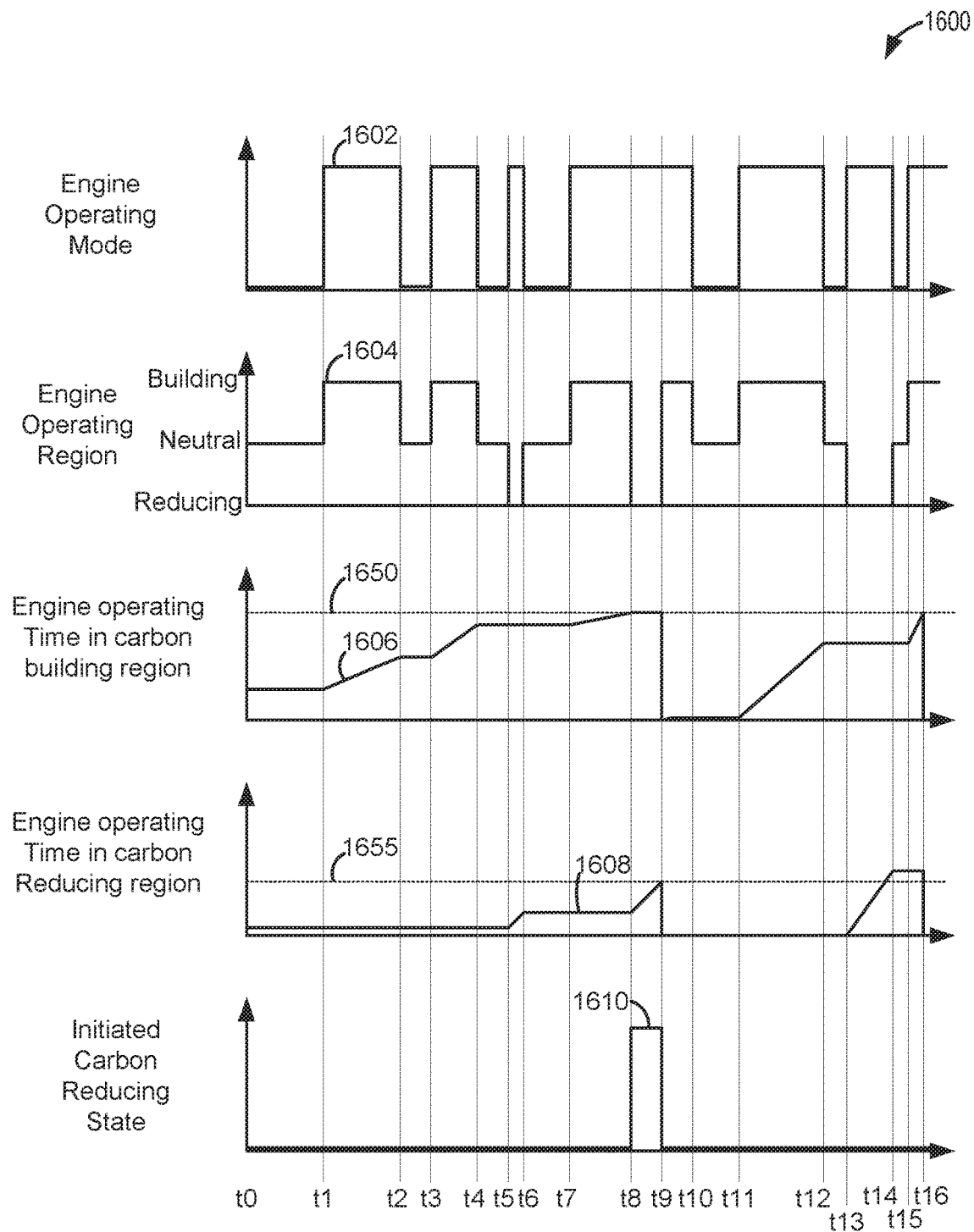
FIG. 16 shows an example engine operating sequence according to the method of FIG. 15.
Figure 17:
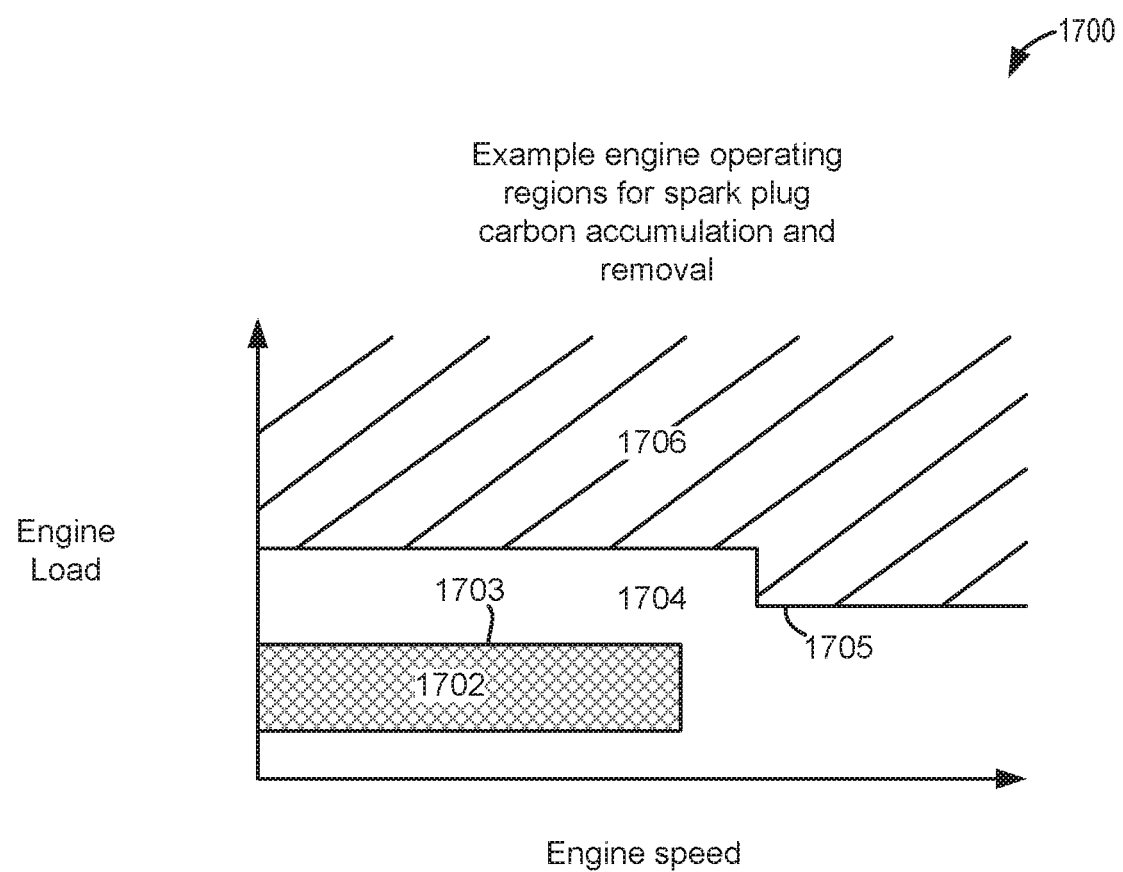
FIG. 17 shows an engine map with example carbon building, carbon removing, and carbon neutral regions.

As discussed above, the DCAC converter systems of the present disclosure may be operated in low power output modes and high power output modes. When operating in the high power output mode, it may be desirable operate the engine in a manner to reduce opportunity for carbon deposit buildup on engine spark plugs, according to the methodology of FIG. 15. FIG. 16 depicts a prophetic example timeline for conducting the methodology of FIG. 15, and FIG. 17 depicts example engine operating regions for spark plug carbon accumulation and removal.

Figures 18A, 18B:
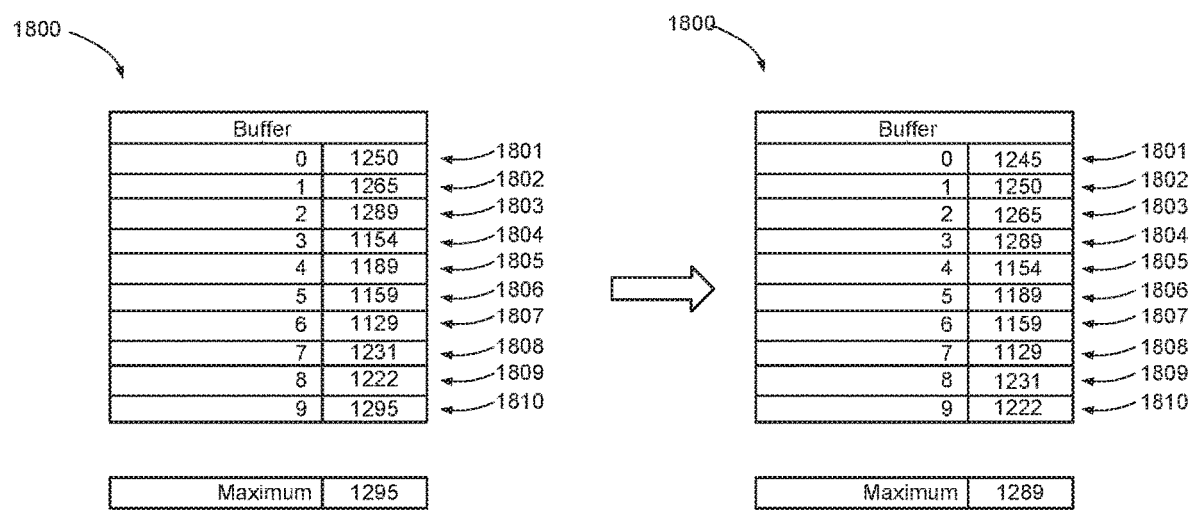
FIGS. 18A-18B show an example memory buffer that holds a plurality of instantaneous engine speed requests.
Figure 19:
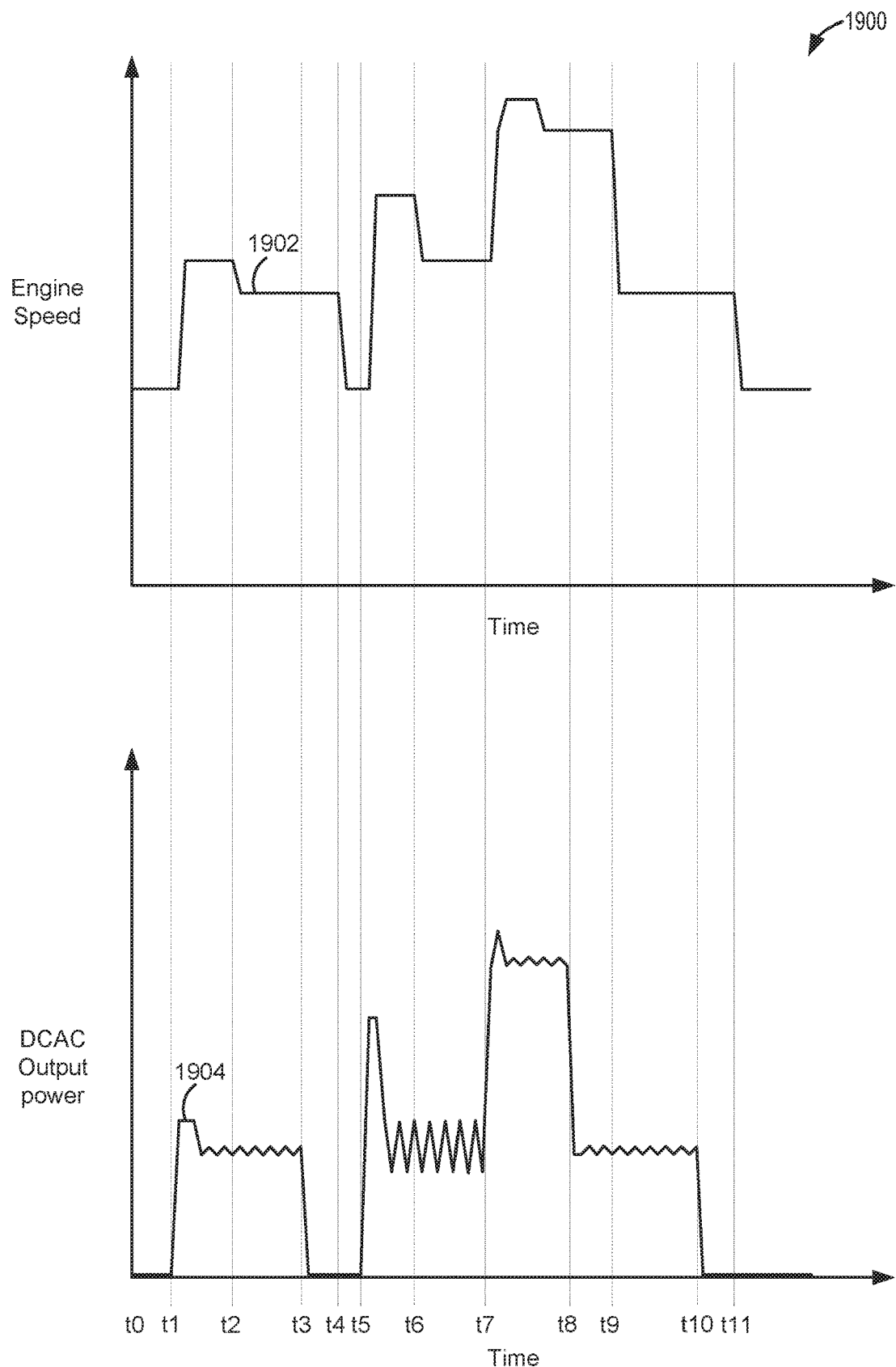
FIG. 19 shows plots of an example engine and alternator operating sequence.
Figure 20:
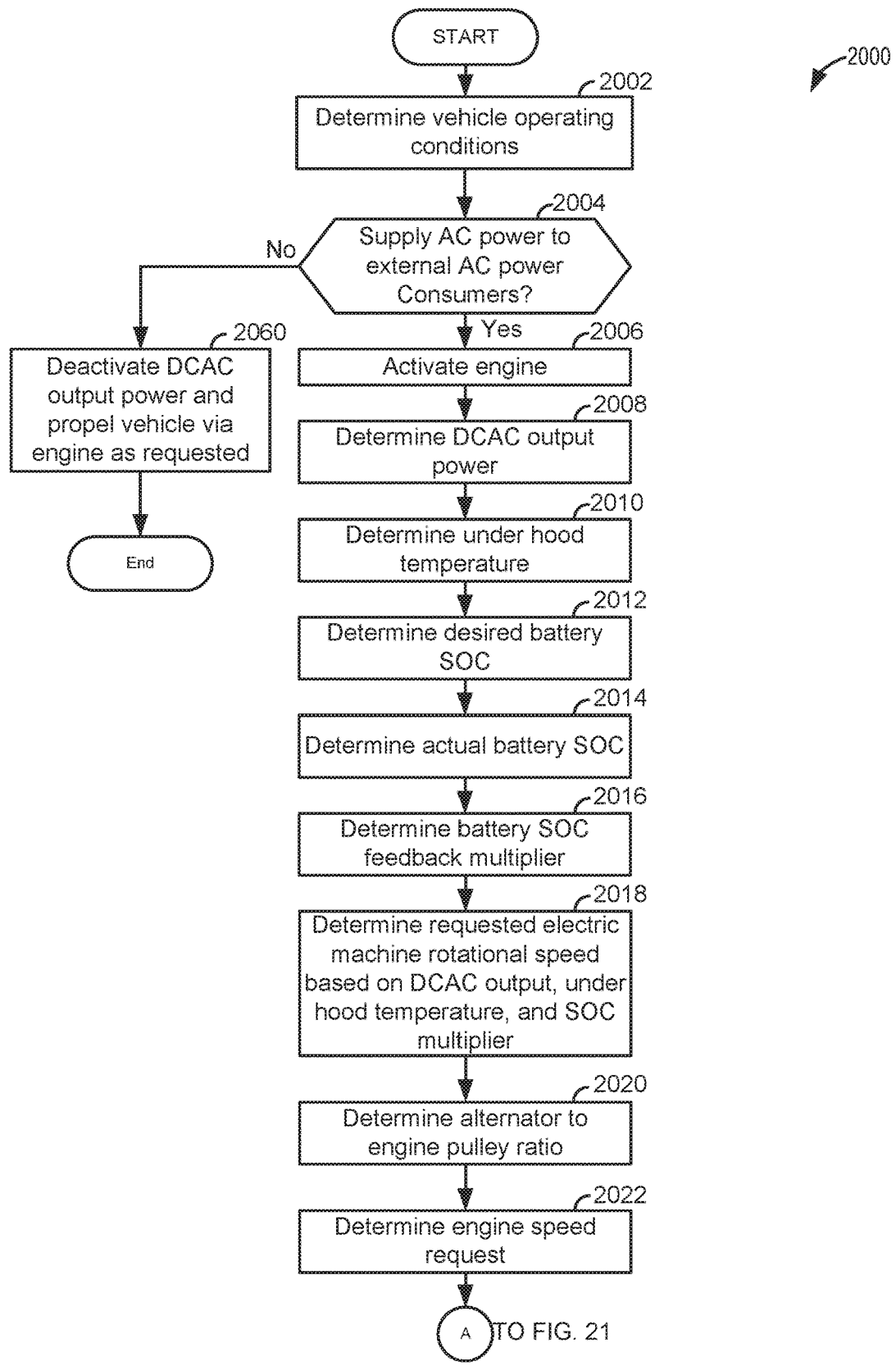
FIGS. 20-21 show an example method for operating an engine and an electric machine to supply a requested amount of electrical power from a direct current to alternating current converter to alternating current electrical power consumers.
Figure 21:
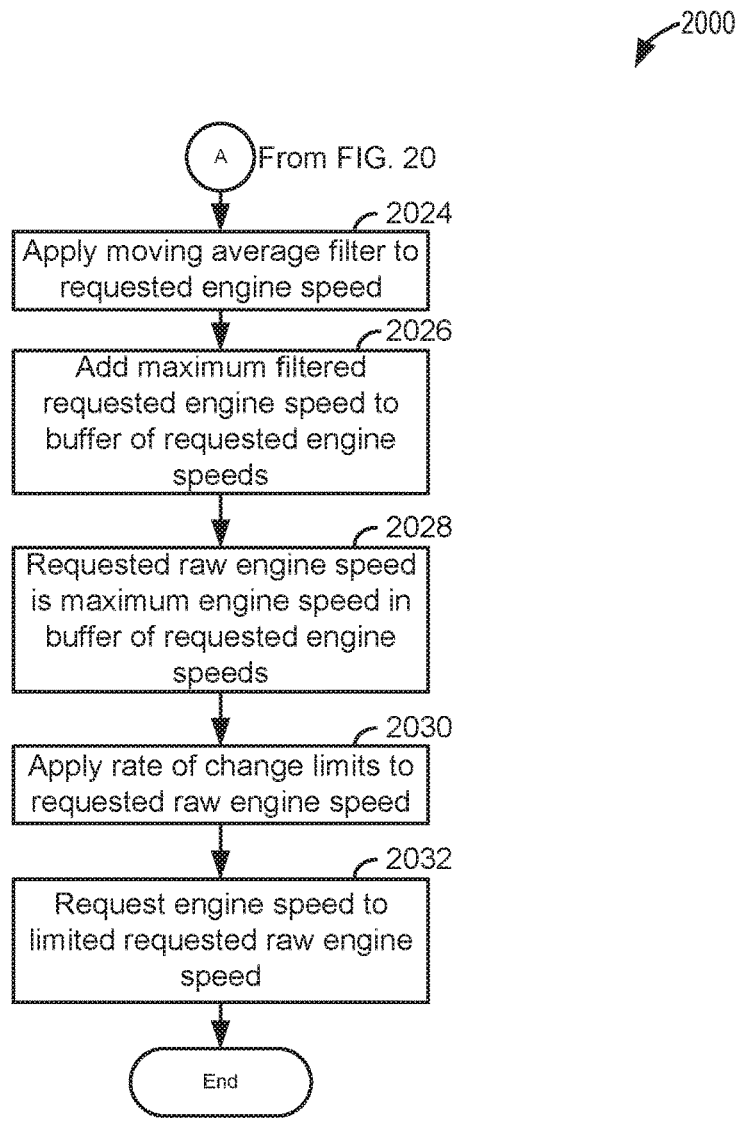

The method of FIGS. 20-21 may be used to reduce a possibility of frequent engine speed changes while the engine supplies power to a DCAC converter via an alternator or other electric machine. FIGS. 18A-18B depict example memory buffers that hold a plurality of instantaneous engine speed requests, for use with the method of FIGS. 20-21. A prophetic example timeline for conducting the methodology of FIGS. 20-21 is depicted at FIG. 19. Finally, in some examples relevant to the present disclosure, outlets powered via the DCAC converter system(s) of the present disclosure may be in various locations of the vehicle, and may be separated based on mode of operation via one or more isolation relay(s), as discussed with regard to FIG. 22.

Figure 1:
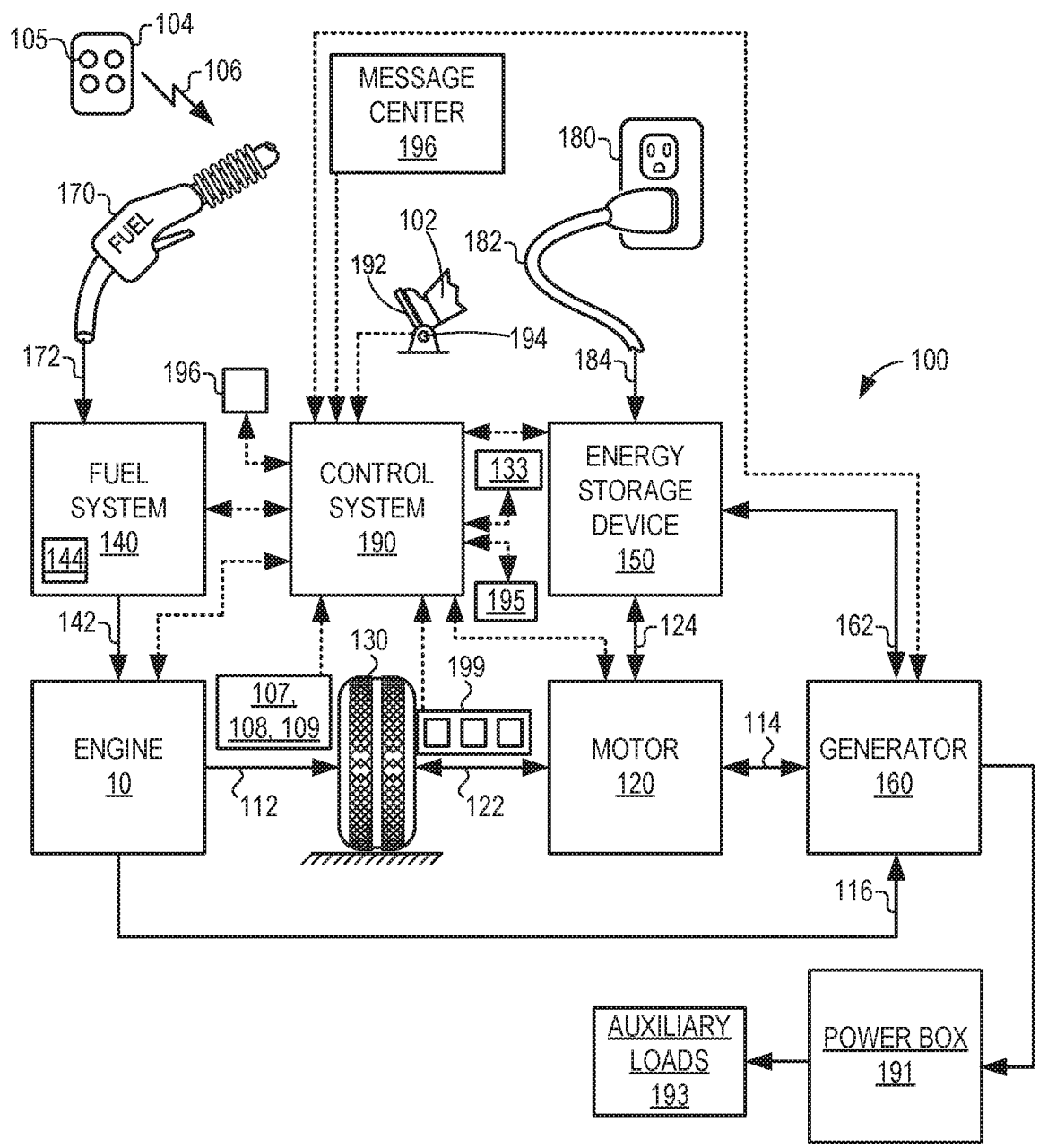
FIG. 1 schematically shows an example vehicle propulsion system.

FIG. 1 illustrates an example vehicle propulsion system 100. Vehicle propulsion system 100 includes a fuel burning engine 10 and a motor 120. As a non-limiting example, engine 10 comprises an internal combustion engine and motor 120 comprises an electric motor. Motor 120 may be configured to utilize or consume a different energy source than engine 10. For example, engine 10 may consume a liquid fuel (e.g., gasoline) to produce an engine output while motor 120 may consume electrical energy to produce a motor output. As such, a vehicle with propulsion system 100 may be referred to as a hybrid electric vehicle (HEV).

Vehicle propulsion system 100 may utilize a variety of different operational modes depending on operating conditions encountered by the vehicle propulsion system. Some of these modes may enable engine 10 to be maintained in an off state (i.e. set to a deactivated state) where combustion of fuel at the engine is discontinued. For example, under select operating conditions, motor 120 may propel the vehicle via drive wheel 130 as indicated by arrow 122 while engine 10 is deactivated.

During other operating conditions, engine 10 may be set to a deactivated state (as described above) while motor 120 may be operated to charge energy storage device 150. For example, motor 120 may receive wheel torque from drive wheel 130 as indicated by arrow 122 where the motor may convert the kinetic energy of the vehicle to electrical energy for storage at energy storage device 150 as indicated by arrow 124. This operation may be referred to as regenerative braking of the vehicle. Thus, motor 120 can provide a generator function in some embodiments. However, in other embodiments, generator 160 may instead receive wheel torque from drive wheel 130, where the generator may convert the kinetic energy of the vehicle to electrical energy for storage at energy storage device 150 as indicated by arrow 162.

During still other operating conditions, engine 10 may be operated by combusting fuel received from fuel system 140 as indicated by arrow 142. For example, engine 10 may be operated to propel the vehicle via drive wheel 130 as indicated by arrow 112 while motor 120 is deactivated. During other operating conditions, both engine 10 and motor 120 may each be operated to propel the vehicle via drive wheel 130 as indicated by arrows 112 and 122, respectively. A configuration where both the engine and the motor may selectively propel the vehicle may be referred to as a parallel type vehicle propulsion system. Note that in some embodiments, motor 120 may propel the vehicle via a first set of drive wheels and engine 10 may propel the vehicle via a second set of drive wheels.

In other embodiments, vehicle propulsion system 100 may be configured as a series type vehicle propulsion system, whereby the engine does not directly propel the drive wheels. Rather, engine 10 may be operated to power motor 120, which may in turn propel the vehicle via drive wheel 130 as indicated by arrow 122. For example, during select operating conditions, engine 10 may drive generator 160, as indicated by arrow 116, which may in turn supply electrical energy to one or more of motor 120 as indicated by arrow 114 or energy storage device 150 as indicated by arrow 162. As another example, engine 10 may be operated to drive motor 120 which may in turn provide a generator function to convert the engine output to electrical energy, where the electrical energy may be stored at energy storage device 150 for later use by the motor.

Vehicle propulsion system 100 may include a power box 191 which may receive power from generator 160. Power box 191 may include one or more alternating current (AC) and/or direct current (DC) power outlets for performing tasks including but not limited to powering power tools at work sites, powering lighting, powering outdoor speakers, powering water pumps, supplying power in situations including emergency power outage, powering tailgating activities, powering RV camping activities, etc. In other words, the AC and/or DC power outlets of power box 191 may be used to power auxiliary electrical loads 193 (power take-off devices), for example loads external to the vehicle. The power outlets may be external to a cabin of the vehicle (e.g. bed of truck) and/or internal to the cabin of the vehicle.

Generator 160 may comprise an onboard full sine wave inverter. For providing power via power box 191, generator 160 may receive energy via the energy storage device 150 in some examples, where DC power is converted via the generator 160 to AC power for powering power box 191 under situations where AC power is desired. Additionally or alternatively, the engine 10 may be activated to combust air and fuel in order to generate AC power via generator 160 for powering power box 191. The vehicle operator 102 may utilize vehicle instrument panel 196 (such as a human machine interface), which may include input portions for receiving operator input, for controlling power box 191. In an alternate embodiment, in addition to generator 160, an additional generator coupled to the engine may be used to power the power box 191.

Discussed herein, to power auxiliary electrical loads, the vehicle operator 102 may select a mode of operation via the vehicle instrument panel termed "power to the box" or PttB mode. In the PttB mode, power from the generator 160 may be utilized to operate an off-board auxiliary load 193. For example, the vehicle operator may select PttB mode via the vehicle instrument panel, and may further select an engine speed (revolutions per minute or RPM) that the engine may run at for powering the power box 191.

During operation in the PttB mode, in response to the condition for an engine idle-stop being met, input from a user may be requested via a human machine interface (HMI), the HMI including a display coupled to a vehicle dashboard and/or a display of a smart phone operated by the user. The condition for the engine idle-stop includes a higher than threshold duration of engine idling with the vehicle stopped at the current location. Based on a first input from the user, operation of an engine may be continued without engine shut-down until the generator is deactivated and the vehicle is moved from an origin location. Based on a second input from the user, the engine may be shut down while based on a third input from the user, engine operation may be continued without engine shut-down for an indicated duration, and then upon completion of the indicated duration, the engine may be shut down. The first input, the second input, and the third input are received in response to prompting the user for the input via the HMI. As such, the user may indicate any one (not multiple) of the first input, the second input, and the third input at one time. In this way, by scheduling engine idle-stop based on generator operation and user input, power delivery to auxiliary loads may be continued as desired.

Fuel system 140 may include one or more fuel storage tanks 144 for storing fuel on-board the vehicle. For example, fuel tank 144 may store one or more liquid fuels, including but not limited to: gasoline, diesel, and alcohol fuels. In some examples, the fuel may be stored on-board the vehicle as a blend of two or more different fuels. For example, fuel tank 144 may be configured to store a blend of gasoline and ethanol (e.g., E10, E85, etc.) or a blend of gasoline and methanol (e.g., M10, M85, etc.), whereby these fuels or fuel blends may be delivered to engine 10 as indicated by arrow 142. Still other suitable fuels or fuel blends may be supplied to engine 10, where they may be combusted at the engine to produce an engine output. The engine output may be utilized to propel the vehicle as indicated by arrow 112 or to recharge energy storage device 150 via motor 120 or generator 160. While not explicitly illustrated, it may be understood that fuel tank 144 may include a fuel level indicator (FLI) for indicating a level of fuel in the fuel tank.

In some embodiments, energy storage device 150 may be configured to store electrical energy that may be supplied to other electrical loads residing on-board the vehicle (other than the motor), including cabin heating and air conditioning, engine starting, headlights, cabin audio and video systems, etc. As a non-limiting example, energy storage device 150 may include one or more batteries and/or capacitors.

Control system 190 may communicate with one or more of engine 10, motor 120, fuel system 140, energy storage device 150, and generator 160. For example, control system 190 may receive sensory feedback information from one or more of engine 10, motor 120, fuel system 140, energy storage device 150, and generator 160. Further, control system 190 may send control signals to one or more of engine 10, motor 120, fuel system 140, energy storage device 150, and generator 160 responsive to this sensory feedback. Control system 190 may receive an indication of an operator requested output of the vehicle propulsion system from a vehicle operator 102. For example, control system 190 may receive sensory feedback from pedal position sensor 194 which communicates with pedal 192. Pedal 192 may refer schematically to a brake pedal or an accelerator pedal. Furthermore, in some examples control system 190 may be in communication with a remote engine start receiver 195 (or transceiver) that receives wireless signals 106 from a key fob 104 having a remote start button 105. In other examples (not shown), a remote engine start may be initiated via a cellular telephone, or smartphone based system where a user's cellular telephone sends data to a server and the server communicates with the vehicle to start the engine.

Energy storage device 150 may periodically receive electrical energy from a power source 180 residing external to the vehicle (e.g., not part of the vehicle) as indicated by arrow 184. As a non-limiting example, vehicle propulsion system 100 may be configured as a plug-in hybrid electric vehicle (PHEV), whereby electrical energy may be supplied to energy storage device 150 from power source 180 via an electrical energy transmission cable 182. During a recharging operation of energy storage device 150 from power source 180, electrical transmission cable 182 may electrically couple energy storage device 150 and power source 180. While the vehicle propulsion system is operated to propel the vehicle, electrical transmission cable 182 may disconnected between power source 180 and energy storage device 150. Control system 190 may identify and/or control the amount of electrical energy stored at the energy storage device, which may be referred to as the state of charge (SOC).

In other embodiments, electrical transmission cable 182 may be omitted, where electrical energy may be received wirelessly at energy storage device 150 from power source 180. For example, energy storage device 150 may receive electrical energy from power source 180 via one or more of electromagnetic induction, radio waves, and electromagnetic resonance. As such, it should be appreciated that any suitable approach may be used for recharging energy storage device 150 from a power source that does not comprise part of the vehicle. In this way, motor 120 may propel the vehicle by utilizing an energy source other than the fuel utilized by engine 10.

Fuel system 140 may periodically receive fuel from a fuel source residing external to the vehicle. As a non-limiting example, vehicle propulsion system 100 may be refueled by receiving fuel via a fuel dispensing device 170 as indicated by arrow 172. In some embodiments, fuel tank 144 may be configured to store the fuel received from fuel dispensing device 170 until it is supplied to engine 10 for combustion. In some embodiments, control system 190 may receive an indication of the level of fuel stored at fuel tank 144 via a fuel level sensor. The level of fuel stored at fuel tank 144 (e.g., as identified by the fuel level sensor) may be communicated to the vehicle operator, for example, via a fuel gauge or indication in a vehicle instrument panel 196.

The vehicle propulsion system 100 may also include sensors dedicated to indicating the occupancy-state of the vehicle, for example seat load cells 107, door sensing technology 108, and onboard cameras 109. Vehicle propulsion system 100 may also include inertial sensors 199. Inertial sensors may comprise one or more of the following: longitudinal, latitudinal, vertical, yaw, roll, and pitch sensors. The vehicle instrument panel 196 may include indicator light(s) and/or a text-based display in which messages are displayed to an operator. In some examples, vehicle instrument panel 196 may include a speaker or speakers for additionally or alternatively conveying audible messages to an operator. The vehicle instrument panel 196 may also include various input portions for receiving an operator input, such as buttons, touch screens, voice input/recognition (which may include a microphone), etc.

In some examples, vehicle system 100 may include lasers, radar, sonar, and/or acoustic sensors 133, which may enable vehicle location, traffic information, etc., to be collected via the vehicle. In one example, discussed in further detail below, one or more of sensors 133 may be used to infer a situation where the vehicle is in an environment of reduced air exchange (as compared to, for example, a situation where the vehicle is traveling on an open road or is parked outside).

Figure 2:
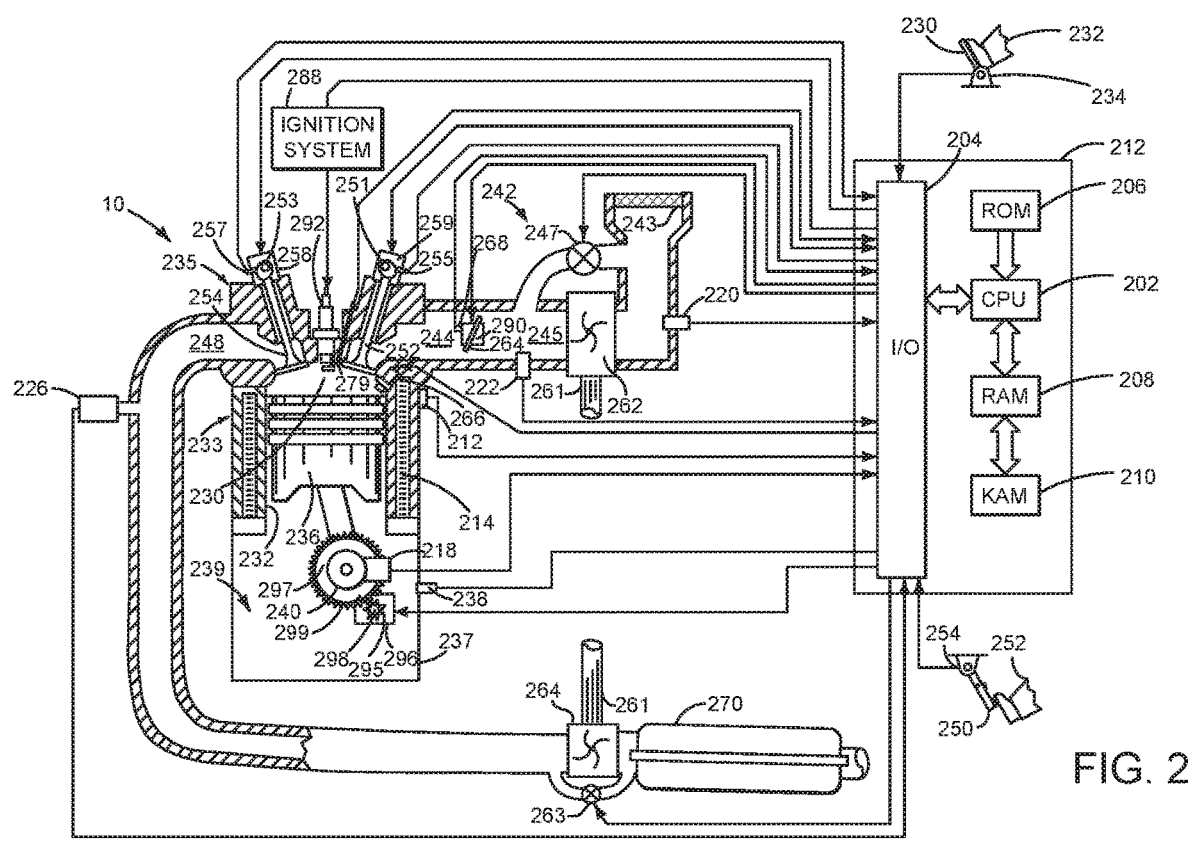
FIG. 2 shows an example engine system of the vehicle propulsion system.

Referring to FIG. 2, internal combustion engine 10, comprising a plurality of cylinders, one cylinder of which is shown in FIG. 2, is controlled by electronic engine controller 212. It may be understood that engine controller 212 may be part of control system 190 at FIG. 1. Engine 10 is comprised of cylinder head 235 and block 233, which include combustion chamber 230 and cylinder walls 232. Piston 236 is positioned therein and reciprocates via a connection to crankshaft 240. Flywheel 297 and ring gear 299 are coupled to crankshaft 240. Starter 296 (e.g., low voltage (operated with less than 30 volts) electric machine) includes pinion shaft 298 and pinion gear 295. Pinion shaft 298 may selectively advance pinion gear 295 to engage ring gear 299. Starter 296 may be directly mounted to the front of the engine or the rear of the engine. In some examples, starter 296 may selectively supply torque to crankshaft 240 via a belt or chain. In one example, starter 296 is in a base state when not engaged to the engine crankshaft.

Combustion chamber 230 is shown communicating with intake manifold 244 and exhaust manifold 248 via respective intake valve 252 and exhaust valve 254. Each intake and exhaust valve may be operated by an intake cam 251 and an exhaust cam 253. The position of intake cam 251 may be determined by intake cam sensor 255. The position of exhaust cam 253 may be determined by exhaust cam sensor 257. A phase or position of intake valve 252 may be adjusted relative to a position of crankshaft 240 via valve phase changing device 259. A phase or position of exhaust valve 254 may be adjusted relative to a position of crankshaft 240 via valve phase changing device 258. Valve phase changing devices 258 and 259 may be electro-mechanical devices, hydraulic devices, or mechanical devices.

Engine 10 includes a crankcase 239 that houses crankshaft 240. Oil pan 237 may form a lower boundary of crankcase 239 and engine block 233 and piston 236 may constitute an upper boundary of crankcase 239. Crankcase 239 may include a crankcase ventilation valve (not shown) that may vent gases to combustion chamber 230 via intake manifold 244. Pressure in crankcase 239 may be sensed via pressure sensor 238. Alternatively, pressure in crankcase 239 may be estimated.

Fuel injector 266 is shown positioned to inject fuel directly into cylinder 230, which is known to those skilled in the art as direct injection. Fuel injector 266 delivers liquid fuel in proportion to the pulse width from controller 212. Fuel is delivered to fuel injector 266 by a fuel system (not shown) including a fuel tank, fuel pump, and fuel rail (not shown). In one example, a high pressure, dual stage, fuel system may be used to generate higher fuel pressures.

In addition, intake manifold 244 is shown communicating with turbocharger compressor 262 and engine air intake 242. In other examples, compressor 262 may be a supercharger compressor. Shaft 261 mechanically couples turbocharger turbine 264 to turbocharger compressor 262. Optional electronic throttle 290 adjusts a position of throttle plate 264 to control air flow from compressor 262 to intake manifold 244. Pressure in boost chamber 245 may be referred to a throttle inlet pressure since the inlet of throttle 290 is within boost chamber 245. The throttle outlet is in intake manifold 244. In some examples, throttle 290 and throttle plate 264 may be positioned between intake valve 252 and intake manifold 244 such that throttle 290 is a port throttle. Compressor recirculation valve 247 may be selectively adjusted to a plurality of positions between fully open and fully closed. Waste gate 263 may be adjusted via controller 212 to allow exhaust gases to selectively bypass turbine 264 to control the speed of compressor 262. Air filter 243 cleans air entering engine air intake 242.

Distributorless ignition system 288 provides an ignition spark to combustion chamber 230 via spark plug 292 in response to a command from controller 212. Universal Exhaust Gas Oxygen (UEGO) sensor 226 is shown coupled to exhaust manifold 248 upstream of catalytic converter 270. Alternatively, a two-state exhaust gas oxygen sensor may be substituted for UEGO sensor 226.

Converter 270 can include multiple catalyst bricks, in one example. In another example, multiple emission control devices, each with multiple bricks, can be used. Converter 270 can be a three-way type catalyst in one example.

Controller 212 is shown in FIG. 1 as a conventional microcomputer including: microprocessor unit 202, input/output ports 204, read-only memory 206 (e.g., non-transitory memory), random access memory 208, keep alive memory 210, and a conventional data bus. Controller 212 is shown receiving various signals from sensors coupled to engine 10, in addition to those signals previously discussed, including: engine coolant temperature (ECT) from temperature sensor 212 coupled to cooling sleeve 214; a position sensor 234 coupled to an accelerator pedal 230 for sensing force applied by foot 232; a position sensor 254 coupled to brake pedal 250 for sensing force applied by foot 252, a measurement of engine manifold pressure (MAP) from pressure sensor 222 coupled to intake manifold 244; an engine position sensor from a Hall effect sensor 218 sensing crankshaft 240 position; a measurement of air mass entering the engine from sensor 220; cylinder pressure from pressure sensor 279; and a measurement of throttle position from sensor 268. Barometric pressure may also be sensed (sensor not shown) for processing by controller 212. In a preferred aspect of the present description, engine position sensor 218 produces a predetermined number of equally spaced pulses every revolution of the crankshaft from which engine speed (RPM) can be determined.

During operation, each cylinder within engine 10 typically undergoes a four stroke cycle: the cycle includes the intake stroke, compression stroke, expansion stroke, and exhaust stroke. During the intake stroke, generally, the exhaust valve 254 closes and intake valve 252 opens. Air is introduced into combustion chamber 230 via intake manifold 244, and piston 236 moves to the bottom of the cylinder so as to increase the volume within combustion chamber 230. The position at which piston 236 is near the bottom of the cylinder and at the end of its stroke (e.g. when combustion chamber 30 is at its largest volume) is typically referred to by those of skill in the art as bottom dead center (BDC).

During the compression stroke, intake valve 252 and exhaust valve 254 are closed. Piston 236 moves toward the cylinder head so as to compress the air within combustion chamber 230. The point at which piston 236 is at the end of its stroke and closest to the cylinder head (e.g. when combustion chamber 230 is at its smallest volume) is typically referred to by those of skill in the art as top dead center (TDC). In a process hereinafter referred to as injection, fuel is introduced into the combustion chamber. In a process hereinafter referred to as ignition, the injected fuel is ignited by known ignition means such as spark plug 292, resulting in combustion.

During the expansion stroke, the expanding gases push piston 236 back to BDC. Crankshaft 240 converts piston movement into a rotational torque of the rotary shaft. Finally, during the exhaust stroke, the exhaust valve 254 opens to release the combusted air-fuel mixture to exhaust manifold 248 and the piston returns to TDC. Note that the above is shown merely as an example, and that intake and exhaust valve opening and/or closing timings may vary, such as to provide positive or negative valve overlap, late intake valve closing, or various other examples.

Figure 3:
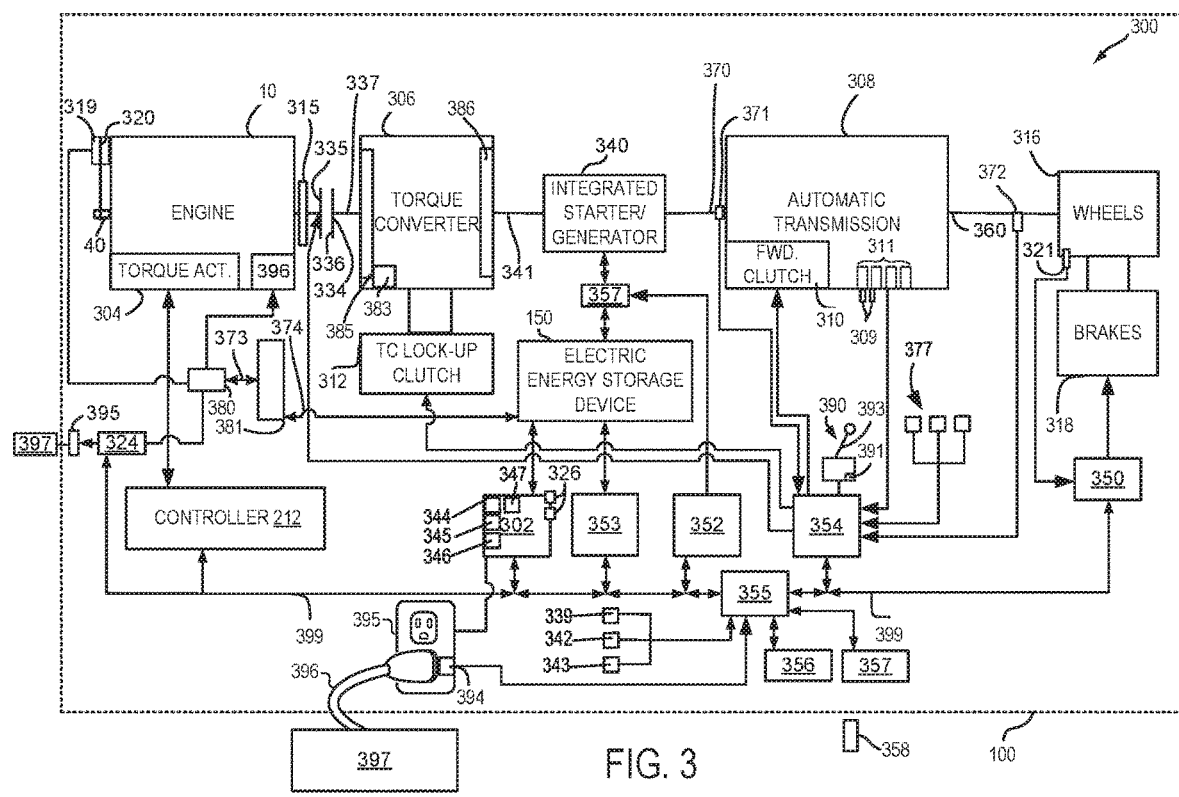
FIG. 3 is a block diagram of a powertrain of the vehicle propulsion system.

FIG. 3 is a block diagram of a vehicle propulsion system 100 including a powertrain or driveline 300. The powertrain of FIG. 3 includes an engine 10. Powertrain 300 is shown including vehicle system controller 355, engine controller 212, electric machine controller 352, transmission controller 354, energy storage device controller 353, climate controller 356, and brake controller 350. The controllers may communicate over controller area network (CAN) 399. Each of the controllers may provide information to other controllers such as power output limits (e.g., power output of the device or component being controlled not to be exceeded), power input limits (e.g., power input of the device or component being controlled not to be exceeded), power output of the device being controlled, sensor and actuator data, diagnostic information (e.g., information regarding a degraded transmission, information regarding a degraded engine, information regarding a degraded electric machine, information regarding degraded brakes). Further, the vehicle system controller 355 may provide commands to engine controller 212, electric machine controller 352, transmission controller 354, climate controller 356, and brake controller 350 to achieve driver input requests and other requests that are based on vehicle operating conditions.

For example, in response to a driver releasing an accelerator pedal and vehicle speed, vehicle system controller 355 may request a desired wheel power or a wheel power level to provide a desired rate of vehicle deceleration. The requested desired wheel power may be provided by vehicle system controller 355 requesting a first braking power from electric machine controller 352 and a second braking power from engine controller 212, the first and second powers providing a desired driveline braking power at vehicle wheels 316 (e.g., same as wheels 130 at FIG. 1). Vehicle system controller 355 may also request a friction braking power via brake controller 350. The braking powers may be referred to as negative powers since they slow driveline and wheel rotation. Positive power may maintain or accelerate driveline and wheel rotation.

In other examples, the partitioning of controlling powertrain devices may be different than that shown in FIG. 3. For example, a single controller may take the place of vehicle system controller 355, engine controller 212, electric machine controller 352, transmission controller 354, climate controller 356, and brake controller 350. Alternatively, the vehicle system controller 355 and the engine controller 212 may be a single unit while the electric machine controller 352, the transmission controller 354, climate controller 356, and the brake controller 350 are standalone controllers.

In this example, powertrain 300 may be powered by engine 10 and/or electric machine 340. Engine 10 may be started via optional engine starting system (e.g., a starter motor) or via driveline integrated starter/generator (ISG) 340 also known as an integrated starter/generator. Driveline ISG 340 (e.g., high voltage (operated with greater than 30 volts) electrical machine) may also be referred to as an electric machine, motor, and/or generator. Further, power of engine 10 may be adjusted via power actuator 304, such as a fuel injector, throttle, etc.

Bi-directional DC/DC converter 381 may transfer electrical energy from a high voltage buss 374 to a low voltage buss 373 or vice-versa. Low voltage battery 380 is electrically coupled to low voltage buss 373. Electric energy storage device 150 is electrically coupled to high voltage buss 374. Low voltage battery 380 selectively supplies electrical energy to starter motor 396, and may receive electrical energy from alternator or belt integrated starter/generator (BISG) 319. BISG 319 is shown coupled to crankshaft 240 via belt 320. Direct current to alternating current (DCAC) converter 324 may receive electrical energy from low voltage battery 380, BISG 319 and/or electric energy storage device 150. DCAC 324 may communicate an amount of power that is delivered to outlet receptacle 395 (e.g., same as power box 191 at FIG. 1) and external alternating current (AC) electrical power consumers 397 (e.g., auxiliary loads 193 at FIG. 1) to vehicle system controller 355 so that vehicle system controller 355 may command engine controller 212 to provide a requested engine speed and/or torque responsive to the amount of electrical power that is supplied to external AC electrical power consumers 397.

DCAC converter 302 may similarly receive DC power from electric energy storage device 150, or alternatively, via low voltage battery 380 and/or BISG 319. In some examples, DCAC converter 302 and/or DCAC converter 324 may be included as part of a generator (e.g., generator 160 at FIG. 1). In some examples, DCAC converter 302 and DCAC converter 324 may be the same, however in other examples DCAC converter 302 and DCAC converter 324 may be different.

DCAC converter 302 is shown electrically coupled to electric energy storage device 150 and electrical output receptacle 395. In some examples, electrical output receptacle 395 may be the same as power box 191 at FIG. 1. DCAC converter 302 may convert DC power to AC power for operating external electric power consumer 397 (e.g., hand tools, entertainment systems, lighting, pumps, etc.). DCAC converter 302 may convert electric power from low voltage battery 380, electric power from electric energy storage device 150, or electric power from ISG 340 into electric power that is delivered to electrical output receptacle 395. External electric power consumer 397 may be located off-board vehicle propulsion system 100 or they may be added to vehicle propulsion system 100. External power consumers 397 may be electrically coupled to electrical output receptacle 395 via power cord 398. External electric power consumer sensor 394 may detect the presence or absence of external power consumer 397. Electric power consumer sensor 394 may physically sense the presence of cord 396 via a switch input, or alternatively, sensor 394 may be a current sensor and detect electric current flow out of electrical output receptacle 395 to determine the presence or absence of external power consumer 397. In some examples, DCAC converter 302 may include light emitting diode (LED) indicator lights 326, which may indicate a status of the DCAC converter. For example, a green light may indicate an absence of degradation stemming from the DCAC converter, while a red light may indicate a presence of degradation stemming from the DCAC converter. In another example, the LED(s) may flash in response to the presence of degradation associated with the DCAC converter.

While not explicitly illustrated, it may be understood that the DCAC converter may be electrically connected to outlets (e.g., output receptacle 395 at FIG. 3 and/or power box 191 at FIG. 1) all over the vehicle. For example, there may be outlets located at a dashboard of the vehicle, near front and/or rear seats, in a trunk and/or under a hood of the vehicle, and/or in a bed of the vehicle. An isolation relay (not shown) may enable, in some examples, the outlets located in the bed of the vehicle to be available for operation in a high-mode of operation, but not a low-mode of operation. The low power mode may be a mode that includes a threshold power output, whereas the high power mode of operation may be a mode where a full capability of the DCAC converter may be available for powering auxiliary loads. In some examples, outlets interior to the vehicle may be available in the high power mode and the low power mode, in contrast to outlets in the bed of the vehicle which may available in the high power mode but not the low power mode.

An engine output power may be transmitted to an input or first side of powertrain disconnect clutch 335 through dual mass flywheel 315. Disconnect clutch 336 may be electrically or hydraulically actuated. The downstream or second side 334 of disconnect clutch 336 is shown mechanically coupled to torque converter impeller 385 via shaft 337. Disconnect clutch 336 may be fully closed when engine 10 is supplying power to vehicle wheels 316. Disconnect clutch 336 may be fully open when engine 10 is stopped (e.g., not combusting fuel).

Torque converter 306 includes a turbine 386 to output power to shaft 341. Input shaft 341 mechanically couples torque converter 306 to ISG 340. Torque converter 306 also includes a torque converter bypass lock-up clutch 312 (TCC). Power is directly transferred from impeller 385 to turbine 386 when TCC is locked. TCC is electrically operated by controller 354. Alternatively, TCC may be hydraulically locked. In one example, the torque converter may be referred to as a component of the transmission. Torque may be transferred via fluid from impeller 385 to 386.

When torque converter lock-up clutch 312 is fully disengaged, torque converter 306 transmits engine power to automatic transmission 308 via fluid transfer between the torque converter turbine 386 and torque converter impeller 385 or vice-versa, thereby enabling torque multiplication. In contrast, when torque converter lock-up clutch 312 is fully engaged, the engine output power may be directly transferred via the torque converter clutch to an input shaft 341 of ISG 340. Alternatively, the torque converter lock-up clutch 312 may be partially engaged, thereby enabling the amount of engine torque directly relayed to the ISG to be adjusted. The transmission controller 354 may be configured to adjust the amount of torque transmitted by torque converter 312 by adjusting the torque converter lock-up clutch in response to various engine operating conditions, or based on a driver-based engine operation request.

Torque converter 306 also includes pump 383 that pressurizes fluid to operate disconnect clutch 336, forward clutch 310, and gear clutches 311. Pump 383 is driven via impeller 385, which rotates at a same speed as ISG 340.

ISG 340 may be operated to provide power to powertrain 300 or to convert powertrain power into electrical energy to be stored in electric energy storage device 150 in a regeneration mode. ISG 340 is in electrical communication with energy storage device 150 via inverter 379. Inverter 379 may convert direct current (DC) electric power from electric energy storage device 150 into alternating current (AC) electric power for operating ISG 340. Alternatively, inverter 379 may converter AC power from ISG 340 into DC power for storing in electric energy storage device 250. Inverter 379 may be controlled via electric machine controller 352. ISG 340 has a higher output power capacity than a starter motor (not shown). Further, ISG 340 directly drives powertrain 300 or is directly driven by powertrain 300. There are no belts, gears, or chains to couple ISG 340 to powertrain 300. Rather, ISG 340 rotates at the same rate as powertrain 300. Electrical energy storage device 150 (e.g., high voltage battery or power source) may be a battery, capacitor, or inductor. The downstream side of ISG 340 is mechanically coupled to the input shaft 370 of automatic transmission 308. The upstream side of the ISG 340 is mechanically coupled to the turbine 386 of torque converter 306. ISG 340 may provide a positive power or a negative power to powertrain 300 via operating as a motor or generator as instructed by electric machine controller 352.

ISG 340 may rotate turbine 386, which in turn may rotate impeller 385 to start engine 10 during engine starting. Torque converter 306 may multiply torque of ISG 340 to rotate engine 10 when driveline disconnect clutch 336 is fully closed. Thus, the torque of ISG 340 may be increased via torque converter 306 to rotate engine 10 during engine starting. TCC 312 may be fully open when ISG 340 is cranking engine 10 so that torque of ISG 340 may be multiplied. Alternatively, TCC 312 may be partially open when ISG 340 is cranking engine 10 to manage torque transfer to engine 10. ISG 340 may rotate at a greater speed than engine 10 during engine cranking.

Automatic transmission 308 includes gear clutches 311 (e.g., for gears 1-10) and forward clutch 310. Automatic transmission 308 is a fixed ratio transmission. Alternatively, transmission 308 may be a continuously variable transmission that has a capability of simulating a fixed gear ratio transmission and fixed gear ratios. The gear clutches 311 and the forward clutch 310 may be selectively engaged to change a ratio of an actual total number of turns of input shaft 370 to an actual total number of turns of wheels 316. Gear clutches 311 may be engaged or disengaged via adjusting fluid supplied to the clutches via shift control solenoid valves 309. Power output from the automatic transmission 308 may also be relayed to wheels 316 to propel the vehicle via output shaft 360. Specifically, automatic transmission 308 may transfer an input driving power at the input shaft 370 responsive to a vehicle traveling condition before transmitting an output driving power to the wheels 316. Transmission controller 354 selectively activates or engages TCC 312, gear clutches 311, and forward clutch 310. Transmission controller also selectively deactivates or disengages TCC 312, gear clutches 311, and forward clutch 310.

Further, a frictional force may be applied to wheels 316 by engaging friction wheel brakes 318. In one example, friction wheel brakes 318 may be engaged in response to a human driver pressing their foot on a brake pedal (e.g., brake pedal 250 at FIG. 2) and/or in response to instructions within brake controller 350. Further, brake controller 350 may apply brakes 318 in response to information and/or requests made by vehicle system controller 355. In the same way, a frictional force may be reduced to wheels 316 by disengaging wheel brakes 318 in response to the human driver releasing their foot from a brake pedal, brake controller instructions, and/or vehicle system controller instructions and/or information. For example, vehicle brakes may apply a frictional force to wheels 316 via controller 350 as part of an automated engine stopping procedure.

In response to a request to accelerate vehicle propulsion system 100, the vehicle system controller 355 may obtain a driver demand power or power request from an accelerator pedal or other device. Vehicle system controller 355 then allocates a fraction of the requested driver demand power to the engine and the remaining fraction to the ISG. Vehicle system controller 355 requests the engine power from engine controller 212 and the ISG power from electric machine controller 352. If the engine power that flows through torque converter 306 and ISG power is less than a transmission input power limit (e.g., a threshold value not to be exceeded), the power is delivered to transmission input shaft 370. Transmission controller 354 selectively locks torque converter clutch 312 and engages gears via gear clutches 311 in response to shift schedules and TCC lockup schedules that may be based on input shaft power and vehicle speed. In some conditions when it may be desired to charge electric energy storage device 150, a charging power (e.g., a negative ISG power) may be requested while a non-zero driver demand power is present. Vehicle system controller 355 may request increased engine power to overcome the charging power to meet the driver demand power.

In response to a request to decelerate vehicle propulsion system 100 and provide regenerative braking, vehicle system controller 355 may provide a negative desired wheel power (e.g., desired or requested powertrain wheel power) based on vehicle speed and brake pedal position. Vehicle system controller 355 then allocates a fraction of the negative desired wheel power to the ISG 340 and the engine 10. Vehicle system controller 355 may also allocate a portion of the requested braking power to friction brakes 318 (e.g., desired friction brake wheel power). Further, vehicle system controller may notify transmission controller 354 that the vehicle is in regenerative braking mode so that transmission controller 354 shifts gears 311 based on a unique shifting schedule to increase regeneration efficiency. Engine 10 and ISG 340 may supply a negative power to transmission input shaft 370, but negative power provided by ISG 340 and engine 10 may be limited by transmission controller 354 which outputs a transmission input shaft negative power limit (e.g., not to be exceeded threshold value). Further, negative power of ISG 340 may be limited (e.g., constrained to less than a threshold negative threshold power) based on operating conditions of electric energy storage device 150, by vehicle system controller 355, or electric machine controller 352. Any portion of desired negative wheel power that may not be provided by ISG 340 because of transmission or ISG limits may be allocated to engine 10 and/or friction brakes 318 so that the desired wheel power is provided by a combination of negative power (e.g., power absorbed) via friction brakes 318, engine 10, and ISG 340.

Accordingly, power control of the various powertrain components may be supervised by vehicle system controller 355 with local power control for the engine 10, transmission 308, electric machine 340, and brakes 318 provided via engine controller 212, electric machine controller 352, transmission controller 354, and brake controller 350.

As one example, an engine power output may be controlled by adjusting a combination of spark timing, fuel pulse width, fuel pulse timing, and/or air charge, by controlling throttle opening and/or valve timing, valve lift and boost for turbo- or super-charged engines. In the case of a diesel engine, controller 212 may control the engine power output by controlling a combination of fuel pulse width, fuel pulse timing, and air charge. Engine braking power or negative engine power may be provided by rotating the engine with the engine generating power that is insufficient to rotate the engine. Thus, the engine may generate a braking power via operating at a low power while combusting fuel, with one or more cylinders deactivated (e.g., not combusting fuel), or with all cylinders deactivated and while rotating the engine. The amount of engine braking power may be adjusted via adjusting engine valve timing. Engine valve timing may be adjusted to increase or decrease engine compression work. Further, engine valve timing may be adjusted to increase or decrease engine expansion work. In all cases, engine control may be performed on a cylinder-by-cylinder basis to control the engine power output.

Electric machine controller 352 may control power output and electrical energy production from ISG 340 by adjusting current flowing to and from field and/or armature windings of ISG 340 as is known in the art.

Transmission controller 354 receives transmission input shaft position via position sensor 371. Transmission controller 354 may convert transmission input shaft position into input shaft speed via differentiating a signal from position sensor 371 or counting a number of known angular distance pulses over a predetermined time interval. Transmission controller 354 may receive transmission output shaft torque from torque sensor 372. Alternatively, sensor 372 may be a position sensor or torque and position sensors. If sensor 372 is a position sensor, controller 354 may count shaft position pulses over a predetermined time interval to determine transmission output shaft velocity. Transmission controller 354 may also differentiate transmission output shaft velocity to determine transmission output shaft acceleration. Transmission controller 354, engine controller 212, and vehicle system controller 355, may also receive addition transmission information from sensors 377, which may include but are not limited to pump output line pressure sensors, transmission hydraulic pressure sensors (e.g., gear clutch fluid pressure sensors), ISG temperature sensors, sensor for determining torque transferred via the transmission clutches, gear shift lever sensors, and ambient temperature sensors. Transmission controller 354 may also receive requested gear input from transmission shifter 390 (e.g., a human/machine interface device). In this example, transmission shifter 390 includes a shift lever 393 that may be physically moved to change transmission gears. Transmission selector 390 may include positions for gears 1-N (where N is an upper gear number), D (drive), and P (park). Transmission shifter 390 shift lever 393 may be prevented from moving via a solenoid actuator 391 that selectively prevents shift lever 393 from moving from park or neutral into reverse or a forward gear position (e.g., drive).

Brake controller 350 receives wheel speed information via wheel speed sensor 321 and braking requests from vehicle system controller 355. Brake controller 350 may also receive brake pedal position information from brake pedal sensor (not shown) directly or over CAN 399. Brake controller 350 may provide braking responsive to a wheel power command from vehicle system controller 355. Brake controller 350 may also provide anti-lock and vehicle stability braking to improve vehicle braking and stability. As such, brake controller 350 may provide a wheel power limit (e.g., a threshold negative wheel power not to be exceeded) to the vehicle system controller 355 so that negative ISG power does not cause the wheel power limit to be exceeded. For example, if controller 350 issues a negative wheel power limit of 50 N-m, ISG power is adjusted to provide less than 50 N-m (e.g., 49 N-m) of negative power at the wheels, including accounting for transmission gearing.

Vehicle system controller 355 may also command and receive data from climate controller 356. Climate controller 356 may control a temperature of a passenger compartment as will be elaborated in greater detail below. Vehicle system controller 355 may also determine a position of a window (not shown at FIG. 3) via window position sensor 342 and a position and/or occupancy of a driver or passenger seat (not shown at FIG. 3) via seat sensor 339. Vehicle system controller 355 may also determine ambient temperature via temperature sensor 343. Vehicle system controller 355 may also provide vehicle status information and indicate vehicle operating conditions to vehicle occupants via human/machine interface (HMI) 357. HMI 357 may be configured as a keyboard and display, touch screen, or other known HMI. In some examples, HMI 357 may be similar to or a part of message center 196 at FIG. 1. Further, vehicle system controller 355 may transmit vehicle status information and vehicle operating conditions to external electronic devices 358 (e.g., cell phone or electronic note pads).

DCAC converter 302 includes a cooling fan 347, power input sensors 344 (e.g., current and voltage sensors), power output sensors 345 (e.g., current and voltage sensors), and cooling fan speed sensor 346. DCAC converter 302 may relay DCAC operating conditions as determined via sensors 344, 345, and 346 to vehicle system controller 355. In addition, DCAC converter may adjust a speed of cooling fan 347 in response to instructions received from vehicle system controller 355.

Figure 4A:
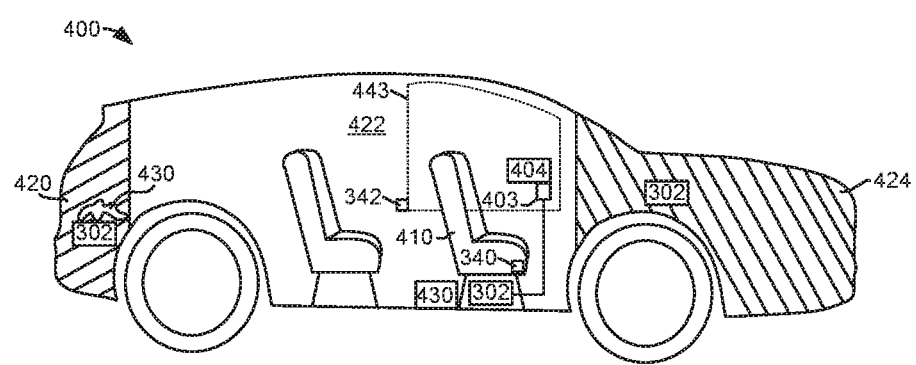
FIG. 4A is a schematic diagram of a vehicle that includes a DCAC converter.

Turning to FIG. 4A, depicted is vehicle 400, of which vehicle propulsion system 100 (refer to FIG. 1) and powertrain 300 (refer to FIG. 3) may be a part of. Vehicle 400 may include a passenger compartment 422, a storage compartment 420 (e.g., a trunk or a rear interior area of the vehicle where seating is not included), and a powertrain compartment 424. Passenger compartment 422 may include seats 410 and a receptacle 403 for providing AC power to AC power consumers 404. AC power consumers may include but are not limited to phones, computing devices, electronic note pads, gaming systems, lights, entertainment systems, and power tools. Receptacle 403 may receive AC electrical power from DCAC converter 302. In some examples, receptacle 403 may be the same or similar to power box 191 at FIG. 1. DCAC converter 302 may be positioned in passenger compartment 422, for example under seat 410. Additionally or alternatively, DCAC converter 302 may be positioned in storage compartment 420 or in powertrain compartment 424 as shown.

As will be elaborated in greater detail below, in some examples air flow through and around DCAC converters 302 may be restricted via objects that have been brought into vehicle 400. For example, air flow to or through DCAC converter 302 may be restricted via objects 430 that are made of a fabric, such as blankets or clothing, or objects that are more rigid in composition, such as books, boxes, etc. The restriction of air flow to and through DCAC converter 302 may increase a temperature of the DCAC converter, and higher temperatures of the DCAC converter may result in DCAC converter performance degradation. In some examples, DCAC temperature may be affected by a position of a window 443, which may be determined via window position sensor 342. Further, DCAC temperature may be affected by a position and/or occupancy of seat 410, which may be determined via seat position sensor 339. Further still, DCAC converter temperature may be affected by a speed of a DCAC fan, the amount of power supplied to the DCAC converter, the amount of power delivered by the DCAC converter, ambient air temperature, and climate control system status, as will be elaborated in further detail below.

Figure 4B:
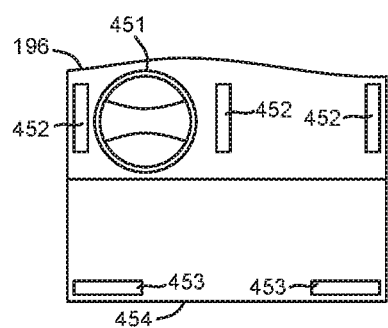
FIGS. 4B-4C show schematic diagrams of an instrument panel and a climate control system.

Referring now to FIG. 4B, a schematic of a dashboard or instrument panel 196 of vehicle 400 is shown. Instrument panel 196 includes a steering wheel 451, dashboard climate control vents 452, and floorboard climate control vents 453. The dashboard climate control vents 452 and the floorboard climate control vents 453 are included in climate control system 455 shown in FIG. 4C.

Dashboard climate control vents 452 may supply cooled or heated air to a chest area of vehicle occupants. Floorboard climate control vents 453 may supply cooled or heated air to the area of floor 454. The temperature of air that is supplied via vents 452 and 453 may be adjusted via the climate control system.

Figure 4C:
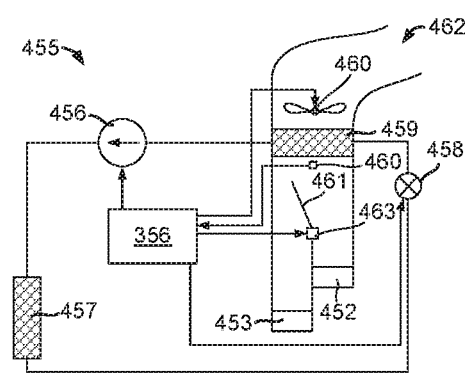

Referring now to FIG. 4C, climate control system 455 is shown. Climate control system 455 includes climate controller 356 that operates climate control system 455 to meet climate control requests that may be input via a human operator to human/machine interface 357 shown in FIG. 3. Climate control system 455 also includes a compressor 456, a first heat exchanger 457 (e.g., external heat exchanger), an expansion valve 458, a second heat exchanger 459 (e.g., an internal heat exchanger), fan 460, vent door 461, intake passage 462, floor vent 453, dashboard vent 452, and vent door actuator 463.

Climate control system 455 may operate in a cooling mode where second heat exchanger 459 operates as an evaporator and where first heat exchanger 457 operates as a condenser. Variable speed compressor 456 pressurizes refrigerant, the pressurized refrigerant may be cooled via the first heat exchanger into a pressurized liquid. The refrigerant may be expanded into a gas via expansion valve 458, thereby cooling the refrigerant and air that passes through second heat exchanger 459. The refrigerant may be heated as it passes through the second heat exchanger 459 and cools air passing through the second heat exchanger 459. The variable speed compressor 456 may compress the heated vaporized refrigerant to start the cycle again. Climate control system 455 may also operate in a heating mode in cases where climate control system 455 is a heat pump. A second expansion valve (not shown) may be included when climate control system 455 is a heat pump.

Warm air may enter intake passage 462 when climate control system 455 is operating in a cooling mode. Fan 460 may draw air into intake passage 462 and push the air through second heat exchanger 459 where the air may be cooled. The air may exit the climate control system solely via floor vents 453, solely via dashboard vents 452, or via both floor vents 453 and dashboard vents 452 depending on the position of vent door 461. Vent door 461 is shown in a position where air is delivered via both the floor vents 453 and dashboard vents 452. The position of vent door 461 is adjusted via climate controller 356 and vent door actuator 463. Climate controller 356 may control a temperature of air exiting the floor vents 453 and dashboard vents 452 via adjusting a speed of variable speed compressor 456, a position of evaporator valve 458, and a speed of fan 460. Climate controller 356 may adjust the speed of variable speed compressor 456, a position of expansion valve 458, a position of vent door 461, and a speed of fan 460 via adjusting an amount of electrical current and voltage supplied to these actuators.

Figure 5:
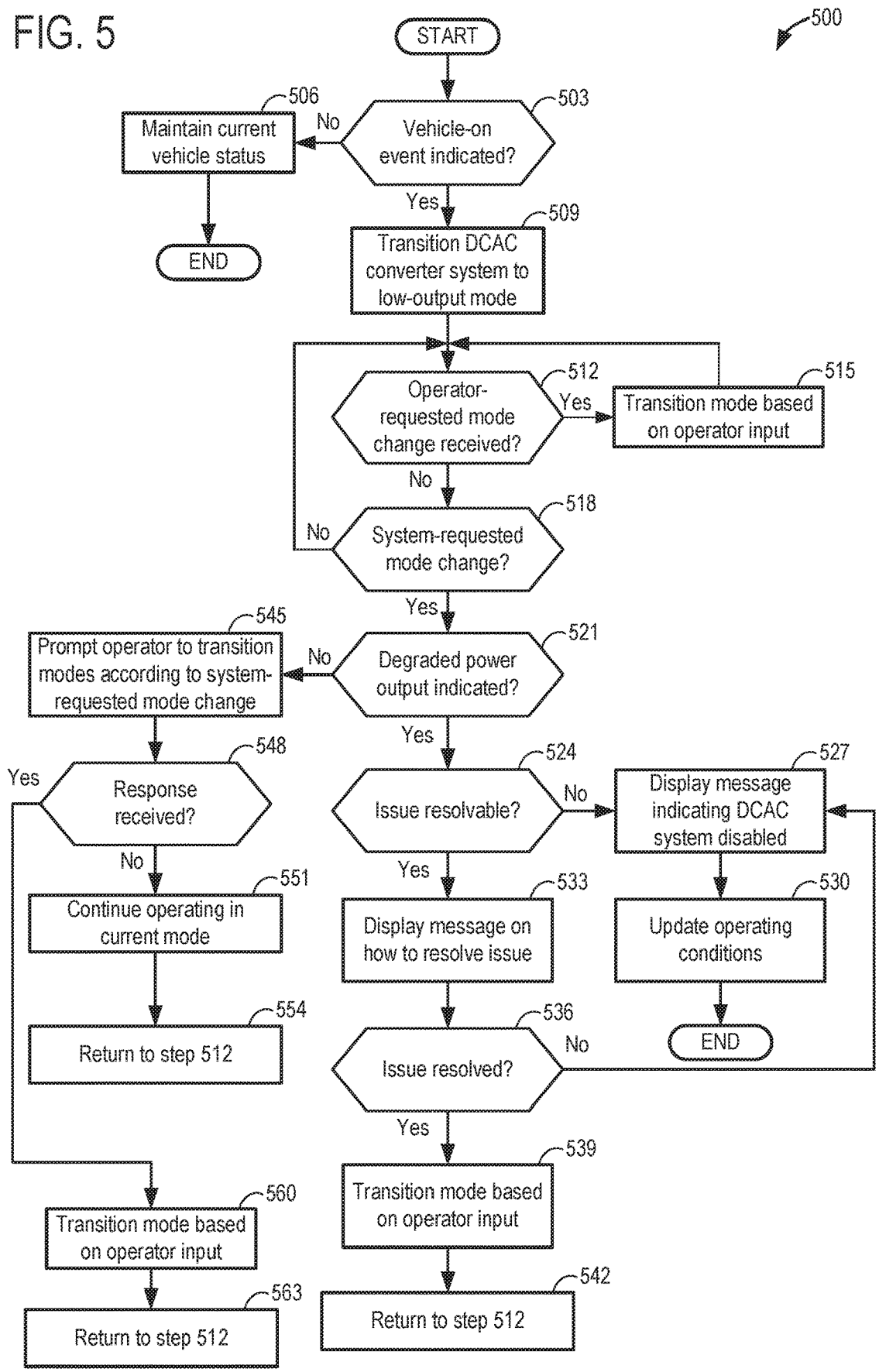
FIG. 5 shows a flow chart illustrating an example method that can be implemented to control mode transitions of a DCAC converter system of the present disclosure.

Turning now to FIG. 5, depicted is a high-level example method 500 for controlling a DCAC converter system, for example DCAC converter 302 at FIG. 3. Specifically, there may be different modes of operation in which the DCAC converter may be operated, and the method of FIG. 5 may be used for transitioning between the modes of operation as a function of operating conditions. Method 500 will be described with reference to the systems described herein and shown in FIGS. 1-4C, though it should be understood that similar methods may be applied to other systems without departing from the scope of this disclosure. Method 500 may be carried out by a controller, such as controller 212 in FIG. 2, and may be stored at the controller as executable instructions in non-transitory memory. Instructions for carrying out method 500 and the rest of the methods included herein may be executed by the controller based on instructions stored on a memory of the controller and in conjunction with signals received from sensors of the vehicle system, such as the sensors described above with reference to FIGS. 1-4C. The controller may employ vehicle system actuators to alter states of devices in the physical world according to the methods depicted below.

Method 500 begins at 503, and includes indicating whether a vehicle-on event has occurred. A vehicle-on event may include a key-on event, in some examples. In other examples, a vehicle-on event may include a remote start, initiated via a key fob (e.g. key fob 104 at FIG. 1) or other external device such as a smart phone, etc. In still other examples, a vehicle-on event may be initiated by a vehicle operator depressing an ignition button located in cabin (e.g., at a dash) of the vehicle. It may be understood that a vehicle-on event may activate the vehicle from a deactivated state, such that the vehicle may be propelled from one location to another.

If, at 503 a vehicle-on event is not indicated, method 500 proceeds to 506. At 506, method 500 includes maintaining current vehicle operating conditions. Specifically, if the vehicle is already on and in operation, then maintaining current vehicle operating conditions may include controlling the vehicle system, which may include controlling the DCAC converter and/or generator via the methods of FIG. 6, FIG. 8, FIG. 10, FIG. 13, FIG. 15, and FIGS. 20-21. Method 500 may then end.

Returning to 503, in response to a vehicle-on event, method 500 proceeds to 509. At 509, method 500 includes transitioning the DCAC converter from an off state, to a low power mode. For example, when the DCAC converter is "off" the DCAC converter may not be in a ready state to convert power. LEDs (e.g., LEDs 326 at FIG. 3) associated with the DCAC converter may be off, and all warnings/notifications may be turned off. It may be understood that the transition to the low power mode from the off state may be automatically conducted via the controller, responsive to an indication of the vehicle-on event. The low power mode may include a threshold power output. If the threshold power output is exceeded, it may be understood that the DCAC converter may not "brown out" where electric power is reduced, but instead the system may indicate degraded power output and the DCAC converter may be deactivated after a calibrated amount of time in which the threshold power output is exceeded. While not explicitly illustrated, it may be understood that while operating in the low power mode, methods including but not limited to the method of FIG. 6 and FIG. 13 may be used, as will be elaborated in greater detail below.

Proceeding to 512, method 500 includes indicating whether an operator-requested mode change is received at the controller. Specifically, at 512, method 500 includes indicating whether the operator (e.g., human or autonomous operator) has requested a transition from the low power mode of operation, to either the off mode of operation, or alternatively, a high power mode of operation. It may be understood that the high power mode of operation may comprise a mode in which a full capability of the DCAC converter may be available for supplying power to auxiliary loads.

Turning briefly to FIG. 7A, depicted is a screenshot 700 of an example screen of a human machine interface (HMI) displaying options for transitioning between DCAC operational modes to a user (such as the vehicle operator). Three options for transitioning modes are shown in rows 704, 706 and 708, respectively. In some examples, the user may use the HMI to navigate to the indicated screen in order to transition modes, whereas in other examples such a screen may be presented to the user as a prompt to switch modes, as will be elaborated in greater detail below. In the options column 701, a first box 711 indicates the option of turning the DCAC system off, a second box 712 indicates the option of operating the system in the low power output mode, and a third box 713 indicates the option of operating the system in the high power output mode. The user may select one of the three via corresponding boxes 721, 722 and 723, respectively, included in each row.

It may be understood that the screenshot at FIG. 7A depicts one example of how a user may select between modes of operation of the DCAC converter. In some examples, such an HMI may be included as part of a dashboard of the vehicle, for example a screen that the user can interact with. For example, the screenshot at FIG. 7A may be part of a dropdown menu. In another example, the HMI may comprise a button or set of buttons included at the vehicle dash, but not associated with a screen. In other words, the button or set of buttons may be dedicated aspects of the vehicle dash. In examples where the mode selector is a dedicated aspect of the vehicle dash, in one example the mode selector may comprise a single button that enables rotation through the various modes. In another example, the mode selector may comprise a single button that, upon each depression of the button, signals a request to transition to a different mode of operation.

Such a mode selector may not just be included in the cabin of a vehicle. For example, such a mode selector may be additionally or alternatively included at a position external to a cabin of the vehicle. As one example, the mode selector may be included in one or more of a trunk, bed, underneath a hood, etc. In still other examples, the mode selector may be included as part of an application running on a personal computing device (e.g., smartphone, laptop, tablet, etc.).

Returning to step 512 at FIG. 5, if an operator-requested mode change has been received at the controller, method 500 proceeds to 515, where the mode transition may be conducted by the controller. For example, in response to the operator requesting a mode change from the low power output mode to the high power output mode, then the controller may command the transition to the high power output mode. In another example, in response to the operator requesting the mode change from the low power output mode to the off mode, then the controller may command the transition to the off mode from the low power output mode.

Proceeding to 518, method 500 includes indicating whether there is a vehicle system-requested mode change. It may be understood that such a vehicle system-requested mode change may be a mode change initiated by the controller, and not via the vehicle operator. As will be elaborated in greater detail below, a vehicle system-requested mode change may be initiated in response to an indication of degraded power output (e.g., a fault) from the DCAC converter, in some examples. In other examples, the vehicle system-requested mode change may be initiated in response to an auxiliary load being plugged into, for example, an outlet in a rear or bed of the vehicle, which as discussed above may comprise an outlet that is disabled in the low power mode, but is abled in the high power mode. Thus, in some examples the vehicle system-requested mode change may be initiated in response to a sensor (e.g., external electric power consumer sensor 394 at FIG. 3) detecting that an auxiliary load or external electric power consumer has been plugged in to the outlet.

More specifically, regarding a vehicle-system requested mode change from the low power output mode to the high power output mode, in a situation where an auxiliary load has been plugged in that demands the high power output mode but where the low power output mode is selected, the DCAC converter may continue to provide power for the auxiliary load, however the DCAC converter system may not enter into the high power mode without operator confirmation. In such an example, power generation may be limited because engine RPM may not rise, and power generation capability may be capped near the low power output threshold to prevent additional load on the engine. In such a case, any power deficit (e.g., difference between power generation and power output) may have to be met via the onboard energy storage device (e.g., energy storage device 150 at FIG. 1).

In some examples, the system-requested mode change from the low power output mode to the high power output mode may be initiated responsive to filtered power usage exceeding the low power output threshold for more than a calibrated amount of time while in the low power output mode. Furthermore, while not explicitly illustrated, if conditions change such that the high power output mode is no longer requested prior to the calibrated amount of time being exceeded, then the system-requested mode change may not be communicated to the vehicle operator. In other words, the request may be removed.

Responsive to a vehicle system-requested mode change being indicated at 518, method 500 proceeds to 521. At 521, method 500 includes indicating whether the vehicle system-requested mode change has been initiated due to an indication of degraded power output associated with the DCAC converter. If not, method 500 proceeds to 545, as will be discussed in greater detail below. Alternatively, in response to the vehicle system-requested mode change being initiated due to the indication of degraded power output, method 500 proceeds to 524. It may be understood that in response to an indication of degraded DCAC power output, the controller may automatically transition from the current mode the DCAC converter is operating in, to a degradation mode (e.g., fault mode) where the DCAC converter no longer converts any power. The degradation mode may include, for example, changing a status of the LED(s) (e.g., LEDs 326 at FIG. 3) associated with the DCAC converter. As one example, the LEDs may be changed from green (non-degraded power output) to red (degraded power output). As another example, the LEDs may be additionally or alternatively changed from a solid color to a flashing color (e.g., solid green to flashing red).

At 524, method 500 judges whether the issue that is resulting in degraded power output is resolvable or recoverable. Specifically, a non-recoverable degraded power output condition may include conditions that the vehicle operator may not resolve on their own, and instead the issue may be resolved via a service technician. Accordingly, there may not be an option for the vehicle operator to reset the system, however it may be understood that the DCAC converter system may attempt to recover at each vehicle activation event following a vehicle deactivation event.

Thus, in a case where the degraded power output is determined to be of a non-recoverable nature, method 500 proceeds to 527. At 527, method 500 includes displaying a message to the vehicle operator, for example via a screen (e.g., HMI) associated with the vehicle dash, indicating the non-recoverable nature of the degraded DCAC converter power output. Additionally or alternatively, the message may be sent to a personal computing device (e.g., smartphone, laptop, tablet, etc.) of the vehicle operator. The message may include a request to have the vehicle serviced, and may include a request to discontinue attempts to use any power that stems from the degraded DCAC converter until the issue has been mitigated.

Proceeding to 530, method 500 includes updating operating conditions. Updating operating conditions may include setting a flag at the controller indicative of the degraded power output associated with the DCAC converter. Method 500 may then end.

Returning to 524, responsive to the degraded power output issue being of a recoverable nature, method 500 proceeds to 533. At 533, method 500 includes displaying a message, for example at the screen associated with the vehicle dash and/or personal computing device, regarding how to resolve the issue. For example, the message may include that the DCAC converter has been disabled due to degraded power output, and may include one or more steps that the vehicle operator may take to mitigate the issue. As examples, degraded power output conditions that may be recoverable include power limit exceeded conditions, ground fault circuit interrupter (GFCI) faults, external system voltage detected conditions, DCAC converter overheating conditions, etc. As one example, the method of FIG. 13 discussed below may be used to infer a DCAC converter overheating condition. In other examples, degradation external to the DCAC converter which nevertheless affect the ability of the DCAC converter to generate/deliver power may comprise recoverable degraded power output conditions. Examples may include engine or hybrid system degradation, loss of communication with system modules and/or torque monitoring degradation conditions.

Thus, as discussed, the controller may communicate to the vehicle operator the one or more steps that may be taken to resolve the degraded power output condition. At 536, method 500 includes indicating whether the issue has been resolved. In a case where the vehicle operator either chooses not to undertake the steps, or where the steps taken do not remedy the degraded power output condition, method 500 proceeds to 527, where a message is communicated to the operator that the DCAC system is disabled. At 530, method 500 includes updating vehicle operating conditions. For example, updating vehicle operating conditions may include setting a flag at the controller indicating that the degraded power output condition was of a recoverable nature, yet the issue was not resolved. In examples where the suggested steps were taken but the issue remained unresolved, then a diagnostic trouble code (DTC) may be set, and a malfunction indicator light (MIL) may be illuminated at the vehicle dash, alerting the vehicle operator of a request to service the vehicle. Rather than a MIL, in some examples the request may comprise a message at the HMI, similar to that discussed above. It may be understood that at a subsequent vehicle-on event, the system may attempt to recover from the issue that is resulting in the degraded power output condition of the DCAC.

Returning to 536, responsive to the degraded power output condition being indicated to be resolved, method 500 proceeds to 539. At 539, method 500 includes transitioning modes based on operator input. For example, in the case of a recoverable fault, the operator may have the options of returning to the previous mode of operation (e.g., resetting the DCAC converter to the previous mode), or turning off the DCAC converter. Proceeding to 542, method 500 includes returning to step 512 of FIG. 5.

Returning now to step 521 of FIG. 5, in a case where a system-requested mode change was indicated, but where the system-requested mode change was not due to an indication of degraded power output associated with the DCAC converter, method 500 proceeds to 545. At 545, method 500 includes prompting the vehicle operator to transition modes based on the system-requested mode change. For example, in response to an auxiliary load being plugged into an outlet that is reserved for high power operation (e.g., outlet(s) in the bed), the controller may send a request via the screen (e.g., HMI) associated with the vehicle dash and/or other personal computing device to transition from the low power output mode to the high power output mode. In other examples where the DCAC converter is set at the high power output mode, and it is indicated that the high power output mode is no longer needed (e.g., auxiliary load has been disconnected from the rear bed outlet), then the message may include a request to transition from the high power output mode to the low power output mode.

Proceeding to 548, method 500 includes indicating whether the requested response has been received. For example, if the request comprised a request to transition from the low power output mode to the high power output mode, and the controller receives a command initiated via the vehicle operator to transition to the high power output mode, then method 500 proceeds to 560. As another example, if the request comprised a request to transition from the high power output mode to the low power output mode, and the controller receives a command initiated via the vehicle operator to transition to the low power output mode, then method 500 proceeds to 560, as will be discussed in further detail below.

Alternatively, if a response is not received within a predetermined threshold duration, method 500 proceeds to 551. At 551, method 500 includes continuing to operate the DCAC converter in the current mode of operation. For example, if the DCAC converter was operating in the low power output mode, then the DCAC converter may be maintained in the low power output mode. Alternatively, if the DCAC converter was operating in the high power output mode, then the DCAC converter may be maintained in the high power output mode. While not explicitly illustrated, in some examples where there is a request to transition to the low power output mode, but where the requested response is not received, the DCAC converter may be continued to operate in the high power output mode for a predetermined duration, and if conditions do not change (e.g., no indication of auxiliary loads being plugged in to high power outlets, for example in the bed of the vehicle) within a predetermined timeframe, then the system may automatically transition to the low power output mode. In such a case, a message may be communicated to the vehicle operator of the automatically enacted change. Furthermore, while not explicitly illustrated, in some examples where the DCAC converter was operating in the low power output mode and where the request is to transition to the high power output mode, if the response is not received within the predetermined threshold duration then the DCAC converter system operation may be discontinued, such that the DCAC converter no longer converts power.

In some examples, the predetermined threshold duration may be a function of onboard energy storage device size and power consumption over the low power output threshold. Additionally or alternatively, there may be a limit on battery state of charge (SOC). For example, if battery SOC drops below a predetermined threshold SOC, the DCAC system may fault.

Continuing to 554, method 500 includes returning to step 512 of method 500.

Returning to step 548, in response to the vehicle operator submitting a request to transition modes based on the system-requested mode change, method 500 proceeds to 560, as mentioned above. At 560, method 500 includes transitioning to the mode requested by the vehicle operator. Then, at 563, method 500 includes returning to step 512 of method 500. It may be understood that, in a case where the mode is transitioned to or maintained in the high power output mode of operation, other methods of the present disclosure may be relied upon for managing operation of the DCAC converter. For example, the other methods may include, but are not limited to the method of FIG. 6, the method of FIG. 8, the method of FIG. 10, the method of FIG. 15 and the method of FIGS. 20-21. The method of FIG. 6 and FIG. 13 may be used while the DCAC converter is being operated in either the high power output mode or the low power output mode.

While the method of FIG. 5 corresponds to vehicle operator requested mode transitions and/or vehicle system-requested mode transitions, in some examples it may be desirable to include methodology for requesting confirmation from a vehicle operator of a desire to continue usage of the DCAC converter system, based on a level of fuel stored in a fuel tank of the vehicle. Accordingly, turning now to FIG. 6, a high level example method 600 is shown for notifying a vehicle operator of a level of fuel in the fuel tank, and requesting confirmation as to whether to continue DCAC converter operation or to disable such operation. Method 600 will be described with reference to the systems described herein and shown in FIGS. 1-4C, though similar methods may be applied to other systems without departing from the scope of this disclosure. Method 600 may be carried out by a controller, such as controller 212 at FIG. 2, and may be stored at the controller as executable instructions in non-transitory memory. Instructions for carrying out method 600 and the rest of the methods included herein may be executed by the controller based on instructions stored on a memory of the controller and in conjunction with signals received from sensors of the vehicle system, such as the sensors described above with reference to FIGS. 1-4C. The controller may employ vehicle system actuators to alter states of devices in the physical world according to the methods depicted below.

Method 600 begins at 605, and includes evaluating current vehicle operating conditions. Operating conditions may be estimated, measured, and/or inferred, and may include one or more vehicle conditions, such as vehicle speed, vehicle location, etc., various engine conditions, such as engine status, engine load, engine speed, A/F ratio, manifold air pressure, etc., various fuel system conditions, such as fuel level, fuel type, fuel temperature, etc., various evaporative emissions system conditions, such as fuel vapor canister load, fuel tank pressure, etc., various electric machine-related conditions, such as battery state of charge (SOC), battery temperature, electric machine temperature, etc., as well as various ambient conditions, such as ambient temperature, humidity, barometric pressure, etc.

Proceeding to 610, method 600 includes indicating if fuel level in the fuel tank is below a first threshold. If not, method 600 proceeds to 615. At 615, method 600 includes maintaining current operating conditions. For example, if any one of the methods discussed herein are currently being used to manage power supply to auxiliary loads, then such methodology may continue. If the vehicle is off, then the vehicle may be maintained off. Method 600 may then end.

Alternatively, if at 610 fuel level in the fuel tank is indicated to be below the first threshold, method 600 proceeds to 620. The first threshold fuel level may be associated with a calibrated "distance to empty" metric. For example, a distance to empty may be a function of fuel level and how much power is being consumed via the DCAC converter system operating to power auxiliary loads. The first threshold fuel level may be a fuel level that is less than 50% of a capacity of the fuel tank, 25% of the capacity of the fuel tank, 20% of the capacity of the fuel tank, etc.

At 620, method 600 includes notifying the vehicle operator of the current fuel level, and providing a confirmation request to continue operating the DCAC converter system, provided that the DCAC converter system is currently in operation. The notifying may be via the screen (e.g., HMI) associated with the vehicle dash in one example. Additionally or alternatively the notifying may be via a personal computing device of the vehicle operator. Additionally or alternatively, the notifying may be an audible message that in turn directs the vehicle operator to the screen at the dash. The screen and/or personal computing device may include a prompt that enables the vehicle operator to select whether to continue current operational status of the DCAC converter. For example, if the DCAC converter system is operating in the high power output mode, then the prompt may include an option to remain in the high power output mode, to drop to the low power output mode, or to discontinue operation of the DCAC converter system. Similar logic applies to a situation where the DCAC converter system is operating in the low power output mode. For example, the prompt may include options to remain in the low power output mode, or discontinue usage of the DCAC converter system.

Proceeding to 625, method 600 judges whether confirmation has been received within a first predetermined duration. The first predetermined duration may be a function of the first threshold fuel level. It may be understood that confirmation comprises the operator selecting one of the prompted options at the screen or personal computing device. If confirmation is not received within the first threshold duration, method 600 proceeds to 630. At 630, method 600 includes disabling DCAC converter system operation. Specifically, the DCAC converter system may be commanded to discontinue providing power to auxiliary loads. Continuing to 635, method 600 includes updating current vehicle operating conditions. Updating current vehicle operating conditions may include setting a flag at the controller indicating that the DCAC converter system operation was discontinued due to fuel level dropping below the first threshold and responsive to a lack of confirmation provided by the vehicle operator of a desired to maintain DCAC converter system operation. Method 600 may then end.

Returning to 625, responsive to confirmation being received in the affirmative at 625, method 600 proceeds to 640. At 640, method 600 includes continuing current DCAC converter system operational status. Specifically, if the vehicle operator has confirmed continued usage of the DCAC converter system at the high power output mode, then the high power output mode of operation may be continued. If the vehicle operator has confirmed continued usage of the DCAC converter system at the low power output mode, then the low power output mode of operation may be continued. While not explicitly illustrated, it may be understood that if the confirmation by the vehicle operator includes a request to discontinue operation, then operation of the DCAC converter system may be discontinued, and method 600 may end.

Continuing to 645, method 600 includes judging whether fuel level in the fuel tank has dropped to below a second threshold fuel level, the second threshold fuel level lower than the first threshold fuel level by a determined amount. Similar to that discussed above, the second threshold fuel level may be associated with a calibrated "distance to empty" metric. If not, method 600 returns to 640 where current operating conditions related to the DCAC converter system are maintained. Alternatively, responsive to fuel level being below the second threshold fuel level, method 600 proceeds to 650. At 650, method 600 includes notifying the operator of the fuel level being below the second threshold, and further includes requesting confirmation to continue DCAC converter system operation. The notifying may be substantially similar to that discussed above at step 620, and may include providing options that the vehicle operator may select from based on the fuel level having dropped below the second threshold. For example, the vehicle operator may wish to discontinue operation of the DCAC converter system in order to conserve fuel, however in other examples the vehicle operator may wish to continue operation of the DCAC converter system even though fuel level has dropped below the second threshold fuel level.

Accordingly, proceeding to 655, method 600 includes indicating whether confirmation has been provided within a second threshold duration. The second threshold duration may be a function of the second threshold fuel level, and the second threshold duration may be less than the first threshold duration discussed above at step 625. Similar to that discussed above at 625, confirmation may comprise the vehicle operator submitting a request to maintain operating the DCAC converter system at the high power output mode, the low power output mode, or may include the vehicle operator submitting a request to discontinue DCAC converter system output. While not explicitly illustrated at FIG. 6, it may be understood that responsive to a request to discontinue operation of the DCAC converter system, the DCAC converter system operation may be discontinued and method 600 may end. On the other hand, responsive to an absence of confirmation being received within the second threshold duration, method 600 proceeds to 630. At 630, method 600 includes disabling DCAC converter operation as discussed above, and at 635 method 600 includes updating current operating conditions. Similar to that discussed above, updating operating conditions at 635 may include setting a flag at the controller indicating that the DCAC converter system operation was discontinued due to fuel level dropping below the second threshold and responsive to a lack of confirmation provided by the vehicle operator of a desired to maintain DCAC converter system operation. Method 600 may then end.

Responsive to confirmation being received at 655, requesting continued usage of the DCAC converter system, method 600 proceeds to 660. At 660, method 600 includes continuing current DCAC converter system, and further includes sending additional notifications at "N" fuel level thresholds below the second fuel level threshold. In other words, it may be understood that the vehicle operator may continue to be prompted in the same manner discussed above with regard to FIG. 6, as fuel level continues dropping below N fuel level thresholds. As each threshold fuel level is passed, the vehicle operator may have the option of continuing to rely on reserve fuel to operate the DCAC converter system, or to discontinue DCAC converter system operation as discussed above. In this way, the vehicle operator may be regularly updated as to current fuel level in the fuel tank, and how the current fuel level relates to the distance to empty (DTE) metric, so that the vehicle operator may make an informed decision as to whether to continue using reserve fuel for operation of the DCAC converter system, or to discontinue usage of the DCAC converter system.

While method 600 discussed above may provide vehicle operators with an indication of low fuel levels, such that they may make an informed decision as to whether continued usage of the DCAC converter system is desirable based on their current situation, additionally or alternatively the vehicle may present current power consumption and current amount of power available at the screen associated with the vehicle dashboard and/or on a personal computing device, etc. Turning to FIG. 7B, a screenshot 750 of a screen that displays power consumption (e.g., watts used) 751 and power available (e.g., watts available) 752 is depicted. Power consumption 751 may be displayed after a moving average filter, to remove any spikes in the power consumption data.

Determining power available 752 may be a minimum of the following: power conversion capability of the DCAC converter system, a function of thermal derated capability, a function of generation capability minus system loss, a predefined mode limit (e.g., low power mode roughly 400 watts), a function of battery de-rate capability, etc.

As discussed herein, a vehicle may include an electrical power outlet to provide electrical power to electrically operated devices that are external to the vehicle or that are not integrated into the vehicle. The power may be provided via an integrated starter/generator, a belt integrated starter generator, or another electric machine that is incorporated into the vehicle. The electrical power outlet may have sufficient capacity to operate entertainment devices, hand tools, lights, pumps, and other electrically operated devices. The electric power outlet may supply electric power to external devices when the vehicle is moving or when the vehicle is stationary. If the vehicle is supplying power to an external device when the vehicle is stationary, electrical power delivered to the external device may be interrupted if vehicle driver (e.g., human or autonomous) drives away while the external device is connected to the vehicle electrical power outlet. Consequently, operation of the external device may be interrupted, which may cause users of the external electrically operated device to become frustrated. Therefore, it may be desirable to reduce the possibility of interrupting power delivery to an external electrical power consumer.

Accordingly, the system of FIGS. 1-3 provides for a vehicle system, comprising an engine, a transmission coupled to the engine, an electrical power source, and an electrical output receptacle coupled to the electrical power source. Such a system may include a controller with executable instructions stored in non-transitory memory to inhibit shifting of gears of the transmission in response to an external electrical power consumer being coupled to the electrical output receptacle. The vehicle system may further comprise additional instructions to override the inhibiting of shifting the gears of the transmission. In some examples, the vehicle system may further comprise additional instructions to cancel the overriding of the inhibiting of shifting the gears of the transmission in response to deactivating a vehicle. In some examples of the vehicle system, inhibiting shifting of the gears of the transmission may include preventing movement of a shifter. In some examples, preventing movement of the shifter may include activating a solenoid to prevent motion of the shifter.

Referring now to FIG. 8, a method for operating a vehicle is shown. At least portions of method 800 may be implemented as executable controller instructions stored in non-transitory memory. Method 800 may operate in cooperation with the system of FIGS. 1-3. Additionally, portions of method 800 may be actions taken in the physical world to transform an operating state of an actuator or device. The method of FIG. 8 may be incorporated into the system of FIGS. 1-3 as executable instructions stored in non-transitory memory.

At 802, method 800 judges whether or not an external electrical power consumer is electrically coupled to the vehicle. In one example, method 800 may judge that an external electrical power consumer is electrically coupled to the vehicle when current is measured exiting the vehicle's electric power receptacle via a current sensor. In another example, the presence or absence of a power cord may be sensed via a switch input. If method 800 judges that an external electrical power consumer is electrically coupled to the vehicle, the answer is yes and method 800 proceeds to 804. Otherwise, the answer is no and method 800 may proceed to 850.

At 850, method 800 deactivates the shifter lockout and permits transmission gear shifting. In examples where the vehicle may enter a forward or reverse propulsion mode to rotate the vehicle's wheels without shifting gears, method 800 allows the propulsion source (e.g., engine and/or electric machine) to deliver torque to the vehicle's wheels. Further, method 800 permits the propulsion source to deliver driver demanded torque to vehicle wheels. Method 800 proceeds to exit.

At 804, method 800 locks out the transmission shifter and prevents transmission shifting. In one example, the transmission shifter lever may be held in a park position or a neutral position via a solenoid to prevent engagement of forward or reverse gears. Thus, the vehicle may be held in park or neutral and not allowed to shift into reverse or drive, thereby inhibiting motion of the vehicle's wheels in a reverse or forward direction. In examples where the transmission does not include gears (e.g., a planetary gear set or a continuously variable transmission), method 800 prevents torque from propulsion sources from reaching the vehicle's wheels. In one example, method 800 may prevent electrical current flow to an electric machine via an inverter. In another example, method 800 may hold a driveline disconnect in a fully open state to prevent engine torque from reaching the vehicle's wheels. In another example, method 800 controls output of a gearbox such that propulsion torque may not exit the gearbox. Thus, method 800 may be implemented in a variety of ways and in a variety of driveline configurations that are not shown herein without extending beyond the scope of the disclosure. Method 800 proceeds to 806 after locking out the shifter and/or preventing torque from propulsion sources reaching the vehicle's wheels.

At 806, method 800 supplies electrical power to an external electrical power consumer via the vehicle's electrical output receptacle. In one example, the electrical power may be provided via an inverter. In other examples, the electrical output may be provided via electrically coupling output of an alternator or generator on board the vehicle to the electrical output receptacle. Method 800 proceeds to 808.

At 808, method 800 judges whether or not a brake pedal is applied. In some examples, the brake pedal must be applied for the vehicle to be shifted into a mode where torque is delivered to the vehicle's wheels. For example, the brake pedal must be applied before the transmission shifter may be moved from a park or neutral state to a reverse or drive state. Thus, the brake pedal may signal intent of the driver to move the vehicle. If method 800 judges that the brake pedal is applied or if another indication of a driver's intent to move the vehicle is asserted, then the answer is yes and method 800 proceeds to 810. Otherwise, the answer is no and method 800 returns to 802.

At 810, method 800 displays an indication that the vehicle is locked out of shifting transmission gears and/or delivering propulsion source power to vehicle wheels. In one example, method 800 may display a message to a human/machine interface. In other examples, method 800 may deliver a message to an autonomous driver. The indication may state that an external electrical power consumer is electrically coupled to the vehicle and that vehicle movement is locked out or prevented, but the lockout may be overridden. Method 800 proceeds to 812.

At 812, method 800 judges whether or not a human driver or an autonomous driver has provided input to override the prevention or lockout of propulsion source torque delivery to the vehicle's wheels. In one example, a human driver may request overriding of the lockout via input to the human/machine interface. An autonomous driver may send a control signal to the vehicle controller to request overriding of the lockout mode. If method 800 judges that overriding of the lockout mode has been requested, the answer is yes and method 800 proceeds to 814. In some examples, method 800 may require that the human driver or the autonomous driver request the override of the lockout within a predetermined or threshold amount of time since the most recent time that the brake pedal was first applied without being released to proceed to 814, otherwise the answer is no and method 800 returns to 802. However, if the vehicle is deactivated (e.g., a human driver commands the vehicle off such that power may not be delivered to the vehicle's wheels via a propulsion source and the propulsion sources may also be deactivated via ceasing to supply energy to the propulsion sources), then method 800 may not permit the override condition to continue so that if an external electrical power consumer is coupled to the vehicle and the vehicle is reactivated, prevention of vehicle movement may no longer be overriding until the driver overrides the prevention of vehicle movement via the override input.

At 814, method 800 deactivates the transmission shifter lockout and allows transmission shifting. The transmission shifter lever may be released and allowed to exit the park position or the neutral position via releasing the solenoid. In examples where the transmission does not include gears (e.g., a planetary gear set or a continuously variable transmission), method 800 allows torque from propulsion sources to reach the vehicle's wheels. In one example, method 800 may allow electrical current flow to an electric machine via an inverter. In another example, method 800 may close a driveline disconnect to allow engine torque to reach the vehicle's wheels. Method 800 proceeds to 816 after unlocking the shifter lockout and/or allowing torque from propulsion sources to reach the vehicle's wheels.

At 816, method 800 method 800 judges whether the shifter has moved from park or neutral to a forward or reverse gear in less than a threshold amount of time since the most recent time that the brake pedal was applied. If so, the answer is yes and method 800 proceeds to 818. Otherwise, the answer is no and method 800 returns to 802. Method 800 may determine the position of the shifter via a shifter position sensor. Alternatively, method 800 may determine if a shift selector has changed operating state from indicating park or neutral to indicating drive or neutral within a threshold amount of time since most recently applying the brake pedal. If so, method 800 proceeds to 818. Otherwise, method 800 returns to 802. The shift selector may be incorporated into the human/machine interface or it may be a shift by wire unit that does not require movement of a shift lever. In still another example, method 800 may judge if the vehicle has exited a stationary mode (e.g., park or neutral) and has entered a propulsion mode (e.g., reverse or drive) within a threshold amount of time since the most recent brake pedal application. If so, method 800 proceeds to 818. Otherwise, method 800 returns to 802.

At 818, method 800 judges if the shifter has returned to park or neutral after being shifted to reverse or a forward gear (e.g., drive) before the vehicle has traveled longer than a threshold distance. If so, the answer is yes and method 800 returns to 802. Otherwise, the answer is no and method 800 proceeds to 820. Alternatively, method 800 may judge if the vehicle has exited a forward or reverse propulsion mode and returned to park or neutral before the vehicle has driven a threshold distance since the most recent time the vehicle entered the forward or reverse propulsion mode. If so, the answer is yes and method 800 returns to 802. Otherwise, the answer is no and method 800 proceeds to 820.

At 820, method 800 allows the shifter to move while delivering electrical power to the external electrical power consumer unless the vehicle is deactivated (e.g., the propulsion sources are not supplied with energy). If the vehicle does not include a shifter and propulsion modes are changed via a human/machine interface, method 800 allows torque from the propulsion sources to the vehicle's wheels while delivering electrical power to the external electrical power consumer unless the vehicle is deactivated. Method 800 proceeds to exit.

In this way, power from propulsion sources may be inhibited or prevented from reaching vehicle wheels when an external electric power consumer is electrically coupled to the vehicle. However, a human or autonomous driver may override inhibiting propulsion torque from reaching vehicle wheels via a specific acknowledgement.

Thus, the method of FIG. 8 provides for a vehicle operating method, comprising: preventing forward or reverse motion of vehicle wheels in response to an external electrical power consumer being coupled to a vehicle via an electric receptacle of the vehicle. The method includes where preventing forward or reverse motion of the vehicle wheels includes preventing a transmission of the vehicle from engaging a forward or a reverse gear. The method includes where preventing forward or reverse motion of the vehicle wheels includes preventing torque delivery to vehicle wheels via an electric machine. The method includes where preventing forward or reverse motion of the vehicle wheels includes preventing torque delivery to vehicle wheels via an engine. The method includes where preventing forward or reverse motion of the vehicle wheels includes preventing a change in state of a shifter. The method includes where preventing the change in state of the shifter includes preventing changing of a position of the shifter. The method includes where preventing the change in state of the shifter includes preventing changing of a position indicator of the shifter.

The method of FIG. 8 also provides for a vehicle operating method, comprising: preventing forward or reverse motion of vehicle wheels in response to an external electrical power consumer being electrically coupled to a vehicle via an electric receptacle of the vehicle; and overriding the preventing of forward or reverse motion of the vehicle wheels to allow motion of the vehicle wheels in response to receiving input to an override input. The method includes where the override input is a human/machine interface. The method further comprises displaying an indication that the forward or reverse motion of the vehicle wheels is prevented in response to applying a brake pedal. The method includes where the overriding of the preventing of forward or reverse motion of the vehicle wheels is performed in a predetermined amount of time since a most recent application of a brake pedal or else the overriding is not permitted. The method further comprises reactivating the preventing of the forward or reverse motion of the vehicle wheels after overriding the preventing of the forward or reverse motion of the vehicle wheels in response to a shifter state not changing in a threshold amount of time. The method further comprises permitting shifting of gears of a transmission while delivering electric power to the external electric power consumer in response to overriding the preventing of forward and reverse motion of the vehicle wheels. The method further comprises cancelling the overriding in response to deactivating the vehicle. The method includes where preventing forward or reverse motion of the vehicle wheels is accomplished via restricting motion of a shifter.

In another representation, the method of FIG. 8 provides for a vehicle operating method, comprising: preventing movement of a shifter lever in response to an external electrical power consumer being coupled to a vehicle via an electric receptacle of the vehicle. The method includes where the shifter level is prevented from moving via a solenoid. The method further comprises deactivating the prevention of movement of the shifter lever in response to input to a human/machine interface.

Referring now to FIG. 9, a vehicle operating sequence 900 according to the method of FIG. 8 is shown. The vehicle operating sequence of FIG. 9 may be provided via the system of FIGS. 1-3 in cooperation with the method of FIG. 8. The plots shown in FIG. 9 are time aligned and occur at the same time. The dashed vertical lines represent times of interest during the sequence.

The first plot from the top of FIG. 9 is a plot of a state indicating whether or not an external electric power consumer is electrically coupled to a vehicle via an electric output receptacle of the vehicle versus time. The vertical axis represents the state of the external electric power consumer electrical coupling to the vehicle. The external electric power consumer is electrically coupled to the vehicle when trace 902 is at a higher level near the vertical axis arrow. The external electric power consumer is not electrically coupled to the vehicle when trace 902 is at a lower level near the horizontal axis. Trace 902 represents the state of the external electric power consumer electric coupling to the vehicle.

The second plot from the top of FIG. 9 is a plot of a gear shifter locking mechanism state versus time. The vertical axis represents the gear shifter locking mechanism state. The gear shifter locking mechanism prevents shifter movement when trace 904 is at a higher level near the vertical axis arrow. The gear shifter locking mechanism allows shifter movement when trace 904 is at a lower level near the horizontal axis. Trace 904 represents the gear shifter locking mechanism state.

The third plot from the top of FIG. 9 is a plot of a brake pedal state versus time. The vertical axis represents the brake pedal state. The brake pedal is applied (e.g., depressed) when trace 906 is at a higher level near the vertical axis arrow. The brake pedal is not applied when trace 906 is at a lower level near the horizontal axis. Trace 906 represents the brake pedal operating state.

The fourth plot from the top of FIG. 9 is a plot of state of an indicator for an external electric power consumer being coupled to the vehicle versus time. The vertical axis represents the state of the indicator for the external power consumer being coupled to the vehicle. An indicator, such as a human/machine interface, is indicating that an external electric power consumer is electrically coupled to the vehicle when trace 808 is at a higher level near the vertical axis arrow. The indicator is not indicating that an external electric power consumer is electrically coupled to the vehicle when trace 908 is at a lower level near the horizontal axis. Trace 908 represents the indicator operating state.

The fifth plot from the top of FIG. 9 is a plot of a state of an external electric power consumer shift override versus time. The vertical axis represents the state of an external electric power consumer shift override. The external electric power consumer shift override is activated (e.g., forward and reverse wheel rotation is prevented) when trace 910 is at a higher level near the vertical axis arrow. The external electric power consumer shift override is not activated when trace 910 is at a lower level near the horizontal axis. Trace 910 represents the external electric power consumer shift override is activated.

The sixth plot from the top of FIG. 9 is a plot of a transmission shifter state versus time. The vertical axis represents the transistor shifter state. The transmission shifter is engaged in reverse or a forward gear when trace 912 is at a higher level near the vertical axis arrow. The transmission shifter is engaged in park or neutral when trace 912 is at a lower level near the horizontal axis. Trace 912 represents the transmission shifter state.

At time t0, an external electrical power consumer is not electrically coupled to the vehicle and the gear shifter locking mechanism (e.g., 391 of FIG. 2) is not engaged to prevent changes in the gear shifter operating state. The vehicle brake pedal is not applied and the indicator for the external electric power consumer is not indicating that the external electric power consumer is electrically coupled to the vehicle. The external electric power consumer shift override is not activated and the transmission shifter is engaged in park.

At time t1, an external electric power consumer is electrically coupled to the vehicle via the electrical output receptacle as indicated by the state of the external power consumer coupled to the vehicle. The controller engages the shift lock as indicated by the gear shifter locking mechanism state changing from a lower level to a higher level. The vehicle brake pedal is not applied and the indicator for the external electric power consumer is not indicating that the external electric power consumer is electrically coupled to the vehicle. The external electric power consumer shift override is not activated and the transmission shifter is engaged in park. Forward and reverse wheel motion is prevented by having the gear shifter locking mechanism engaged between time t1 and time t2.

At time t2, the vehicle's driver (human or autonomous) engages the vehicle brake. The controller then provides an indication that an external electrical power consumer is electrically coupled to the vehicle as indicated by the indicator for the external electric power consumer indicating that the external electric power consumer is electrically coupled to the vehicle. The gear shifter locking mechanism remains engaged to prevent forward and reverse wheel motion. The transmission shifter remains in park and the external electrical power consumer shift override is not activated.

At time t3, the external electrical power consumer shift override is activated via the vehicle's driver (not shown). The external electrical power consumer remains electrically coupled to the vehicle and the gear shifter locking mechanism is disengaged in response to the external electrical power consumer shift override being activated. This allows the driver to shift into a forward or reverse gear, which allows the vehicle wheels to rotate in a forward or reverse direction. The brake pedal is still applied and the indicator for the external electrical power consumer continues to indicate that the external electrical power consumer is electrically coupled to the vehicle. The transmission shifter remains engaged in park.

At time t4, the vehicle's driver changes the state of the shifter from park into drive as indicated by the transmission shifter state changing from a lower level to a higher level. The external electrical power consumer remains electrically coupled to the vehicle and the gear shifter locking mechanism remains disengaged in response to the external electrical power consumer shift override being activated. The brake pedal is still applied and the indicator for the external electrical power consumer continues to indicate that the external electrical power consumer is electrically coupled to the vehicle.

In this way, vehicle wheels may be prevented from moving in forward or reverse directions via locking out a transmission shifter. However, if a human or autonomous driver overrides the lockout, then the wheels may rotate in a reverse or forward direction. This may reduce the possibility of unintended disruptions of electrical power to external electric power consumers.

The description above with regard to FIGS. 8-9 may provide several advantages. Specifically, the approach may reduce a possibility of unintended electric power flow disruptions to external electric power consumers. The approach may also be overridden to provide system flexibility when it may be desired to operate the external electric power consumer while the vehicle to which it is electrically coupled is traveling. In addition, the approach is flexible and may be applied to a variety of driveline configurations.

As discussed above, passenger vehicles, light trucks, and heavy duty trucks may in some examples include an ability to support 110V-120V alternating current (AC) and 220V-240V AC electrical loads. For example, such vehicles may support electrical loads (power take-off device) varying from 450 Watts or less up to 2 KW-8 KW and potentially higher (e.g. 16 KW and greater). Various approaches are provided for operating a device (electric load) using power generated from engine operation. As one example, an idle-stop may be delayed until completion of an operation being performed by a power take-off device (e.g., chair lifting mechanism). However, the inventors herein have recognized potential issues with such approaches. As one example, multiple operations of a power take-off (PTO) device may take place successively and by idle-stopping the engine after completion of the first operation of the PTO, subsequent operations of the PTO may be disrupted. Further, the PTO operation may be optional for the operator and he may not desire operation of the PTO device when conditions are met for idle stop. Also, indefinite delaying of engine idle-stopping for PTO operation may not be desired by the operator.

Accordingly, discussed herein a system for a vehicle may comprise a controller with computer readable instructions stored on non-transitory memory to, during operation of an on-board generator to power one or more loads external to the vehicle, after a threshold duration of engine idling with the vehicle being stationary, seek a user response via a human machine interface (HMI). In response to the user overriding an engine idle-stop, the controller may maintain engine operation. In response to the user not overriding the engine idle-stop, the controller may suspend fueling and spark to engine cylinders to shut down engine. In such a system, additionally or optionally, the one or more loads may be supplied power from an engine via the generator and a power box, wherein the generator generates alternating current (AC) power from engine torque, and wherein power box includes one or more outlets for supplying electricity to the one or more loads. In any or all of the preceding examples, additionally or optionally, the HMI is one or more of a vehicle instrument panel coupled inside a vehicle cabin, a display of a smart device, and a monitor of a computer.

Turning to FIG. 10 depicted is an example method 1000 for adjusting an operation of each of the engine system of a vehicle in response to engine idling conditions being met and operation of a generator. Instructions for carrying out method 1000 and the rest of the methods included herein may be executed by a controller based on instructions stored on a memory of the controller and in conjunction with signals received from sensors of the engine system, such as the sensors described above with reference to FIGS. 1-3. The controller may employ engine actuators of the engine system to adjust engine operation, according to the methods described below.

At 1002, current vehicle and engine operating conditions may be estimated and/or measured. These may include, for example, operator torque demand, engine speed, vehicle speed, engine temperature, engine load, ambient conditions (such as ambient humidity, temperature, and barometric pressure), exhaust temperature, manifold pressure, manifold air flow, battery state of charge, etc. Also, operation of an on-board generation (such as generator 160 in FIG. 1) may be estimated.

At 1004, the routine includes determining if engine idle-stop conditions are met. In one example, conditions for engine idle-stop may include engine idling for a longer than threshold duration. Engine idling may take place while the vehicle is at a traffic stop when the engine load is below a threshold (such as when the vehicle is stationary). Engine operation at the idling speed for a longer than threshold duration may result in increased fuel usage and increased level of exhaust emissions. The threshold duration may be based on fuel level in the fuel tank. As an example, if the fuel level in the fuel tank is lower than a threshold level, the threshold duration may be decreased such that additional fuel may not be consumed for engine idling. In another example, conditions for engine idle-stop may include vehicle operation at a lower than threshold vehicle speed with brake being applied. Idle-stop during conditions when the vehicle speed is non-zero may be referred to as rolling idle-stop, such as when the vehicle is coasting with the operator foot off the pedal.

Engine idle-stop conditions may further include a greater than threshold battery state of charge (SOC). The controller may check battery SOC against a preset minimum threshold and if it is determined that the battery SOC is at least more that 30% charged, automatic engine stop may be enabled. The status of an air conditioner may be checked and before initiating an engine idle-stop, it may be verified that the air conditioner did not issue a request for restarting the engine, as may be requested if air conditioning is desired. In one example, air conditioning may be desired if a temperature in the vehicle cabin increases above a desired temperature as indicated by the operator. In another example, the operator may initiate operation of the air conditioner by sending a command to the controller via a dashboard switch. The intake air temperature may be estimated and/or measured to determine if it is within a selected temperature range. In one example, the intake temperature may be estimated via a temperature sensor located in the intake manifold and an engine idle-stop may be initiated when the intake air temperature is above a threshold temperature. Also, the engine temperature may be estimated and/or measured to determine if it is within a selected temperature range. In one example, the engine temperature may be inferred from an engine coolant temperature and an engine idle-stop may be initiated when the engine coolant temperature is above a threshold engine temperature. The driver requested torque may be estimated and confirmation of an engine idle-stop may be initiated in response to a lower than threshold driver requested torque. Further, an emission control device coupled to the exhaust manifold of engine may be analyzed to determine that no request for engine restart was made.

If it is determined that engine idle-stop conditions are not met, at 1006, current engine operations may be continued without initiating the engine start-stop operation, such as the engine may be maintained running with cylinders combusting fuel. If it is determined that engine idle-stop conditions are met, at 1008, the routine includes determining if the generator is operated to power a power take off (PTO) device such as a cement mixer, a trash compactor, a harvester, a snow plough, a mobility device, etc. The PTO device may be coupled to a power box which may receive power from the generator. The generator may be operated to covert engine torque to electrical energy that is supplied to the power box. The power box may include one or more alternating current (AC) and/or direct current (DC) power outlets for performing tasks including but not limited to powering PTO device such as a cement mixer, a trash compactor, a harvester, a snow ploughs. The power box may be used for powering power tools at work sites, powering lighting, powering outdoor speakers, powering water pumps, supplying power in situations including emergency power outage, powering tailgating activities, powering RV camping activities, etc. Therefore, by operating the generator, engine power may be used to operate external electrical loads via the power box. When the generator is operated to power auxiliary electrical loads, the vehicle operator may select a mode of operation via the vehicle instrument panel termed "power to the box" or PttB mode. In the PttB mode, power from the generator may be utilized to operate off-board electrical load (s).

If it is determined that the generator is not operated to power an off-board load, it may be inferred that the vehicle is not currently being operated in the PttB mode and engine power is not desired for powering the power box. At 1010, in response to the engine idle-stop conditions being met and the generator not being operated to power an off-board load, combustion may be suspended to shut-down the engine. In order to suspend combustion, fueling to the engine cylinders may be suspended. The controller may send a signal to one or more fuel injectors coupled to the engine cylinders to stop fuel injection to each of the cylinders. Also, the controller may send a signal to the spark plug coupled to each cylinder to disable spark. In addition, cylinder valve operation may be suspended. Once the combustion is suspended, the engine may spin-down and the engine speed may gradually decrease to zero.

If it is determined that even though the engine idle-stop conditions are met, the generator is being operated to power an off-board load, at 1012, the routine may seek user input regarding engine shut-down via a human machine interface (HMI). In one example, a HMI such as a touch screen may be housed in the vehicle dashboard (such as the instrument panel 196 in FIG. 1) and the HMI may display a message for the vehicle operator (user). In another example, the HMI may be a smart device (smart phone, tablet, etc.) display, a computer monitor, wherein the smart device/computer is communicatively coupled to the engine controller. The user may be outside the vehicle (have left the vehicle upon stopping the vehicle) and may receive the message on the smart phone screen. In the message, the user may be requested to indicate if the engine is to be stopped (since idle-stop conditions are met) or should the engine be continued to be operated (deactivate engine idle-stop). If (based on user input) the engine is stopped, the generator may no longer provide electrical energy to the power box and powering of the off-board load may have to be suspended. If (based on user input) the engine is continued to be operated (even when idle-stop conditions are met), the power box may be continued to be powered by generator operation and an off-board load may be continued to be supported. The user may also be asked to indicate if the user wants to deactivate engine idle-stop for a specific duration. The user may respond by selecting an option from the touchscreen.

Turning briefly to FIG. 11, it shows a screenshot 1100 of an example screen of a human machine interface displaying the options for engine idle-stop scheduling to a user (such as the vehicle operator). Three options for scheduling the engine idle-stop are shown in rows 1104, 1106, and 1108, respectively. These options are presented to the user when conditions for initiation of engine idle-stop are met while the generator is operated to power an off-board load via a power box. In the options column 1101, a first box 1111 indicates the option of initiating idle-stop right away, a second box 1112 indicates the option of deactivating idle-stop until the vehicle is in motion and operation of the generator is discontinued, and a third box 1113 indicates the option of deactivating idle-stop for a specified duration regardless of generator operation beyond the specified duration. The driver may select one of the three via corresponding boxes 1121, 1122, 1123, respectively, included in each row. If the user selects the third option (box 1113), the user may indicate the duration of time for which the idle-stop may be deactivated via an input to box 1114. In this example, a duration of two hours is indicated.

Returning to FIG. 10, at 1014, the user's input regarding engine shut-down when conditions for initiation of engine idle-stop are met while the generator is operated to power an off-board load is received via the HMI. At 1016, the routine includes determining if engine idle-stop has been deactivated. The user may select to deactivate engine idle-stop such that even when conditions are met for engine idle-stop, the engine is continued to be operated and the engine power, converted to electrical energy via the generator, is used to power an off-board load via the power box.

If it is determined that the user has not indicated to deactivate engine idle-stop, it may be inferred that the user does not want to continue operating the engine for powering the off-board load. As an example, the off-board load may be a crop harvester which is operated only when the vehicle is moving. At 1018, the generator operation may be discontinued and the engine may be shut-down by disabling fueling and spark to the engine cylinders.

If it is determined that the user has indicated to deactivate engine idle-stop, it may be inferred that the user wants to continue operating the engine for powering the off-board load. At 1020, the routine includes determining if a duration of time has been indicated for deactivating engine idle stop. As an example, the off-board load may include a cement mixer which may be desired to be operated for a fixed time duration, regardless of vehicle motion, for optimal cement mixing. The user may indicate the duration for which the idle-stop deactivation is to be maintained (engine and generator to be operated). If it is determined that a duration for engine idle-stop deactivation has not been indicated, it may be inferred that the user wants to continue operating the engine for powering the off-board load via the power box. As an example, an off-board load may include a garbage compactor which may be desired to be operated when the vehicle is stationary and/or moving. Further, if at 1014, a user input is not received while the generator is operated to power an external load (such as if the user is away from the vehicle and does not have access to the HMI), it may be inferred that the generator operation may be continued to be desired and the routine may proceed to step 1024.

At 1024, engine idle-stop may be deactivated until generator operation is suspended and the vehicle is in motion. The engine may be operated to generate power which may be converted by the generator for supply to the power box. When the generator operation is suspended and the vehicle is moved from its current position, it may be inferred that an off-board load at the current position may no longer desire to be powered and engine idle-stop deactivation may be nullified. In one example, the user may be notified via a message in the HMI that the engine idle-stop deactivation has been nullified and if during the drive cycle, engine idle-stop conditions are again met and the transmission gear position is shifted to park, regardless of the current engine idle-stop deactivation, a new user input may be sought.

In one example, the vehicle may be at a worksite and the generator may be used to power a device and upon completion of the work, the generator may be deactivated and the vehicle may be moved. As an example, the engine idle-stop deactivation may be nullified in response to the vehicle travelling a threshold distance (from the origin where engine idle stop was deactivated) as determined from a global positioning system (GPS) location of the vehicle (via an on-board navigation system) and/or completion of a threshold duration of drive (from the origin).

If at 1020, it is determined that a duration of time has been indicated for deactivating engine idle stop, at 1022, engine idle-stop may be deactivated for the specified duration. In one example, the duration may be 5 minutes. In another example, the duration may be 1 hour. The duration may be calculated from the time of indication (by the user) on the HMI. At the end of the specified duration, if the engine idle-stop conditions are still met, the generator may be deactivated and the engine may be shut-down.

Once the engine is shut-down, at step 1010 or at step 1022, the routine proceeds to step 1026. At 1026, the routine includes determining if engine restart conditions are met. In one example, engine idle-start (restart) conditions following an engine idle-stop may include an increase in engine load. In one example, the controller may determine if a brake pedal is released. The accelerator pedal position may also be determined, for example via a pedal position sensor, to determine whether the accelerator pedal has been engaged in addition to the release of the brake pedal. The status of the air conditioner may be checked to verify whether a request has been made to restart, as may be made when air conditioning is desired. The SOC of battery may be estimated to estimate if it is below a predetermined threshold. In one example, it may be desired that battery be at least 30% charged. Accordingly, engine starting may be requested to charge the battery to a desired value.

The engine restart conditions may further include, a request from an emission control device to restart the engine. In one example, the emission control device temperature may be estimated and/or measured by a temperature sensor, and if the temperature is below a predetermined threshold, an engine restart may be requested. The vehicle speed may be estimated and assessed whether it is above a predetermined threshold. For example, if the vehicle speed is greater than a threshold (e.g., 3 mph) an engine start may be requested. It may be determined whether the electrical load of the engine is above a predetermined threshold, in response to which an engine start is requested (e.g., to reduce draining of the battery). In one example, the electrical load may comprise one of various user operated accessory devices (such as a mobile phone, laptop, etc.), a defroster, windshield wipers, a music system, navigation system, electrically powered air-conditioning, etc.

If it is determined that the engine restart conditions have not been met, at 1028, the engine may be maintained shut down and at rest, and combustion may not be resumed. The engine may be maintained at rest until conditions for engine restart are met.

If it is determined that engine restart conditions are met, at 1030, the engine may be restarted. Upon engine restart, combustion may be resumed by initiating fueling to the engine cylinders. The controller may send a signal to an actuator coupled to the starter motor to crank the engine using energy from the battery until an engine idling speed is reached. Also, the controller may send a signal to one or more fuel injectors coupled to the engine cylinders to restart fuel injection to each of the cylinders. Further, the controller may send a signal to the spark plug coupled to each cylinder to enable spark. During engine restart, the transmission position may be maintained at the current transmission position (such as drive, neutral, or reverse).

In this way, during operation of an on-board generator to supply electric power to off-board electric consumers, upon receipt of a first user input, stopping an idling engine may be inhibited after a predetermined amount of time, and upon receipt of a second user input, the idling engine may be automatically stopped after the predetermined amount of time. Also, upon receipt of a third user input, stopping the idling engine may be postponed after the predetermined amount of time, and after an indicated duration, the idling engine may be stopped, the third user input specifying the indicated duration.

FIG. 12 shows an example operating sequence 1200 illustrating operation of an engine and a generator to power a power take-off device (such as auxiliary loads 193 in FIG. 1). The horizontal (x-axis) denotes time and the vertical markers t1-t5 identify significant times in engine operation.

The first plot, line 1202, shows a change in vehicle speed over time. The second plot, line 1204, shows operation of the power take-off (PTO) device using power generated by the engine. Mechanical energy generated by the engine is converted to electrical energy at the generator which is then used to operate the PTO via a power box. Therefore, operation of the generator is desired during operation of the PTO device. The third plot, line 1206, shows engine operation. Engine operation includes combustion of air fuel in the engine cylinders. The fourth plot, line 1208, shows operation of the on-board generator to convert engine torque to electrical energy. The fifth plot, line 1210, denotes user input to deactivate (override) an idle-stop. During vehicle operation, by default, the idle-stop status is on such that when conditions are met for engine idle-stop, the engine is shut-down. However, based on user input, the idle-stop status may be turned off (idle-stop deactivated) such that even when conditions are met for engine idle-stop, the engine is continued to be operated to generate energy.

Prior to time t1, the vehicle is operated using engine torque. The generator is not operated during this time. At time t1, the vehicle is stopped while the engine is continued to be operated. At time t2, a power take off device is connected to the power box and the generator is activated to power the PTO device via the power box. Mechanical energy converted to electrical energy via the generator is used to operate the PTO device.

At time t3, conditions are met for an engine idle-stop, and an input from the vehicle operator is sought. Based on the user's indication of idle-stop deactivation, even though conditions are met for shutting down the engine at time t3, the engine is continued to be operated to supply energy to the generator. Between time t3 and t4, the PTO is operated. At time t4, the PTO operation is suspended and also the generator is deactivated. The vehicle continues to be at rest with the engine combusting between time t4 and t5. At time t5, the vehicle is restarted from rest. In response to the generator shut-down and the vehicle motion, the user's deactivation of engine idle-stop is nullified and during the drive cycle, if conditions are met for an engine idle-stop, the engine may be idle-stopped if the generator is not operating. If the generator is operating when the idle-stop conditions are met during the drive cycle, the user will be prompted to either maintain the default state and proceed with the idle-stop or deactivate idle-stop again.

In this way, upon engine idle-stop conditions being met, by continuing to operate the engine during generator operation based on user preference, operation of a power take-off device powered by the generator may be continued without irruption. Overall, by scheduling engine idle-stop based on generator operation and operator input, customer satisfaction may be improved.

In one example, a method for a vehicle, comprises: during operation of a generator, in response to a condition for an engine idle-stop being met, schedule engine shut-down based on input from a user. The preceding example method further comprises, additionally or optionally, during operation of the generator, in response to the condition for the engine idle-stop being met, prompting the user for the input via a human machine interface (HMI), the HMI including a display coupled to a vehicle dashboard and/or a display of a smart phone operated by the user. In any or all of the preceding examples, additionally or optionally, scheduling the engine shut-down includes continuing operation of an engine without engine shut-down based on a first input from the user while continuing providing generator output to an external device that is separate and distinct from the vehicle or any on-board vehicle accessory. In any or all of the preceding examples, the method further comprising, additionally or optionally, upon receipt of the first input, the engine is continued to be operated until the generator is deactivated and the vehicle is moved from an origin location. In any or all of the preceding examples, additionally or optionally, the moving of the vehicle includes shifting a gear position from park to a forward gear and moving the vehicle higher than a threshold distance from the origin location. In any or all of the preceding examples, additionally or optionally, scheduling the engine shut-down further includes shutting down the engine based on a second input from the user. In any or all of the preceding examples, additionally or optionally, shutting down the engine includes deactivating fuel injection and spark to each of the engine cylinders. In any or all of the preceding examples, additionally or optionally, scheduling the engine shut-down further includes continuing engine operation without engine shut-down for an indicated duration based on a third input from the user. In any or all of the preceding examples, the method further comprising, additionally or optionally, upon receipt of the third input, continuing operation of the engine for the indicated duration, and upon completion of the indicated duration, in response to the condition of the engine idle-stop being met, shutting down the engine regardless of generator operation. In any or all of the preceding examples, additionally or optionally, the user indicating one of the first input, the second input, and the third input is in response to the prompting the user for the input via the HMI. In any or all of the preceding examples, additionally or optionally, the condition for the engine idle-stop includes a higher than threshold duration of engine idling with the vehicle stopped at the origin location. In any or all of the preceding examples, additionally or optionally, the generator is providing power to the external device via a power box including power outlets.

Another example method for a vehicle comprises: during operation of an on-board generator to supply electric power to off-board electric consumers, upon receipt of a first user input, inhibiting stopping an idling engine after a predetermined amount of time, and upon receipt of a second user input, automatically stopping the idling engine after the predetermined amount of time. In the preceding example method, additionally or optionally, the inhibiting is continued until operation of the on-board generator is suspended and the vehicle is moved from a current location. In any or all of the preceding examples, additionally or optionally, the first user input and the second user input are received from a user via a human machine interface (HMI), the user being inside the vehicle or external to the vehicle. In any or all of the preceding examples, the method further comprising, additionally or optionally, automatically stopping the idling engine after the predetermined amount of time when the on-board generator is not supplying electric power to off-board electric consumers. In any or all of the preceding examples, the method further comprising, additionally or optionally, upon receipt of a third user input, postponing stopping the idling engine after the predetermined amount of time, and after an indicated duration, stopping the idling engine, wherein the third user input specifies the indicated duration.

Thus, during generator operation, by scheduling idle-stop based on operator input, operation of a PTO device may be effectively continued without interruption due to power shortage caused by engine shut-down. By continuing to operate the engine until the vehicle moves, successive operation of the PTO may be supported. The technical effect of allowing the operator to select a specific duration for idle-stop override is that the operator may operate the PTO device for a desired duration and then allow engine idle-stop which would improve fuel efficiency. Overall, by adjusting generator operation and engine idle-stop based on operator input, customer satisfaction may be improved.

Discussed herein, a DCAC converter may supply power to external computing devices including but not limited to computers, electronic note pads, etc. The external computing devices may not be devices that are included with the vehicle at the time of vehicle purchase. The DCAC converter may also supply power to phones, lighting devices, entertainment systems, gaming systems, and other AC power consumers. The DCAC may be packaged within the vehicle's passenger compartment so that it is not exposed to external environmental conditions. However, it may be possible for vehicle occupants to reduce an amount of air flow that is directed to cool the DCAC converter by adding objects to the vehicle's passenger compartment or storage areas. Consequently, a temperature of the DCAC may increase to a temperature that is higher than may be desired. Operating the DCAC at higher temperatures may lead to DCAC degradation.

Thus, discussed herein, the system of FIGS. 1-4C provides for a system, comprising a vehicle including a direct current to alternating current converter and a human/machine interface, and a controller including executable instructions stored in non-transitory memory to indicate a temperature of the direct current to alternating current converter is greater than a desired temperature via the human/machine interface. Such a system may further comprise a climate control system and additional instructions to adjust the climate control system in response to the temperature of the direct current to alternating current converter being greater than the desired temperature. Such a system may further include where adjusting the climate control system includes adjusting a position of a vent. Additionally or alternatively, such a system may include where adjusting the climate control system includes adjusting a speed of a fan. In one example of the system, the human/machine interface may be a phone.

Referring now to FIG. 13, a flow chart of a method 1300 for operating a DCAC converter of a vehicle is shown. The method of FIG. 13 may be incorporated into and may cooperate with the system of FIGS. 1-4C. Further, at least portions of the method of FIG. 13 may be incorporated as executable instructions stored in non-transitory memory while other portions of the method may be performed via a controller transforming operating states of devices and actuators in the physical world.

At 1302, the DCAC converter is activated (e.g., supplying electrical power to AC electrical power consumers) and DCAC converter operating conditions are determined. DCAC converter operating conditions may include but are not limited to an amount of DC power input to the DCAC converter, an amount of AC power supplied by the DCAC converter, DCAC converter cooling fan speed, window position, seat position, status of seat occupancy, ambient temperature, and climate control system status. Method 1300 may determine these operating conditions via the sensors shown in FIGS. 1-4B and algorithms that may be included in one or more controllers. Method 1300 proceeds to 1304.

At 1304, method 1300 measures a DCAC converter temperature and estimates DCAC temperature via a model. In one example, the DCAC converter temperature model may be based on empirically determined data recorded during DCAC converter operation. The DCAC converter temperature may be a function of DC power input to the DCAC converter and AC power output from the DCAC converter. For example, a baseline DCAC temperature may be determined via the following equation:

$$DCAC\_base\_temp = f(DCAC\_in\_pow, DCAC\_out\_pow)$$

where DCAC_base_temp is a baseline DCAC converter temperature, f is a function, DCAC_in_pow is an argument comprising DCAC converter DC input power amount, and DCAC_out_pow is DCAC converter AC output power amount. In one example, the function f may be comprised of a table or function of empirically determined values that is indexed or referenced via DCAC converter DC input power and DCAC converter AC output power. The final DCAC temperature may be determined via the following equation:

$$DCAC\_temp = DCAC\_base\_temp \cdot f1(win\_pos) \cdot f2(seat\_pos) \cdot f3(seat\_occ) \cdot f4(fan\_spd) \cdot f5(amb\_t) \cdot f6(clim\_mod)$$

where DCAC_temp is the modeled DCAC converter temperature, f1 is a function that returns a scalar multiplier that is based on a position of a vehicle's window (e.g., f1 may output a fractional value if the window is open and a value of 1 if the window is closed), win_pos represents window position, f2 is a function that returns a scalar multiplier that is based on seat position (e.g., f2 may output a value that is greater than 1 if the seat position tends to block air flow through and/or around the DCAC converter), seat_pos represents the seat position, f3 is a function that returns a scalar multiplier that is based on seat occupancy (e.g., f1 may output a value that is greater than 1 if the seat is occupied so that air flow through and/or around the DCAC converter tends to be blocked when the seat is occupied), seat_occ represents the seat occupancy, f4 is a function that returns a scalar multiplier that is based on DCAC converter fan speed (e.g., f4 may output a value that is greater than 1 if the fan speed is slower than is expected), fan_spd represents the DCAC fan speed, f5 is a function that returns a scalar multiplier that is based on ambient temperature (e.g., f5 may output a value that is greater than 1 if the ambient temperature is greater than 25° C.), amb_t represents the ambient temperature, f6 is a function that returns a scalar multiplier that is based on climate control system mode (e.g., f6 may output a value that is less than 1 if the climate control system is operating in a cooling mode), clim_mod represents the climate control system operating mode. Method 1300 proceeds to 1306.

At 1306, method 1300 compares the modeled DCAC converter temperature to the measured DCAC converter temperature. In particular, method 1300 determines if the measured DCAC temperature is greater than the modeled DCAC converter temperature by more than a threshold temperature amount for longer than a threshold amount of time (e.g., one minute). Alternatively, method 1300 may determine if the derivative of the measured DCAC converter temperature is greater than the derivative of modeled DCAC converter temperature by more than a threshold amount for longer than a threshold amount of time (e.g., one minute). Method 1300 proceeds to 1308.

At 1308, method 1300 judges if the measured DCAC converter temperature is greater than the modeled DCAC converter temperature by more than a threshold temperature. If so, the answer is yes and method 1300 proceeds to 1310. Otherwise, the answer is no and method 1300 proceeds to 1340.

At 1340, method 1300 activates the DCAC converter and begins supplying AC power to AC power consumers if the DCAC converter is not already activated. Method 1300 proceeds to exit.

At 1310, method 500 increases a speed of a DCAC converter fan to increase airflow to the DCAC converter. Method 1300 proceeds to 1312.

At 1312, method 1300 may optionally adjust operating of a climate control system to reduce DCAC converter temperature. For example, method 1300 may adjust one or more of a position of a climate control system door (e.g., 461 of FIG. 4C), adjust climate control compressor speed, and adjust a position of an expansion valve to improve DCAC converter cooling. By adjusting a position of the climate control system door, additional air may be directed to the DCAC converter to improve DCAC converter cooling for DCAC converters that may be mounted on a vehicle passenger compartment floor. Further, by increasing climate control system compressor speed and expansion valve position, cooler air may be supplied to the DCAC converter so that DCAC converter operation may continue and so that the DCAC converter may not degrade. Method 1300 proceeds to 1314.

At 1314, method 1300 provides an indication of possible DCAC converter low airflow. In one example, the indication may be provided a threshold amount of time after steps 1310 and 1312 are performed and a DCAC converter temperature reduction of a threshold amount has not occurred. The indication may be generated via a human/machine interface (e.g., 357 of FIG. 3) or via a portable device (e.g., 358 of FIG. 3). Method 1300 proceeds to 1316.

At 1316, method 1300 judges if the measured the DCAC converter temperature is greater than a threshold temperature. If so, the answer is yes and method 1300 proceeds to 1318. Otherwise, the answer is no and method 1300 proceeds to exit.

At 1318, method 1300 deactivates the DCAC converter. The DCAC converter may be deactivated by ceasing to supply DC power to the DCAC converter. The DCAC converter may be deactivated to reduce the possibility of DCAC converter degradation. Method 1300 proceeds to exit.

In this way, mitigating actions to reduce the possibility of DCAC converter degradation may be performed. Fan speeds and climate control devices may be automatically adjusted to reduce the possibility of DCAC converter degradation and to extend DCAC converter operation. If the automatic actions are not as successful as may be desired, then humans may be notified of a possible airflow restriction to the DCAC converter. If the DCAC temperature is not reduced to a desired level, then the DCAC may be deactivated to reduce the possibility of DCAC degradation.

Thus, the method of FIG. 13 provides for a method for operating a vehicle that includes a direct current to alternating current converter, comprising: modeling a temperature of the direct current to alternating current converter via a controller; measuring the temperature of the direct current to alternating current converter via the controller; and generating an indication to clear an air flow path to the direct current to alternating current converter in response to the measured temperature being greater than the modeled temperature for greater than a threshold amount of time. The method includes where the modeled temperature is a function of a position of a window. The method includes where the modeled temperature is a function of ambient temperature. The method includes where the modeled temperature is a function of a seat position. The method includes where the modeled temperature is a function of a speed of a fan of the direct current to alternating current converter. The method includes where the modeled temperature is a function of power input to the direct current to alternating current converter. The method includes where the modeled temperature is a function of power output from the direct current to alternating current converter. The method includes where the indication is presented via a human to machine interface. The method includes where the indication is presented via a personal communications device.

The method of FIG. 13 also provides for a method for operating a vehicle that includes a direct current to alternating current converter or converter, comprising: adjusting a climate control system via a controller in response to a temperature of a direct current to alternating current converter. The method includes where adjusting the climate control system includes adjusting a position of a vent control valve. The method includes where adjusting the position of the vent control valve increases air flow to floor vents. The method includes where adjusting the climate control system includes adjusting a speed of a climate control system fan. The method further comprises adjusting a speed of a fan of the direct current to alternating current converter. The method includes where adjusting the climate control system includes adjusting a speed of a compressor.

In another representation, the method of FIG. 13 also provides for operating a vehicle that includes a direct current to alternating current converter, comprising: adjusting a fan speed of a direct current to alternating current converter in response to a measured temperature of the direct current to alternating current converter being greater than a modeled temperature for greater than a threshold amount of time. The method includes where the modeled temperature is a function of a position of a window. The method includes where the modeled temperature is a function of ambient temperature. The method includes where the modeled temperature is a function of a seat position. The method includes where the modeled temperature is a function of a speed of a fan of the direct current to alternating current converter. The method further includes adjusting a position of a climate control vent door in response to the modeled temperature of the direct current to alternating current converter being greater than a measured temperature for greater than a threshold amount of time.

Referring now to FIG. 14, plots of a prophetic DCAC converter operating sequence 1400 according to the method of FIG. 13 and the system of FIGS. 1-4C are shown. The plots are aligned in time and occur at a same time. The dashed vertical lines at t0-t4 show particular times of interest.

The first plot from the top of FIG. 14 is a plot of a DCAC converter temperature versus time. The vertical axis represents the DCAC converter temperature and the DCAC converter temperature increases in the direction of the vertical axis arrow. The horizontal axis represents time and the time increases from the left side of the figure to the right side of the figure. Solid line trace 1402 represents the values of a modeled DCAC converter temperature. Dashed-line trace 1404 represents values of a measured DCAC converter temperature.

The second plot from the top of FIG. 14 is a plot of a position of a climate control system vent door (e.g., 461 of FIG. 4C) versus time. The vertical axis represents the position of the vent door and the vent door directs all air passing through the climate control system intake passage 462 through the dashboard vents 452 when trace 1406 is near the "Dash" label. The vent door directs all air passing through the climate control system intake passage 462 through the floor vents 453 when trace 1406 is near the "Floor" label. The vent door directs a portion of air passing through the climate control system intake passage 462 through the floor vents 453 and a portion of the air passing through the climate control system intake passage 462 through the dashboard vents 452 when trace 1406 is between the "Floor" label and the "Dash" label. Trace 1406 represents the position of a climate control system vent door.

The third plot from the top of FIG. 14 is a plot that shows an operating state that indicates when there may be an airflow restriction through or around the DCAC converter versus time. An indication that there may be an airflow restriction through or around the DCAC converter is present when trace 1408 is at a higher level near the vertical axis arrow. There is not an indication that there is an airflow restriction through or around the DCAC converter when trace 1408 is at a lower level near the horizontal axis. Trace 1408 represents the state that indicates when there may be an airflow restriction through or around the DCAC converter.

The fourth plot from the top of FIG. 14 is a plot that shows an operating state that indicates when there is human driver notification that airflow through or around a DCAC converter may be restricted versus time. An indication to a human driver that there may be an airflow restriction through or around the DCAC converter is present when trace 1410 is at a higher level near the vertical axis arrow. There is not an indication to a human driver that there may be an airflow restriction through or around the DCAC converter when trace 1410 is at a lower level near the horizontal axis. Trace 1410 represents the state indicates that a human driver may be notified that there may be an airflow restriction through or around the DCAC converter.

At time t0, the DCAC converter modeled and measured temperatures are at middle levels and there is very little difference between the two temperatures. The climate control system is directing all of the air that flows through the climate control system intake passage 462 to the dashboard vents 452. An indication of a possible airflow restriction through or around the DCAC converter is not asserted and notification of the same is not provided to a human driver. The DCAC converter is activated and it is supplying AC power to electrical power consumers (not shown).

At time t1, the measured or actual DCAC converter temperature exceeds the modeled DCAC converter temperature by more than a threshold amount. The climate control system is directing all of the air that flows through the climate control system intake passage 462 to the dashboard vents 452. An indication of a possible airflow restriction through or around the DCAC converter is not asserted and notification of the same is not provided to a human driver. The DCAC converter remains activated and it is supplying AC power to electrical power consumers (not shown).

At time t2, the measured or actual DCAC converter temperature exceeds the modeled DCAC converter temperature by a threshold amount for longer than a threshold amount of time. The climate control system adjusts a position of the climate control system vent door to direct cool air flow to the DCAC converter that is positioned under the seat to improve DCAC converter cooling. The position of the climate control system vent door may be adjusted to increase airflow to the DCAC converter by a small amount so that the change in airflow to the climate control system floor vents may go unnoticed by human occupants. An indication of a possible airflow restriction through or around the DCAC converter is not asserted and notification of the same is not provided to a human driver. The DCAC converter remains activated and it is supplying AC power to electrical power consumers (not shown).

Between time t2 and time t3, the measured DCAC converter temperature does not decline and the DCAC converter modeled temperature remains unchanged. An indication of a possible airflow restriction through or around the DCAC converter is not asserted and notification of the same is not provided to a human driver. The DCAC converter remains activated and it is supplying AC power to electrical power consumers (not shown).

At time t3, the measured DCAC converter temperature continues at a level that is above the DCAC converter modeled temperature. Consequently, an indication of a possible airflow restriction through or around the DCAC converter is asserted and notification of the same is provided to a human driver. The DCAC converter remains activated and it is supplying AC power to electrical power consumers (not shown).

Between time t3 and time t4, the vehicle occupants clear airflow to the DCAC converter (not shown) and measured DCAC converter temperature declines and the DCAC converter modeled temperature remains unchanged. An indication of a possible airflow restriction through or around the DCAC is asserted and notification of the same is provided to a human driver. The DCAC converter remains activated and it is supplying AC power to electrical power consumers (not shown).

At time t4, the measured DCAC converter temperature is less than the DCAC converter modeled temperature so the indication of a possible airflow restriction through or around the DCAC converter is no longer asserted and notification of the same is no longer provided to a human driver. The DCAC converter remains activated and it is supplying AC power to electrical power consumers (not shown).

In this way, vehicle occupants may be informed of DCAC converter operation so that they may take mitigating actions to reduce the possibility of DCAC converter degradation. Further, operation of the climate control system may be adjusted to reduce the possibility of DCAC degradation.

By generating an indication to clear an air flow path to a direct current to alternating current converter or power supply, it may be possible to provide the technical result of reducing a temperature of the direct current to alternating current converter so that the possibility of degrading performance of the direct current to alternating current converter may be reduced. In addition, mitigating actions may be taken to further reduce the possibility that performance of the direct current to alternating current converter may be degraded. In particular, airflow to floor vents of a climate control system may be increased to provide additional cooling air to a direct current to alternating current converter that may be mounted under a vehicle seat.

The description with regard to FIGS. 13-14 may provide several advantages. In particular, the approach may reduce the possibility of DCAC converter degradation. Further, the approach may provide mitigating actions that may help to cool the DCAC converter, thereby reducing the possibility of converter degradation. In addition, the approach may allow vehicle occupants to improve air flow to a DCAC converter so that the possibility of converter degradation may be reduced.

Discussed herein, a hybrid vehicle may include an electric machine that may provide a propulsion force to the hybrid vehicle. The electric machine may also supply alternating electrical current to external electrical power consumers from time to time. Further, in some examples, the electric machine may not provide propulsion force for the vehicle. In one example, a hybrid vehicle may be parked at a construction site and the engine of the hybrid vehicle may rotate the armature of the electric machine so that the electric machine may supply electric power to electric power consumers that are external or off-board the hybrid vehicle. The engine of the hybrid vehicle may operate at a variety of speeds and loads to meet the electrical power consumption of the electric power consumers. The engine may also be operated with the electric machine to generate electric power for several hours each day.

During some engine operating conditions while the engine and the electric machine are operating to generate electrical power, carbon may tend to build on the engine's spark plugs. If the amount of carbon deposited on the engine's spark plugs is greater than a threshold amount, the engine may misfire. On the other hand, carbon may be removed from the engine's spark plugs while the engine and the electric machine are operating to generate electrical power. Whether or not carbon is being deposited on or being removed from spark plugs depends on the speed and load at which the engine is operating. In addition, the amount of carbon deposited or removed from the spark plugs may vary depending on the speed and load at which the engine is operated. Users of the vehicle may notice engine speed changes if the engine begins to misfire and engine emissions may increase if the engine begins to misfire. Therefore, it may be desirable to provide a way of mitigating the possibility of engine misfires.

Accordingly, the system of FIGS. 1-3 provides for a system, comprising an engine in a hybrid vehicle driveline, and an electric machine in the hybrid driveline. They system may further include a controller including executable instructions stored in non-transitory memory to adjust operation of the engine in response to an amount of time the engine operates in one or more carbon building regions exceeding a threshold while the electric machine is electrically coupled to an external electric power consumer. Such a system may include where adjusting operation of the engine includes increasing engine speed and load. Such a system may further comprise additional instructions to increase output of the electric machine in response to the amount of time the engine operates in one or more carbon building regions exceeding the threshold. Such a system may further comprise additional instructions to store the increased output of the electric machine in an electric energy storage device. Such a system may include where operation of the engine is adjusted while a transmission coupled to the electric machine is engaged in park. Such a system may further comprise adjusting operation of the engine in further response to an amount of time the engine operates in one or more carbon removing regions being less than a threshold.

Referring now to FIG. 15, a flow chart of a method 1500 for operating a vehicle engine and driveline in a way that may reduce the possibility of engine misfires while generating electrical power for external electrical power consumers is shown. The method of FIG. 15 may be incorporated into and may cooperate with the system of FIGS. 1-3.

Further, at least portions of the method of FIG. 15 may be incorporated as executable instructions stored in non-transitory memory while other portions of the method may be performed via a controller transforming operating states of devices and actuators in the physical world.

At 1502, method 1500 determines vehicle operating conditions. Vehicle operating conditions may include but are not limited to driver demand torque, transmission gear, vehicle speed, electric machine speed, engine speed, engine load, engine temperature, determining the engine operating region (e.g., carbon building region, carbon reducing region, carbon neutral region) and electric energy storage device state of charge (SOC). Method 1500 may determine the engine operating region via indexing a map (e.g., as shown in FIG. 17) via the present engine speed and load. Method 1500 proceeds to 1504.

At 1504, method 1500 judges if the engine is driving and rotating the electric machine to supply electrical power to external electrical power consumers while the transmission is engaged in park or neutral. Method 1500 may judge that the engine is driving the electric machine to supply electrical power to external electric power consumers based on operating states of electrical receptacles, the transmission gear shift lever, and the vehicle operating mode. If method 1500 judges that the engine is driving the electric machine to supply electrical power to external electrical power consumers, the answer is yes and method 1500 proceeds to 1506. Otherwise, method 1500 proceeds to 1550. Method 1500 may not supply power to the vehicle's electric energy storage unit when the engine and electric machine are supplying electrical power to external electric power consumers, unless the value of the first timer or first accumulator exceeds the first threshold. By not charging the electric energy storage device, it may be possible to reserve a portion of electric energy storage capacity in case initiation of the carbon reducing state is activated so that excess charge may be usefully stored.

At 1506, method 1500 allows a value of a first accumulator, or alternatively, a first timer to increase if method 1500 judges that the engine is presently operating in a carbon building region (e.g., an engine operating region where an amount of carbon deposits on a spark plug is increasing). In other words, method 1500 may measure an amount of time the engine operates in a carbon building region. In one example, a timer accumulates a total amount of time that the engine is operating in the carbon building region. The timer may increment in predetermined step amounts (e.g., 0.1 seconds) and the total amount of time that the engine operates in the carbon building region may be determined via summing the total number of 0.1 second increments. For example, if the timer increments 100 times, then the engine operated in the carbon building region for 10 seconds and the timer stores an accumulated value of 10.

Alternatively, each carbon building region is assigned a multiplier value. The multiplier value may be a scalar value that is greater than zero. In nominal carbon building regions, the carbon building regions may be assigned a multiplier value of one. In carbon building regions where carbon deposit formation is more significant, the carbon building regions may be assigned a multiplier value that is greater than one. In carbon building regions where carbon deposit formation is less significant, the carbon building regions may be assigned a multiplier value that is less than one. The multiplier values may be multiplied with timer increment values and the results may be added to a sum of other timer increment values that have been multiplied by other carbon building region multipliers and stored in an accumulator. For example, if the engine is operating at 700 RPM and 0.2 load, which is a carbon building region with a multiplier value of 1.1, and the timer increments each time interval of 0.1 seconds for 100 seconds, then the value stored in the accumulator after the 100 increments is the sum of one hundred multiplications of 1.1·0.1 or 1.1·0.1·100=11.

At 1508, method 1500 allows a value of a second accumulator, or alternatively, a second timer to increase if method 1500 judges that the engine is presently operating in a carbon reducing region (e.g., an engine operating region where an amount of carbon deposits on a spark plug is decreasing). In other words, method 1500 may measure an amount of time the engine operates in a carbon reducing region. In one example, a timer accumulates a total amount of time that the engine is operating in the carbon reducing region. The timer may increment in predetermined step amounts (e.g., 0.1 seconds) and the total amount of time that the engine operates in the carbon reducing region may be determined via summing the total number of 0.1 second increments. For example, if the timer increments 100 times, then the engine operated in the carbon reducing region for 10 seconds and the timer stores an accumulated value of 10.

Alternatively, each carbon reducing region is assigned a multiplier value. The multiplier value may be a scalar value that is greater than zero. In nominal carbon reducing regions, the carbon reducing regions may be assigned a multiplier value of one. In carbon reducing regions where carbon reduction is more significant, the carbon reducing regions may be assigned a multiplier value that is greater than one. In carbon reducing regions where carbon reduction is less significant, the carbon reducing regions may be assigned a multiplier value that is less than one. The multiplier values may be multiplied with timer increment values and the results may be added to a sum of other timer increment values that have been multiplied by other carbon reducing region multipliers and stored in an accumulator. For example, if the engine is operating at 3000 RPM and 0.8 load, which is a carbon building region with a multiplier value of 1.1, and the timer increments each time interval of 0.1 seconds for 100 seconds, then the value stored in the accumulator after the 100 increments is the sum of one hundred multiplications of 1.1.0.1 or 1.1·0.1·100=11. Method 1500 proceeds to 1510.

At 1510, method 1500 judges if the value stored in the first timer or first accumulator is greater than a first threshold number. If so, the answer is yes and method 1500 proceeds to 1512. Otherwise, the answer is no and method 1500 returns to 1504.

At 1512, method 1500 judges if the value stored in the second timer or second accumulator is greater than a second threshold number. If so, the answer is yes and method 1500 proceeds to 1520. Otherwise, the answer is no and method 1500 proceeds to 1514.

At 1520, method 1500 resets the values of the first and second timers or accumulators to values of zero. Method 1500 returns to 1504. By resetting the timers or accumulators, conditions of the spark plugs may be evaluated without generating huge numbers in the timers or accumulators. Further, the threshold values may be maintained as useful measures for assessing spark plug degradation.

At 1514, method 1500 adjusts engine operation so that the engine is operating in a carbon reducing region. In particular, the initiation of the carbon reducing state is activated so that carbon may be removed from engine spark plugs. For example, the engine may be adjusted from 700 RPM and 0.2 load to 2500 RPM and 0.6 engine load to reduce carbon deposits that may be present on one or more engine spark plugs. The engine may be operated in the carbon reducing region up to a time when the value in the second timer or second accumulator exceeds the second threshold value. After the value in the second timer or second accumulator exceeds the second threshold value, the engine returns to an operating range that is based on the amount of electrical power that the electric machine is generating for the electrical power consumers. If the engine output is increased to operate the engine in the carbon reducing region, then the output of the electric machine may be increased and the amount of electric charge produced via the electric machine that is greater than the amount of electric charge consumed via external electric power consumers may be stored in the electric energy storage unit. Additional charge may not be supplied to the external electric power consumers. Method 1500 returns to 1504.

Optionally at 1550, method 1500 allows a value of a first accumulator, or alternatively, a first timer to increase if method 1500 judges that the engine is presently operating in a carbon building region (e.g., an engine operating region where an amount of carbon deposits on a spark plug is increasing) as described at 1506. By allowing the first timer or accumulator values to increase when the engine and electric machine are not supplying electrical power to external power consumers, it may be possible to compensate for conditions that might increase spark plug fouling when the engine and electric machine are not providing electrical power to external power consumers so that spark plug fouling may not occur prematurely when the engine and electric machine are providing power to external electrical power consumers. Method 1500 proceeds to 1552.

Optionally, at 1552, method 1500 allows a value of a second accumulator, or alternatively, a second timer to increase if method 1500 judges that the engine is presently operating in a carbon reducing region (e.g., an engine operating region where an amount of carbon deposits on a spark plug is decreasing) as described at 1506. By allowing the second timer or accumulator values to increase when the engine and electric machine are not supplying electrical power to external power consumers, it may be possible to compensate for conditions that might reduce spark plug fouling when the engine and electric machine are not providing electrical power to external power consumers so that initiating of a carbon reducing state may be avoided when vehicle driving conditions reduce carbon deposits on spark plugs. Method 1500 proceeds to 1554.

At 1554, method 1500 operates the engine and the electric machine responsive to the driver demand torque and vehicle speed. For example, the engine and electric machine may provide the requested driver demand torque without supplying electrical power to external electrical power consumers. Method 1500 proceeds to exit.

The method of FIG. 15 provides for a powertrain operating method, comprising: characterizing each of a plurality of engine operating regions as one or more carbon building regions and one or more carbon removing regions; measuring an amount of time an engine operates in the one or more of the carbon building regions via a controller while the engine rotates an electric machine that provides power to external power consumers; and adjusting operation of the engine to operate in one or more of the carbon removing regions while the engine rotates the electric machine that provides power to the external power consumers in response to the amount of time exceeding a threshold. The method further comprises not supplying electrical power to an electric energy storage device of a vehicle while the engine operates in the one or more of the carbon building regions. The method further comprises supplying electrical power to the electric energy storage device of the vehicle while the engine operates in the one or more of the carbon removing regions. The method includes where the one or more carbon building regions are engine speeds and loads where carbon builds on one or more engine spark plugs. The method includes where the one or more carbon removing regions are engine speeds and loads where carbon is removed from one or more engine spark plugs. The method includes where the electric machine does not supply additional power to the external power consumer in response to the amount of time exceeding the threshold. The method includes where the electric machine supplies power to an electric energy storage device in response to the amount of time exceeding the threshold. The method further comprises increasing output of the electric machine in response to the amount of time exceeding the threshold.

The method of FIG. 15 also provides for a powertrain operating method, comprising: adjusting a first value responsive to an amount of time an engine operates in one or more carbon building regions via a controller; adjusting a second value responsive to an amount of time an engine operates in one or more carbon removing regions via a controller; and adjusting operation of an engine via a controller to operate in the one or more of the carbon removing regions in response to the first value exceeding a first threshold and the second value not exceeding a second threshold. The method further comprises resetting the first value to zero and the second value to zero in response to the first value exceeding the first threshold and the second value exceeding the second threshold. The method includes where the first value is based on one or more carbon building region multipliers. The method includes where the second value is based on one or more carbon removing region multipliers. The method includes where the first value and the second value reside within memory of the controller. The method further comprises increasing output of an electric machine in response to the first value exceeding the first threshold and the second value not exceeding the second threshold.

In another representation, the method of FIG. 15 provides for a powertrain operating method, comprising: characterizing each of a plurality of engine operating regions as one or more carbon building regions, one or more carbon removing regions, and one or more carbon neutral regions; measuring an amount of time an engine operates in the one or more of the carbon building regions via a controller while the engine rotates an electric machine that provides power to external power consumers; and adjusting operation of the engine to operate in one or more of the carbon removing regions while the engine rotates the electric machine that provides power to the external power consumers in response to the amount of time exceeding a threshold. The method further comprises not supplying electrical power to an electric energy storage device of a vehicle while the engine operates in the one or more of the carbon building regions and the value of the first timer or accumulator is less than the first threshold and the value of the second timer or accumulator is less than the second threshold.

Referring now to FIG. 17, a plot 1700 of example carbon building, carbon reducing, and carbon neutral operating regions is shown. The vertical axis represents engine load and engine load increases in the direction of the vertical axis arrow. The horizontal axis represents engine speed and engine speed increases in the direction of the horizontal axis arrow.

Plot 1700 shows a carbon building region 1702 that is shown at lower engine speeds and loads. Region 1702 is bounded via line 1703 and it includes all of the cross-hatched area. Carbon may tend to accumulate on engine spark plugs if the engine is operated in this region for an extended period of time. Plot 1700 also shows a carbon neutral region 1704 that is shown at middle engine speeds and engine loads. Region 1704 is bounded by line 1703 and by line 1705. Carbon may tend not to accumulate or be removed when the engine is operated in this operating range. Finally, plot 1700 also shows a carbon removing region 1706 that is shown at higher engine speeds and engine loads. Region 1706 is bounded by line 1705 and it is indicated by the hatched area. Carbon may tend to be removed or oxidized from engine spark plugs when the engine is operated in this operating range.

It should be understood that the engine may include carbon regions that are different than those shown in FIG. 17 without exceeding the scope of this disclosure. For example, an engine may have three distinct and separate carbon reducing regions, two carbon neutral regions, and two carbon building regions. Further, each of these carbon regions may be assigned a unique multiplier value as described in the method of FIG. 15.

Referring now to FIG. 16, plots of a prophetic vehicle operating sequence 1600 according to the method of FIG. 15 and the systems of FIGS. 1-3 are shown. The plots are aligned in time and occur at a same time. The vertical lines at t0-t16 show particular times of interest.

The first plot from the top of FIG. 16 is a plot of an engine operating mode versus time. The vertical axis represents the engine operating mode and the engine is activated (e.g., rotating and combusting fuel) when trace 1602 is at a higher level near the vertical axis arrow. The engine is not activated (e.g., not combusting fuel) when trace 1602 is near the level of the horizontal axis. The horizontal axis represents time and the time increases from the left side of the figure to the right side of the figure. Trace 1602 represents the engine operating state.

The second plot from the top of FIG. 16 is a plot that indicates the operating region of the engine. The vertical axis represents the engine operating region and the engine operating region is indicated along the vertical axis. The level "Building" indicates that the engine is operating in a region (e.g., engine speed and load) where carbon may be accumulating on one or more engine spark plugs. The level "Neutral" indicates that carbon accumulating on the engine's spark plugs is not substantially increasing or decreasing. The level "Reducing" indicates that carbon accumulation on the engine's spark plugs may be decreasing due to oxidation of carbon on the spark plugs. The horizontal axis represents time and the time increases from the left side of the figure to the right side of the figure. Trace 1604 represents the engine operating region.

The third plot from the top of FIG. 16 is a plot of an accumulated amount of time that an engine operates in a carbon building region versus time. The vertical axis represents the accumulated amount of time that the engine operates the carbon building engine operating region (e.g., an accumulated amount of time that an engine operates in an engine operating region where carbon may build or accumulate on one or more engine spark plugs). The horizontal axis represents time and the time increases from the left side of the figure to the right side of the figure. Trace 1606 represents the accumulated amount of time that the engine operates in the carbon building engine operating region.

The fourth plot from the top of FIG. 16 is a plot of an accumulated amount of time that an engine operates in a carbon reducing region versus time. The vertical axis represents the accumulated amount of time that the engine operates the carbon reducing engine operating region (e.g., an accumulated amount of time that an engine operates in an engine operating region where carbon may be reduced on one or more engine spark plugs). The horizontal axis represents time and the time increases from the left side of the figure to the right side of the figure. Trace 1608 represents the accumulated amount of time that the engine operates in the carbon reducing engine operating region. Horizontal line 1650 is a threshold level that when exceeded by trace 1606 may cause the initiation of the carbon reducing state.

The fifth plot from the top of FIG. 16 is a plot of an initiated carbon reducing state versus time. The vertical axis represents the initiated carbon reducing state and the initiated carbon reducing state is activated when trace 1610 is at a higher level near the vertical axis arrow. The initiated carbon reducing state is not activated when trace 1610 is at a lower level near the horizontal axis. Trace 1610 represents the initiated carbon reducing state. Engine operation is adjusted for the engine to be actively engaged in the initiated carbon reducing state such that engine load may be increased to increase spark plug temperature so that carbon may be oxidized from the engine's spark plugs. Horizontal line 1655 is a threshold level that when exceeded by trace 1608 may cause the amounts of time the engine operated in the carbon building regions and carbon reducing regions to be reset to zero.

At time t0, the engine is off and the engine operating region is carbon neutral. The amount of engine operating time in the carbon building region is low and the amount of engine operating time in the carbon reducing region is low. The initiated carbon reducing state is not activated so engine operation is not adjusted.

At time t1, the engine is activated and the engine begins operating in the carbon building region so that the amount of time that the engine operates in the carbon building region begins to increase. The amount of time that the engine operates in the carbon reducing region is not adjusted. The engine rotates the electric machine and the electric machine is coupled to external electrical power consumers (not shown). Engine operation and electric machine operation are adjusted to provide the external power consumers the power that they request (not shown). The initiated carbon reducing state is not activated so engine operation is not adjusted.

At time t2, the engine is deactivated and the engine stops operating so that it is in the carbon neutral region. The amount of time that the engine operates in the carbon building region ceases increasing. The amount of time that the engine operates in the carbon reducing region is not adjusted. The engine stops rotating the electric machine and the electric machine is coupled to external electrical power consumers (not shown). The initiated carbon reducing state is not activated so engine operation is not adjusted.

At time t3, the engine is activated again and the engine begins operating in the carbon building region so that the amount of time that the engine operates in the carbon building region begins to increase. However, the timer increases at a faster rate than at time t1 because the amount of carbon that is generated at time t3 is determined to be greater than at time t1. The amount of time that the engine operates in the carbon reducing region is not adjusted. The engine rotates the electric machine and the electric machine is coupled to external electrical power consumers (not shown). The initiated carbon reducing state is not activated so engine operation is not adjusted.

At a time t4, the engine is deactivated again and the engine stops operating so that it is in the carbon neutral region. The amount of time that the engine operates in the carbon building region ceases increasing. The amount of time that the engine operates in the carbon reducing region is not adjusted. The engine stops rotating the electric machine and the electric machine is coupled to external electrical power consumers (not shown). The initiated carbon reducing state is not activated so engine operation is not adjusted.

At time t5, the engine is activated again and the engine begins operating in the carbon reducing region so that the amount of time that the engine operates in the carbon reducing region begins to increase. The amount of time that the engine operates in the carbon building region is not adjusted. The engine rotates the electric machine and the electric machine is coupled to external electrical power consumers (not shown). The initiated carbon reducing state is not activated so engine operation is not adjusted.

At a time t6, the engine is deactivated again and the engine stops operating so that it is in the carbon neutral region. The amount of time that the engine operates in the carbon reducing region ceases increasing. The amount of time that the engine operates in the carbon reducing region is not adjusted. The engine stops rotating the electric machine and the electric machine is coupled to external electrical power consumers (not shown). The initiated carbon reducing state is not activated so engine operation is not adjusted.

At time t7, the engine is activated again and the engine begins operating in the carbon building region again so that the amount of time that the engine operates in the carbon building region begins to increase again. However, the timer increases at a slower rate than at time t1 because the amount of carbon that is generated at time t7 is determined to be less than at time t1. The amount of time that the engine operates in the carbon reducing region is not adjusted. The engine rotates the electric machine and the electric machine is coupled to external electrical power consumers (not shown). The initiated carbon reducing state is not activated so engine operation is not adjusted.

At a time t8, the engine remains activated, but the amount of time that the engine operates in the carbon building region exceeds threshold 1650 and the amount of time that the engine operated in the carbon reducing region is less than threshold 1655, so the initiated carbon reducing state is activated and the engine is adjusted to operate in the carbon reducing region. The amount of time in the carbon reducing region begins to increase again.

At time t9, the engine remains activated and the amount of time that the engine operates in the carbon reducing region exceeds threshold 1655, so both amount of time that the engine operates in the carbon building region and the amount of time that the engine operates in the carbon reducing region are reset to values of zero. In addition, the initiated carbon reducing state is deactivated so that the engine is adjusted to operate in the carbon building region again.

At time t10, the engine is deactivated and the engine stops operating so that it is in the carbon neutral region. The amount of time that the engine operates in the carbon building region ceases increasing. The amount of time that the engine operates in the carbon reducing region is not adjusted. The engine stops rotating the electric machine and the electric machine is coupled to external electrical power consumers (not shown). The initiated carbon reducing state is not activated so engine operation is not adjusted.

At time t11, the engine is activated again and the engine begins operating in the carbon building region so that the amount of time that the engine operates in the carbon building region begins to increase. The amount of time that the engine operates in the carbon reducing region is not adjusted. The engine rotates the electric machine and the electric machine is coupled to external electrical power consumers (not shown). The initiated carbon reducing state is not activated so engine operation is not adjusted.

At time t12, the engine is deactivated and the engine stops operating so that it is in the carbon neutral region. The amount of time that the engine operates in the carbon building region ceases increasing. The amount of time that the engine operates in the carbon reducing region is not adjusted. The engine stops rotating the electric machine and the electric machine is coupled to external electrical power consumers (not shown). The initiated carbon reducing state is not activated so engine operation is not adjusted.

At time t13, the engine is activated again and the engine begins operating in the carbon reducing region so that the amount of time that the engine operates in the carbon reducing region begins to increase. The amount of time that the engine operates in the carbon building region is not adjusted. The engine rotates the electric machine and the electric machine is coupled to external electrical power consumers (not shown). The initiated carbon reducing state is not activated so engine operation is not adjusted.

At a time t14, the engine is deactivated again and the engine stops operating so that it is in the carbon neutral region. Note that the amount of time that the engine operated in the carbon reducing region is greater than threshold 1655. The amount of time that the engine operates in the carbon reducing region is not adjusted. The engine stops rotating the electric machine and the electric machine is coupled to external electrical power consumers (not shown). The initiated carbon reducing state is not activated so engine operation is not adjusted.

At time t15, the engine is activated again and the engine begins operating in the carbon building region so that the amount of time that the engine operates in the carbon building region begins to increase. The amount of time that the engine operates in the carbon reducing region is not adjusted. The engine rotates the electric machine and the electric machine is coupled to external electrical power consumers (not shown). The initiated carbon reducing state is not activated so engine operation is not adjusted.

At time t16, the amount of time that the engine operated in the carbon building region exceeds threshold 1650. However, since the amount of time that the engine operated in the carbon reducing region exceeds threshold 1655, the amount of time that the engine operates in the carbon building region and the amount of time that the engine operates in the carbon reducing region are reset to zero. The engine continues to operate in the carbon building region and the initiated carbon reducing state is not activated.

In this way, an engine may be actively engaged in a carbon reducing region to reduce an amount of carbon that may accumulate on engine spark plugs responsive to two different timers. The timers may be incremented at different rates so that the propensity for carbon to accumulate or be removed from spark plugs may be compensated.

By adjusting operation of an engine that is coupled to an electric machine that provides power to external electrical power consumers, it may be possible to reduce the possibility of engine misfires when supplying power to electrical power consumers. In particular, if the engine is operating at light loads where carbon may accumulate on the engine's spark plugs while electrical power consumers are electrically coupled to an electric machine that is rotated via the engine, engine speed may be increased even though a load that may be provided by the external electrical power consumers has not changed. By increasing the engine speed, spark plug temperatures may increase, thereby oxidizing carbon that may accumulate on the engine's spark plugs so that the possibility of engine misfires may be reduced. In addition, a load that the electric machine provides to the engine may be increased to further reduce the possibility of spark plug fouling. The increased electric machine load may be used to charge an electric energy storage device that is on-board the vehicle so that beneficial work may be generated by increasing the engine load.

The description with regard to FIGS. 15-17 may provide several advantages. In particular, the approach may improve engine operation while an engine is being used to generate electrical power. Further, the approach may provide beneficial work when carbon is being removed from engine spark plugs. In addition, the approach provides compensation for times when the engine is operated in carbon removing operating conditions. Further still, the method described herein may be applied to engines that are operated at extended idle conditions, irrespective of if the engine is driving a mechanical load, or a load that generates electrical power, or no external load.

Discussed herein, a vehicle may include an electric machine that generates electrical power from power that is produced by an engine. In particular, the engine may rotate the electric machine and the electric machine may generate charge to supply to external electric power consumers. The output of the electric machine may be based on, or a function of, an amount of electric power that is consumed via external electric power consumers. The amount of electric power that is consumed by the external electric power consumers may vary over time. Sometimes, the amount of electrical power that is consumed by the external power consumers may be small and may be met by the engine rotating the electric machine at engine idle speed. Operating the engine at idle speed allows fuel consumption of the engine to be reduced. At other times, the amount of electrical power that is consumed by the external power consumers may be larger so that the engine may not generate sufficient power to meet the demands of the external power consumers while the engine is operating at idle speed. Therefore, engine speed may be increased to a higher speed so that the engine output may be increased to meet the demands of the external power consumers. However, if the engine speed is increased and decreased responsive to load changes generated by the external electric power consumers, then engine speed increases and decreases may be noticeable and objectionable to persons that may be proximate to the vehicle. Therefore, it may be desirable to provide a way of adjusting engine speed that allows electrical loads to be met while reducing a possibility of annoying persons that may be near the vehicle that is supplying electrical charge to the external electric power consumers.

Accordingly, the system of FIGS. 1-3 provides for a system, comprising an engine, an electric machine mechanically coupled to the engine, and a controller including executable instructions stored in non-transitory memory to adjust a rotational speed of the engine via a controller responsive to an amount of electrical power output from a direct current to alternating current converter to one or more electric power consumers, and where the rotational speed of the engine is adjusted to a maximum instantaneous engine rotational speed included in a memory buffer that includes a plurality of requested instantaneous engine rotational speeds. Such a system may further comprise additional instructions to filter each of the plurality of requested instantaneous engine rotational speeds via a moving average digital filter. Such a system may further comprise additional instructions to rate limit the maximum instantaneous engine rotational speed. Such a system may further comprise additional instructions to shift values in the memory buffer. Such a system may include where the values are shifted in a first in to first out order. Such a system may include where values are shifted in response to a buffer step time expiring.

Referring now to FIG. 18A, a graphic depiction of a memory buffer is shown. In this example, memory buffer 1800 includes ten memory locations or cells that are labeled 1801-1810. The actual total number of memory locations in the memory buffer may be referred to as the actual total number of memory buffer steps. The memory location 1801 contains the value of the most recent instantaneous filtered engine speed request and memory location 1810 contains the value of the chronologically oldest instantaneous filtered engine speed request that is contained in the memory buffer. In this example, the time step between values in the ten memory locations is five seconds, and the time step may be referred to as the memory buffer time step. Thus, if the entry value in memory location 1802 was first placed in the memory buffer at 100 seconds relative to some starting time, then the entry value in memory location 1801 occurs at 95 seconds relative to the same starting time. Further, since buffer 1800 includes ten entry values stored in ten memory locations, the length of the memory buffer is 10 entries, which corresponds to 50 seconds between the time that the entry value was first installed in memory buffer memory location 1801 and the time that the entry value stored in entry 1810 was first placed into the memory buffer at memory location 1801. This time may be referred to as the buffer time length. The maximum or greatest entry value presently included in memory buffer 1800 is 1295 and it is presently stored at memory location 1810. Of course, the length of memory buffer 1800 may be greater or less than ten memory locations and the buffer step time may be greater or less than 5 seconds without departing from the scope or intent of this disclosure.

Referring now to FIG. 18B, a graphic depiction of the memory buffer 1800 shown in FIG. 18A is shown again, except five seconds later in time. In this example, memory buffer 1800 also includes ten memory locations or cells that are labeled 1801-1810. However, the entry value stored in memory location at 301 has been revised to a value of 1245 so that memory location 301 contains the value of the most recent instantaneous filtered engine speed request. In addition, each of the entry values formerly stored in memory locations 1801-1809 have been shifted to their respective adjacent memory locations. For example, the entry value that was stored in memory location 1801 shown in FIG. 18A is now stored in memory location 1802. Likewise, the entry value that was stored in memory location 1802 shown in FIG. 18A is now stored in memory location 1803, and so on. The entry value that was stored in memory location 1810 shown in FIG. 18A has been removed from memory buffer 1800. Thus, memory buffer 1800 follows a first in first out procedure for processing entry values and updating memory buffer 1800. The maximum or greatest entry value now included in memory buffer 1800 is 1289, or entry number 1804.

Referring now to FIG. 19, a prophetic sequence 1900 that shows how engine speed is controlled according to the method of FIGS. 20 and 21 in cooperation with the system of FIGS. 1-3. The plots are time aligned and occur at the same time. The dashed vertical lines at t0-t11 show particular times of interest.

The first plot from the top of FIG. 19 is a plot of engine speed versus time. The vertical axis represents the engine speed and engine speed increases in the direction of the vertical axis arrow. The horizontal axis represents time and the time increases from the left side of the figure to the right side of the figure. Trace 1902 represents the engine speed.

The second plot from the top of FIG. 19 is a plot of DCAC converter electrical output power versus time. The vertical axis represents the amount of DCAC converter electrical output power and the amount of DCAC converter electrical output power increases in the direction of the vertical axis arrow. The horizontal axis represents time and the time increases from the left side of the figure to the right side of the figure. Trace 1904 represents the amount of DCAC converter electrical output power.

At time t0, the engine is operating at idle speed and the DCAC converter electrical power output to external AC electric power consumers is zero. At time t1, the engine is still operating at idle speed and the DCAC converter electrical power output to external AC electric power consumers increases. The amount of DCAC output power increase may be a function of the amount of electrical power consumed by external electrical power consumers. Shortly thereafter, engine speed is increased so that the engine's torque capacity is increased, thereby allowing alternator or BISG output to increase to meet or exceed DCAC converter electrical power output. The increased engine torque capacity allows the engine to generate power that is sufficient to increase alternator output to meet the power consumption of the external AC electric power consumers. The engine speed is increased shortly after the DCAC converter output is increased and the battery supplies power to the DCAC when engine power and alternator or BISG electrical output power is insufficient to meet DCAC converter electrical output power (not shown). The amount of electrical power that is output by the DCAC converter and consumed by the external AC electric power consumers increases and then it decreases shortly thereafter.

At time t2, the engine speed is reduced since the amount of electrical power that is output by the DCAC converter and consumed by the external AC electric power consumers was previously decreased just after time t1. The decrease in engine speed may allow the engine to operate while consuming less fuel. At time t3, the amount of electrical power that is output by the DCAC converter and consumed by the external AC electric power consumers is decreased toward zero. However, the engine speed continues on without changing. At time t4, engine speed is reduced further and goes to idle speed shortly thereafter in response to the electrical output of the DCAC converter and the amount of electrical power consumed by the external AC electric power consumers decreasing at time t3. The amount of electrical power that is output via the DCAC converter and consumed by the external AC electric power consumers increases at time t5 and the engine speed is increased shortly thereafter so that output of the alternator may meet or exceed the output of the DCAC converter. The amount of electrical power output by the DCAC converter and consumed by the external AC electric power consumers decreases shortly after time t5. Nevertheless, the engine speed is not decreased until time t6 because the memory buffer contains a maximum instantaneous filtered engine speed request corresponding to the instantaneous filtered engine speed requested shortly after time t5. At time t6, the maximum instantaneous filtered engine speed request contained in the memory buffer is decreased causing the engine speed to be reduced.

The DCAC converter electrical output power increases and decreases between time t6 and time t7; however, the engine speed is sufficiently high that the engine may provide power that is sufficient to meet the DCAC converter output power. At time t7, the amount of electrical power output by the DCAC converter and consumed by the external AC electric power consumers increases. Shortly thereafter, the engine speed is increased so that engine output power is sufficient to drive the alternator that supplies electrical power to the DCAC converter and the external AC electric power consumers. At time t8, the amount of electrical power that is output by the DCAC converter and consumed by the external AC electric power consumers is decreased to a lower level. Nevertheless, the engine speed continues on without being reduced due to the maximum instantaneous filtered engine speed request that is stored in the memory buffer. At time t9, engine speed is reduced, but it remains above idle speed so that the engine may output power that is sufficient to meet the output of the DCAC converter. The engine speed is reduced in response to the maximum instantaneous filtered engine speed request value decreasing.

At time t10, the electrical output of the DCAC converter and the amount of electrical power consumed by the external AC electric power consumers is decreased again. However, the engine speed remains unchanged from engine speed shortly after time t9. The engine speed remains unchanged until time t11, at which time the maximum instantaneous filtered engine speed request decreases.

In this way, an engine speed request may be processed via a memory buffer so that engine speed may change with less frequency to avoid the possibility of annoying people that may be in the vicinity of the vehicle while the vehicle is supplying electrical power to external AC power consumers. Notably, engine speed may be elevated while a maximum instantaneous filtered engine speed request is unchanged and stored in a memory buffer. The engine speed may be decreased once the value of the maximum instantaneous filtered engine speed request contained within the memory buffer is purged from the memory buffer.

Referring now to FIGS. 20 and 21, a flow chart of a method for operating a vehicle engine is shown. The method may reduce the possibility of frequent engine speed changes while the engine supplies power to a DCAC converter via an alternator or other electric machine. The method of FIGS. 20 and 21 may be incorporated into and may cooperate with the system of FIGS. 1-3. Further, at least portions of the method of FIGS. 20 and 21 may be incorporated as executable instructions stored in non-transitory memory while other portions of the method may be performed via a controller transforming operating states of devices and actuators in the physical world.

At 2002, method 2000 determines vehicle operating conditions. Vehicle operating conditions may include but are not limited to engaged transmission gear, operating state of DCAC converter (e.g., activated or deactivated), engine temperature, ambient temperature, vehicle speed, electric machine operating state (e.g., activated or deactivated), electric machine temperature, amount of electric power output from the DCAC, electric machine speed, engine speed, engine load, engine temperature, and electric energy storage device state of charge (SOC). Method 2000 may determine the vehicle operating conditions via the system described in FIGS. 1-3. Method 2000 proceeds to 2004.

At 2004, method 2000 judges if AC electrical power is to be supplied to external AC electrical power consumers. In one example, AC electrical power may be supplied to external AC electrical power consumers in response to a request to deliver AC electrical power to the external AC electrical power consumers. In one example, the request to deliver AC electrical power to the external AC electrical power consumers may be input via a human/machine interface. Further, method 2000 may require select vehicle operating conditions before AC electrical power may be delivered to AC electrical power consumers. For example, method 2000 may require that the vehicle's transmission is engaged in park, that engine temperature is less than a threshold temperature, and that an amount of oil in the engine is greater than a threshold amount. If method 2000 judges that AC electrical power is to be supplied to external AC electrical power consumers, the answer is yes and method 2000 proceeds to 2006. Otherwise, method 2000 proceeds to 2060.

At 2060, method 2000 deactivates the DCAC and ceases to supply electrical power to external AC power consumers. Method 2000 may also propel the vehicle on a road via the vehicle's engine. Method 2000 proceeds to exit.

At 2006, method 2000 may activate the vehicle's engine if the engine is not already activated so that the engine may supply power to an electrical machine that supplies electrical power to the DCAC. The engine may be activated via supplying fuel and spark to the engine. The engine begins to combust the fuel when it is activated. Method 2000 proceeds to 2008.

At 2008, method 2000 determines electrical output of the DCAC converter. The DCAC converter may communicate its electrical output power to the vehicle system controller. Method 2000 proceeds to 2010.

At 2010, method 2000 determines a temperature of the vehicle (e.g., under hood temperature). Method 2000 may determine the vehicle temperature via a temperature sensor. Method 2000 proceeds to 2012.

At 2012, method 2000 determines a desired battery state of charge (SOC). In one example, the desired battery state of charge may be stored in controller memory and it may be referenced via ambient temperature. Method 2000 may determine the desired battery state of charge via referencing a table or function stored in controller non-transitory memory. Method 2000 proceeds to 2014 after determining the desired battery state of charge.

At 2014, method 2000 determines the actual battery state of charge. In one example, the actual battery state of charge may be estimated based on battery voltage and coulomb counting. Method 2000 proceeds to 2016 after determining the actual battery state of charge.

At 2016, method 2000 determines a battery state of charge feedback multiplier. In one example, the battery state of charge feedback multiplier may be determined via referencing or indexing a function or table that outputs an empirically determined battery state of charge feedback multiplier. The values stored in the table or function may be determined via operating the vehicle monitoring the battery SOC and adjusting the multiplier values until battery SOC is equal to the desired SOC within a predetermined amount of time. Further, the values stored in the table or function may be indexed or referenced via the difference between desired SOC minus actual SOC. In one example, the SOC feedback multiplier is a value less than one (e.g., 0.95) when actual SOC is greater than desired SOC and the SOC feedback multiplier may be a value that is greater than one (e.g., 1.05) when actual SOC is less than desired SOC. Method 2000 proceeds to 2018.

At 2018, method 2000 determines a requested instantaneous electric machine speed (e.g., a desired alternator, ISG, or BISG speed) in response to DCAC output electric power, under hood temperature, and the SOC multiplier. In one example, a relationship between DCAC electrical power output and electric machine speed is referenced via the DCAC electrical power output divided by DCAC efficiency (e.g., 1000 Watts/0.92). The requested instantaneous electric machine speed is further adjusted in response to the SOC feedback multiplier. The requested instantaneous electric machine speed may be expressed via the following equation:

$$N\_elec\_mach = f(DCAC\_out/DCAC\_eff) \cdot g(Under\_temp) \cdot SOC\_mult$$

where N_elec_mach is the requested electric machine rotational speed, f is a function that returns a requested electric machine rotational speed, DCAC_eff is an efficiency of the DCAC converter, g is a function that returns a multiplier value, Under_temp is a vehicle under hood temperature, and SOC_mult is the SOC multiplier determined at 2016. Method 2000 proceeds to 2020 after determining the requested instantaneous electric machine speed (e.g., the requested speed for the alternator, ISG, or BISG to provide power to the DCAC).

At 2020, method 2000 determines an alternator or BISG to engine pulley ratio. In one example, the alternator or BISG to engine pulley ratio is stored in controller non-transitory memory and retrieved by the controller. Method 2000 proceeds to 2022.

At 2022, method 2000 determines an instantaneous engine speed request. In one example, the instantaneous engine speed request is determined by multiplying the requested instantaneous electric machine speed by the alternator or BISG to engine pulley ratio. However, if the ISG is providing electrical power to the DCAC, then the instantaneous engine speed request is equal to the requested instantaneous electric machine speed. Method 2000 proceeds to 2024.

At 2024, method 2000 applies a moving average filter to the requested instantaneous engine speed. In one example, the moving average filter may be expressed as:

$$Filt\_req\_inst\_eng\_spd = Req\_inst\_eng\_spd(k) + Req\_inst\_eng\_spd(k-1)/2$$

where Filt_req_inst_eng_spd is the moving average filtered requested instantaneous engine speed, Req_inst_eng_spd is the requested instantaneous engine speed, and k is the sample number. This example describes the moving average filtered requested instantaneous engine speed as being an average of two values of the requested instantaneous engine speed; however, the moving average filtered requested instantaneous engine speed may be determined via two or more values of the requested instantaneous engine speed. Method 2000 proceeds to 2026.

At 2026, method 2000 shifts all values stored in a buffer to a next location in the buffer. For example, as described in FIGS. 18A and 18B, the value stored in memory location 1801 is moved to memory location 1802, the value stored in memory location 1802 is moved to memory location 1803, and so on until the value stored in the last memory location of the buffer (e.g., 1810 of FIG. 18A) is discarded. Method 2000 also stores in a first memory location or cell of a memory buffer a maximum value of the filtered requested instantaneous engine speed that has occurred during a most recent buffer step time. Thus, if the buffer time step is 5 seconds, then the greatest value of the filtered requested instantaneous engine speeds that occurred during the buffer time step is input to the first memory location of the buffer (e.g., location 1801 shown in FIG. 18A). The operation of step 2026 is performed each time the buffer time step expires (e.g., each time the buffer time step counts from a value of zero seconds to a value of five seconds, where the buffer time step is five seconds). Of course the buffer time step may take on different values for different applications. For example, in some applications, the buffer time step may be ten seconds. Method 2000 proceeds to 2028.

At 2028, method 2000 determines the maximum value of the plurality of filtered requested instantaneous engine speeds to determine a requested raw instantaneous engine speed. Method 2000 proceeds to 2030 after determining the requested raw instantaneous engine speed.

At 2030, method 2000 applies unique positive and negative rate limits to the requested raw instantaneous engine speed. For example, method 2000 may allow the requested raw instantaneous engine speed to increase by 700 RPM/second and method 2000 may allow the requested raw instantaneous engine speed to decrease by 300 RPM/second. By allowing the requested raw instantaneous engine speed to increase faster than it decreases, method 2000 allows the engine speed to quickly increase to a level where engine power may be used to supply power to external AC electric power consumers. Further, by lowering the rate that engine speed may be decreased, it may be possible to reduce engine speed oscillations and gradually move the engine to operating conditions with lower fuel consumption. The requested raw engine speed is now a limited requested raw engine speed. Method 2000 proceeds to 2032.

At 2032, method 2000 requests and controls engine speed to the limited requested raw engine speed. The engine speed may be adjusted via adjusting a position of a torque actuator such as a throttle, fuel injector, cam timing, or spark timing. Method 2000 proceeds to exit.

Thus, the method of FIGS. 20 and 21 provides for a powertrain operating method, comprising: propelling a vehicle via an engine; storing a plurality of requested instantaneous engine rotational speed values in a memory buffer via a controller, the memory buffer including a plurality of unique memory locations, each of the plurality of unique memory locations including one of the plurality of requested instantaneous engine rotational speed values; shifting at least one of the plurality of requested instantaneous engine rotational speed values from a first of the unique memory locations to a second of the unique memory locations in response to a buffer step time expiring; and adjusting engine rotational speed to a maximum requested instantaneous engine rotational speed value stored in the buffer via the controller. The method further comprises determining the plurality of requested instantaneous engine speed values from a plurality of requested instantaneous electric machine speed values.

In some examples, the method includes where the requested instantaneous electric machine speed values are a function of an amount of electric power consumed via external electric power consumers. The method includes where the external electric power consumers are off-board of a vehicle and where the engine is on-board a vehicle. The method further comprises adjusting the engine rotational speed via an engine torque actuator. The method further comprises applying a moving average filter to the plurality of requested instantaneous engine rotational speed values. The method further comprises shifting a new requested instantaneous engine rotational speed value into one of the plurality of unique memory locations in response to the buffer step time expiring. The method further comprises shifting one of the plurality of requested instantaneous engine rotational speed values out of the plurality of unique memory locations in response to the buffer step time expiring.

The method of FIGS. 20 and 21 provides for a powertrain operating method, comprising: propelling a vehicle via an engine; and adjusting a rotational speed of the engine via a controller responsive to an amount of electrical power output from a direct current to alternating current converter to one or more electric power consumers, and where the rotational speed of the engine is adjusted to a maximum instantaneous engine rotational speed included in a memory buffer that includes a plurality of requested instantaneous engine rotational speeds. The method includes where the plurality of requested instantaneous engine rotational speeds are stored in the memory buffer responsive to a buffer time length. The method includes where the memory buffer stores one of the plurality of requested instantaneous engine rotational speeds for a predetermined buffer time duration. The method includes where a predetermined buffer step time separates each value of the plurality of requested instantaneous engine rotational speeds stored in the memory buffer. The method further comprises rate limiting the rotational speed of the engine. The method includes where the rate limiting includes reducing a rate of lowering the rotational speed of the engine to less than a threshold.

In another representation, the present method provides for a powertrain operating method, comprising: propelling a vehicle via an engine; adjusting a rotational speed of the engine via a controller responsive to an amount of electrical power output from a direct current to alternating current converter to one or more electric power consumers, where the rotational speed of the engine is adjusted to a maximum instantaneous engine rotational speed included in a memory buffer that includes a plurality of requested instantaneous engine rotational speeds; and where the memory buffer includes a predetermined actual total number of memory cells or locations that receive updated values at a predetermined time interval. The method includes where the predetermined time interval is a buffer step time. The method also includes commanding an engine speed to a requested maximum instantaneous engine speed an entire amount of time that the requested instantaneous engine speed request is located in the memory buffer.

By processing a plurality of requested instantaneous engine rotational speed values in a memory buffer of a controller, it may be possible to provide a requested amount of power to external electrical power consumers without engine speed having to repeatedly change in a short amount of time. Further, the memory buffer may allow the engine to operate at idle speed, a speed where peak engine power is produced, and at engine speeds between the idle speed and the speed where peak engine power is produced so that electric power generation efficiency may be improved. The memory buffer may have advantages over conventional first order low pass filters since it may respond faster to new buffer inputs that are greater than other buffer input. Further, the buffer may reduce the possibility of engine speed cycling that may be due to changes in electrical power consumer loads.

The present description with regard to FIGS. 18A-21 may provide several advantages. In particular, the approach may reduce the possibility of rapid and numerous engine speed changes that may be related to electrical consumer electrical load changes. In addition, the approach may allow the engine to operate over a range of speeds so that engine efficiency may be improved for electrical loads that are less than a full rated electrical load. Further, the approach may include separate engine speed change rate limits for meeting electrical demands (e.g., increasing engine speeds) and reducing engine fuel consumption (e.g., decreasing engine speeds).

Figure 22:
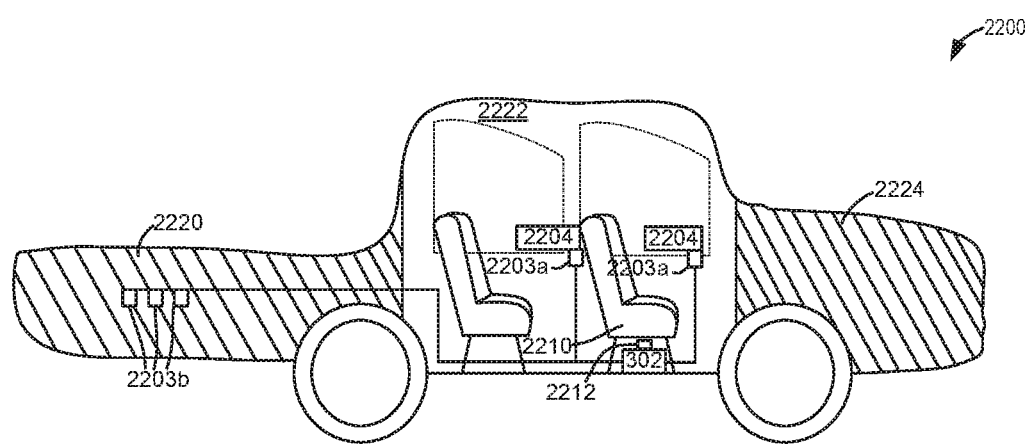
FIG. 22 shows an example illustration of a vehicle of the present disclosure with power outlets in a passenger compartment and a bed of the vehicle, each powered by a single direct current to alternating current power converter.

Turning to FIG. 22, depicted is vehicle 2200, of which vehicle propulsion system 100 (refer to FIG. 1) and powertrain 300 (refer to FIG. 3) may be a part of. Vehicle 2200 may include a passenger compartment 2222, a bed compartment 2220, and a powertrain compartment 2224. Passenger compartment 2222 may include seats 2210 and receptacle(s) 2203a for providing AC power to AC power consumers 2204. AC power consumers may include but are not limited to phones, computing devices, electronic note pads, gaming systems, lights, entertainment systems, and power tools. Receptacle(s) 2203a may receive AC electrical power from DCAC converter 302. Similarly, receptacle(s) 2203b may receive AC electrical power from DCAC converter 302. Receptacles 2203b may be included in trunk or bed compartment 2220. In some examples, receptacle(s) 2203a and receptacle(s) 2203b may be the same or similar to power box 191 at FIG. 1. DCAC converter 302 may be positioned in passenger compartment 2222, for example under seat 2210. Alternatively, DCAC converter 302 may be positioned in bed compartment 2220. Isolation relay 2212 may enable the receptacle(s) 2203b located in the bed compartment of the vehicle to be available for operation in a high power output of operation, but not a low power output mode of operation. Alternatively, isolation relay 2212 may enable the receptacle(s) located in the passenger compartment 2222 to operate in the low power output mode or the high power output mode. As discussed, the low power mode may be a mode that includes a threshold power output, whereas the high power mode of operation may be a mode where a full capability of the DCAC converter may be available for powering auxiliary loads. It may be understood that isolation relay 2212 may enable receptacle(s) 2203b to be switched on and off without disrupting receptacle(s) 2203a. By separating interior receptacle(s) (e.g., 2203a) and exterior receptacle(s) (e.g., 2203b), a vehicle operator may have to use the high power output mode when using the exterior receptacles. By having to switch to the high power output mode when using exterior receptacle(s) (e.g., 2203b), as discussed above with regard to method 500 at FIG. 5, the controller may then enable methodologies including but not limited to the method of FIG. 6, the method of FIG. 8, the method of FIG. 10, the method of FIG. 15, and the method of FIGS. 20-21, in order to effectively manage operation of the conversion of power to supply exterior AC loads.

Furthermore, it is herein recognized that by separating interior and exterior outlets or receptacles, a unique power degradation isolation strategy (e.g., a fault isolation strategy) may be utilized that may enable a determination as to whether the source of degraded power output is interior to the vehicle or exterior to the vehicle. Said another way, the power degradation isolation strategy may be used for an onboard generator system with receptacles or outlets in multiple locations, each powered by a single power converter (e.g., single DCAC converter).

Specifically, it is herein recognized that prior art approaches for a generator system with multiple outlets powered by a single inverter may, responsive to a ground fault occurring somewhere on one of the circuits, interrupt an entirety of the generator system output. In other words, responsive to a fault on one of the circuits, all of the circuits may turn off. Similarly, in the case of an overcurrent fault, prior art approaches may interrupt an entirety of generator system power output. In each case, such action may be disruptive to any other users with devices plugged in to one or more of the outlets.

As discussed with regard to FIG. 22, the inclusion of systems that enable individual outlets to become isolated circuits, for example via the use of an isolation relay or relays (e.g., isolation relay 2212 at FIG. 22), may enable separation of electrically isolated circuits (e.g., exterior outlets) and non-electrically isolated circuits (e.g., interior outlets).

In such an example where exterior outlets can be electrically isolated from interior outlets, in the case of an indication of degraded power supply (e.g., ground fault), the isolated outlets (e.g., exterior outlets) may be disconnected and the power conversion system may then recheck for the degraded power supply condition. If the degraded power supply condition still exists, then the issue of degraded power supply may be with the non-isolated circuit, or with the generator/converter system. Alternatively, if no degraded power supply condition is found on the non-isolated circuit, then isolated circuit(s) may be reconnected individually, and rechecked for the degraded power supply condition. As each isolated circuit is re-added, a predetermined time frame may be allotted to allow for the degraded power supply condition to reoccur, before declaring that the circuit has passed the test. Once the predetermined time frame has passed without an indication of the degraded power supply condition, the next isolated circuit may be connected. In this way, the source of the degraded power output may be pinpointed, and the vehicle operator may be informed of the source via a HMI such as a screen associated with the dash. Furthermore, all circuits may be reconnected except for the circuit associated with the degraded power supply. In a case where all circuits are able to be re-activated without the issue of degraded power output re-occurring, then it may be determined that the issue has been cleared.

In another example, using the strategy outlined above, a condition of degraded power supply may be determined as "intermittent" if the condition has occurred a predetermined number of times (e.g., three), within a predetermined amount of time, and where the strategy has not been able to locate the source. In such a case, the entire system may be deactivated, or turned off so that no power is supplied to any of the receptacles, whether on a non-isolated circuit or an isolated circuit.

In another example, in the case of an overcurrent condition, strategy may include shutting off isolated circuit(s) in a predetermined order based on a priority of preserving power for the vehicle operator and a likelihood of the location of the largest power load. As an example, a system with an isolatable exterior circuit and an isolatable interior circuit, in the event of an overcurrent condition, may shut off exterior outlets first and then if the overcurrent condition still exists, then shut off interior outlets and restore power to the exterior circuit. As another example, a system with an isolatable exterior circuit and a non-isolatable interior circuit, in the event of an overcurrent condition, may shut off exterior outlets first and then if the overcurrent condition still exists, then the entire system may be deactivated.

In still other examples, it may be possible to design a power conversion system such as those discussed in detail herein, with separate ground fault detection components at each outlet or circuit, instead of detection for the entire system. In such a case, the location identification strategy discussed above may not be needed, however the system may still isolate the degraded circuit to preserve remaining system functionality.

In this way, a vehicle may include a high power output DCAC converter system, which may selectively be controlled in a high power output mode under conditions where high power output is needed, and where the high power output mode is not used under conditions where high power output is not needed. The controlling may include substantial vehicle operator input, which may improve customer satisfaction and which may improve operational function of the DCAC converter system.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations, and/or functions may be repeatedly performed depending on the particular strategy being used. Further, the described actions, operations, and/or functions may graphically represent code to be programmed into non-transitory memory of the computer readable storage medium in the engine control system, where the described actions are carried out by executing the instructions in a system including the various engine hardware components in combination with the electronic controller.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method comprising:
at a vehicle-on event of a vehicle, automatically operating a direct current to alternating current power conversion system in a low power output mode, wherein operating the direct current to alternating current power conversion system in the low power output mode includes powering a first set of power receptacles in the low power output mode, the first set of power receptacles included in a passenger compartment of the vehicle, and not powering a second set of power receptacles, the second set of power receptacles included in a bed of the vehicle; and
transitioning to a different mode of operation of the direct current to alternating current power conversion system responsive to a transition request being received at a controller of the vehicle.

2. The method of claim 1, wherein the transition request is initiated via an operator of the vehicle, without first being prompted by the controller of the vehicle.

3. The method of claim 1, wherein transitioning to the different mode of operation further comprises transitioning to a high power output mode, or to an off mode.

4. The method of claim 3, wherein the low power output mode includes a low power output mode threshold that is lower than a full capability of the direct current to alternating current power conversion system; and
wherein the full capability of the direct current to alternating current power conversion system is available to external power consumers in the high power output mode.

5. The method of claim 1, wherein the transition request is initiated via the controller of the vehicle and is communicated to an operator of the vehicle; and
wherein the different mode of operation is transitioned to responsive to the operator confirming the transition request.

6. The method of claim 5, wherein the transition request is initiated via the controller responsive to an indication that an auxiliary load powered via the direct current to alternating current power conversion system includes a power demand that cannot be met via the low power output mode.

7. The method of claim 5, wherein the transition request is initiated via the controller responsive to an indication of a degraded power output condition associated with the direct current to alternating current power conversion system.

8. The method of claim 7, further comprising providing instructions to the operator to resolve the degraded power output condition, under conditions where the degraded power output condition includes a recoverable degraded power output condition.

9. A system for a vehicle, comprising:
an engine;
a first set of power receptacles included in a passenger compartment of the vehicle;
a second set of power receptacles included in a bed of the vehicle;
a direct current to alternating current power converter that supplies power to each of the first set and the second set of power receptacles; and
a controller with computer readable instructions stored on non-transitory memory that when executed, cause the controller to:
operate the first set of power receptacles in one of a low power output mode or a high power output mode; and operate the second set of power receptacles in the high power output mode but not the low power output mode.

10. The system of claim 9, further comprising one or more electric power consumer sensors associated with the first set of power receptacles and the second set of power receptacles, the one or more electric power consumer sensors capable of indicating when an external power consumer has been plugged in to the first set of power receptacles and/or the second set of power receptacles; and wherein the controller stores further instructions to submit a request to operate the direct current to alternating current power converter in the high power output mode responsive to an indication that the external power consumer has been plugged in to the second set of power receptacles; and operate the direct current to alternating current power converter in the high power output mode responsive to the request being confirmed.

11. The system of claim 9, wherein the controller stores further instructions to indicate that a threshold power output has been exceeded for a predetermined time duration; and in response, submit a request to operate the direct current to alternating current power converter in the high power output mode; and operate the direct current to alternating current power converter in the high power output mode responsive to the request being confirmed.

12. The system of claim 9, further comprising an isolation relay associated with the direct current to alternating current power converter and where the first set of power receptacles are part of a non-isolated circuit and where the second set of power receptacles are part of an isolated circuit; and wherein the controller stores further instructions to, in response to an indication of a degraded power supply associated with power stemming from the direct current to alternating current power converter, disconnect the second set of power receptacles and indicate degradation of the non-isolated circuit or the direct current to alternating current power converter under conditions where the degraded power supply remains after disconnecting the second set of power receptacles, and indicate degradation of the isolated circuit under conditions where the degraded power supply is no longer indicated after disconnecting the second set of power receptacles.

13. The system of claim 9, wherein the controller stores further instructions to, under conditions where the first set of power receptacles and/or the second set of power receptacles are being operated in the high power output mode, indicate whether conditions are met for an idle-stop of the engine; responsive to conditions being met for the idle-stop, submit a request as to whether to shut down the engine or not; and control engine operation based on a response received pertaining to the request.

14. The system of claim 9, further comprising a fuel tank and a fuel level indicator; and wherein the controller stores further instructions to, under conditions where the first set of power receptacles and/or the second set of power receptacles are being operated in the high power output mode, indicate that a level of fuel is below a threshold fuel level, notify an operator of the vehicle of the level of fuel, and request confirmation to continue operating the direct current to alternating current power converter; and disable the direct current to alternating current power converter if confirmation is not received within a predetermined time duration.

15. A method for a vehicle comprising:

operating a direct current to alternating current power converter in a first mode while a power output requested from the direct current to alternating current power converter is below a threshold power output; and in response to the power output requested exceeding the threshold power output for greater than a first predetermined time duration, submitting a request to an operator of the vehicle to operate the direct current to alternating current power converter in a second mode, and operating the direct current to alternating current power converter in the second mode in response to the operator confirming the request within a second predetermined duration.

16. The method of claim 15, wherein the first mode is a low power output mode wherein the power output below the threshold power output is less than a full capability of the direct current to alternating current power converter; and wherein the second mode is a high power output mode wherein the full capability of the direct current to alternating current power converter is available to power external power consumers.

17. The method of claim 15, further comprising discontinuing operation of the direct current to alternating current power converter in response to the operator not confirming the request within the second predetermined duration.

18. The method of claim 15, wherein both submitting the request and confirming the request is via a human machine interface that the operator of the vehicle can interact with to confirm the request.

19. The method of claim 15, wherein the first mode is automatically initiated at a vehicle-on event, but where the second mode cannot be entered without input from the operator.

* * * * *